(12) United States Patent
Jain et al.

(10) Patent No.: US 11,775,003 B2
(45) Date of Patent: Oct. 3, 2023

(54) CLOCK CALIBRATION MODULE, HIGH-SPEED RECEIVER, AND ASSOCIATED CALIBRATION METHOD

(71) Applicant: FARADAY TECHNOLOGY CORPORATION, Hsinchu (TW)

(72) Inventors: Vinod Kumar Jain, Hsinchu (TW); Chi-Yeu Chao, Hsinchu (TW)

(73) Assignee: FARADAY TECHNOLOGY CORPORATION, Hsinchu (TW)

( * ) Notice: Subject to any disclaimer, the term of this patent is extended or adjusted under 35 U.S.C. 154(b) by 169 days.

(21) Appl. No.: 17/565,503

(22) Filed: Dec. 30, 2021

(65) Prior Publication Data

US 2023/0099269 A1 Mar. 30, 2023

(30) Foreign Application Priority Data

Sep. 29, 2021 (TW) ................................. 110136219

(51) Int. Cl.
*G06F 1/12* (2006.01)
*G06F 1/10* (2006.01)
*G06F 1/08* (2006.01)

(52) U.S. Cl.
CPC ................. *G06F 1/10* (2013.01); *G06F 1/08* (2013.01); *G06F 1/12* (2013.01)

(58) Field of Classification Search
CPC ..... G06F 1/10; G06F 1/08; G06F 1/12; H03L 7/08; H03K 5/135
See application file for complete search history.

(56) References Cited

U.S. PATENT DOCUMENTS

| 8,552,781 | B2 | 10/2013 | Mosalikanti et al. |
| 10,797,683 | B1* | 10/2020 | Jain ........................... G06F 1/04 |
| 2008/0309375 | A1* | 12/2008 | Schnarr ................ G11C 27/024 |
| | | | 375/295 |
| 2019/0007054 | A1 | 1/2019 | Bandi et al. |

FOREIGN PATENT DOCUMENTS

TW 201419759 A 5/2014

* cited by examiner

*Primary Examiner* — Nitin C Patel
(74) *Attorney, Agent, or Firm* — WPAT, P.C

(57) ABSTRACT

A clock calibration module, a high-speed receiver, and an associated calibration method are provided. The calibration method is applied to the high-speed receiver having the clock calibration module and a sampler. The sampler samples an equalized data signal with a sampler-input clock. The clock calibration module includes multiple clock generation circuits and a clock calibration circuit. Each of the clock generation circuits includes a phase interpolator, a duty cycle corrector, and a phase corrector. In a calibration mode, the phase interpolator interpolates a reference input clock and generates an interpolated clock accordingly. The duty cycle corrector generates a duty cycle corrected clock based on the interpolated clock. The phase corrector generates the sampler-input clock based on the duty cycle corrected clock. The phase interpolator is controlled by a phase interpolator calibration signal, and the phase corrector is controlled by a phase corrector calibration signal.

20 Claims, 27 Drawing Sheets

CLOCK CALIBRATION MODULE, HIGH-SPEED RECEIVER, AND ASSOCIATED CALIBRATION METHOD

This application claims the benefit of Taiwan application Serial No. 110136219, filed Sep. 29, 2021, the subject matter of which is incorporated herein by reference.

TECHNICAL FIELD

The disclosure relates in general to a clock calibration module, a high-speed receiver, and an associated calibration method, and more particularly to a clock calibration module, a high-speed receiver, and an associated calibration method capable of precisely adjusting phase distortions accompanied with fractional-rate clock signals.

BACKGROUND

FIG. 1 is a schematic diagram illustrating signal transmission in a high-speed communication system. The high-speed communication system, such as the serializer/deserializer (SerDes) system, is widely used nowadays. The high-speed communication system includes a transmitter 11 and a receiver 15. In the high-speed SerDes circuit, clock signals received by the receiver 15 are embedded with the incoming data (inDAT), and a clock data recovery circuit (hereinafter, CDR) 159 is adapted to recover the clock signals.

The transmitter 11 transmits signals to the receiver 15 via the channel 13. However, the transmitted signal is distorted during the channel 13, and the receiver 15 needs to recover the incoming data (inDAT). To reduce the undesired distortions, an analog front end (hereinafter, AFE) 151 (or, a continuous-time linear equalizer (hereinafter, CTLE)) 151, and a decision feedback equalizer (hereinafter, DFE) 155 have been developed and utilized in the receiver 15.

The receiver 15 includes the AFE 151, a sampling module 153, the DFE 155, the CDR 159, and a deserializer 157. In the receiver 15, the sampling module 153, the DFE, 155, and the CDR 159 jointly form a loop. The sampling module 153 samples the equalized data signal (eqDAT) with the recovered clocks (edgCLK_cdr, datCLK_cdr) provided by the CDR 159. Then, the sampling module 153 generates sampled edge outputs (edgSMP) and sampled data outputs (datSMP), as the sampled outputs, to the DFE 155. Later, the DFE 155 transmits the serial inputs (serIN) (including the serial edge inputs serEDGin, and the serial data inputs serDATin) to the deserializer 157. Based on the serial edge inputs (serEDGin), the CDR 159 generates the recovered clocks (edgCLK_cdr, datCLK_cdr). The recovered clocks (edgCLK_cdr, datCLK_cdr) are further transmitted to the sampling module 153. In some applications, the DFE 155 might be omitted, and the sampling module 153 directly transmits the sampled edge outputs (edgSMP) and the sampled data outputs (datSMP) to the CDR 159 and/or the deserializer 157.

Due to constraints such as technology speed, power, and area, adoption of the fractional-rate (such as half-rate, quarter-rate, and so forth) scheme to accelerate the processing speed becomes a trend. For example, FIG. 2 shows that the quarter-rate scheme is adopted.

FIG. 2 is a schematic diagram showing that the quarter-rate scheme is adopted to accelerate the signal processing speed. Between the CDR 159 and the sampling module 153, four parallel paths (P=4), including the first path (PATH1) (p=1), the second path (PATH2) (p=2), the third path (PATH3) (p=3), and the fourth path (PATH4) (p=4), are provided.

In the specification, the variables p, P are positive integers, and the variable P is equivalent to the power of 2. The variable "P" represents the total pair number of the edge-data clock pairs. The variable "p" represents a selected edge-data clock pair (or path). Therefore, the variable "p" is smaller than or equivalent to the variable "P" (p≤P).

Each path corresponds to a recovered edge-data clock pair and a sampler input edge-data clock pair, as summarized in Table 1.

TABLE 1

| path (p) | recovered edge-data clock pair | | sampler input edge-data clock pair | |
|---|---|---|---|---|
| | recovered edge clock | recovered data clock | edge sampler-input clock | data sampler-input clock |
| PATH1 (p = 1) | edg1CLK_cdr | dat1CLK_cdr | edg1CLK_in | dat1CLK_in |
| PATH2 (p = 2) | edg2CLK_cdr | dat2CLK_cdr | edg2CLK_in | dat2CLK_in |
| PATH3 (p = 3) | edg3CLK_cdr | dat3CLK_cdr | edg3CLK_in | dat3CLK_in |
| PATH4 (p = 4) | edg4CLK_cdr | dat4CLK_cdr | edg4CLK_in | dat4CLK_in |

Each recovered edge-data clock pair includes a recovered edge clock and a recovered data clock, and each sampler input edge-data clock pair includes an edge sampler-input clock and a data sampler-input clock. For example, the recovered edge-data clock pair corresponding to the first path (PATH1) includes a recovered edge clock (edg1CLK_cdr) and a recovered data clock (dat1CLK_cdr). The sampler input edge-data clock pair corresponding to the first path (PATH1) includes an edge sampler-input clock (edg1CLK_in) and a data sampler-input clock (dat1CLK_in).

FIG. 3 is a waveform diagram illustrating the phases of the recovered edge/data clocks in the quarter-rate scheme. The horizontal axis represents time, and the vertical axis represents the four recovered edge-data clock pairs. The intervals between each time point t1~t9 are equivalent.

In the quarter-rate scheme, the cycle length ($T_{eqDAT}$) of the equalized data signal (eqDAT) is equivalent to one-quarter of the cycle lengths ($T_{CLK}$) of the recovered edge/data clocks (edg1CLK_cdr, dat1CLK_cdr, edg2CLK_cdr, dat2CLK_cdr, edg3CLK_cdr, dat3CLK_cdr, edg4CLK_cdr, dat4CLK_cdr). That is, $T_{CLK}=4*T_{eqDAT}$.

Although the cycle lengths ($T_{CLK}$) of the recovered edge/data clocks (edg1CLK_cdr, dat1CLK_cdr, edg2CLK_cdr, dat2CLK_cdr, edg3CLK_cdr, dat3CLK_cdr, edg4CLK_cdr, dat4CLK_cdr) are equivalent, the phases of which are 45' apart. For example, the recovered edge clock edg1CLK_cdr rises at time point t1 (phase=0), the recovered data clock dat1CLK_cdr rises at time point t2 (phase=45), the recovered edge clock edg2CLK_cdr rises at time point t3 (phase=90°), and so forth.

FIG. 4 is a phase plane diagram illustrating the ideal sampler-input clocks edg1CLK_in (IDEAL)~edg4CLK_in (IDEAL), dat1CLK_in (IDEAL)~dat4CLK_in (IDEAL) and the distorted sampler-input clocks edg1CLK_in (DIST)~edg4CLK_in (DIST), dat1CLK_in (DIST)~dat4CLK_in (DIST) in the quarter-rate scheme. A phase plane is divided into 2*R=8 phase segments, by the vertical axis, the horizontal axis, the top-left to the bottom-right diagonal line, and the top-right to the bottom-left diagonal line, as shown in FIG. 4. Each of the 8 phase segments corresponds to a phase of 360°/(2*R)=45° degrees.

In FIG. 4, the phases of the ideal sampler-input clocks edg1CLK_in (IDEAL), dat1CLK_in (IDEAL), edg2CLK_in (IDEAL), dat2CLK_in (IDEAL), edg3CLK_in (IDEAL), dat3CLK_in (IDEAL), edg4CLK_in (IDEAL), dat4CLK_in (IDEAL) and the phases of the distorted sampler-input clocks edg1CLK_in (DIST), dat1CLK_in (DIST), edg2CLK_in (DIST), dat2CLK_in (DIST), edg3CLK_in (DIST), dat3CLK_in (DIST), edg4CLK_in (DIST), dat4CLK_in (DIST) in the quarter-rate scheme are shown.

Please refer to FIGS. 3 and 4 together. The phases of the ideal sampler-input clocks edg1CLK_in (IDEAL), dat1CLK_in (IDEAL), edg2CLK_in (IDEAL), dat2CLK_in (IDEAL), edg3CLK_in (IDEAL), dat3CLK_in (IDEAL), edg4CLK_in (IDEAL), dat4CLK_in (IDEAL) are equivalent to those of the recovered edge/data clocks (edg1CLK_cdr, dat1CLK_cdr, edg2CLK_cdr, dat2CLK_cdr, edg3CLK_cdr, dat3CLK_cdr, edg4CLK_cdr, dat4CLK_cdr), to ensure that the equalized data signal (eqDAT) can be accurately sampled.

As the physical layouts of the four paths between the CDR 159 and the sampling module 153 are not identical, path mismatches exist, and the phase relationships between the distorted sampler-input clocks (edg1CLK_in (DIST), dat1CLK_in (DIST), edg2CLK_in (DIST), dat2CLK_in (DIST), edg3CLK_in (DIST), dat3CLK_in (DIST), edg4CLK_in (DIST), dat4CLK_in (DIST)) are different from those between the recovered edge/data clocks (edg1CLK_cdr, dat1CLK_cdr, edg2CLK_cdr, dat2CLK_cdr, edg3CLK_cdr, dat3CLK_cdr, edg4CLK_cdr, dat4CLK_cdr). Moreover, the distorted sampler-input clocks edg1CLK_in (DIST), dat1CLK_in (DIST), edg2CLK_in (DIST), dat2CLK_in (DIST), edg3CLK_in (DIST), dat3CLK_in (DIST), edg4CLK_in (DIST), dat4CLK_in (DIST)) might be distorted along the paths. The phases of the distorted sampler-input clocks edg1CLK_in (DIST), dat1CLK_in (DIST), edg2CLK_in (DIST), dat2CLK_in (DIST), edg3CLK_in (DIST), dat3CLK_in (DIST), edg4CLK_in (DIST), dat4CLK_in (DIST)) are represented by the block lines L1~L4.

As the phases of the distorted sampler-input clocks edg1CLK_in (DIST), edg3CLK_in (DIST) are 180 degrees opposite, the block line L1 simultaneously indicates phases of the distorted sampler-input clocks edg1CLK_in (DIST), edg3CLK_in (DIST), and the phase distortions of the distorted sampler-input clocks edg1CLK_in (DIST), edg3CLK_in (DIST) are equivalent. Based on similar reasons, the block line L2 indicates phases of the distorted sampler-input clocks dat1CLK_in (DIST), dat3CLK_in (DIST), the block line L3 indicates phases of the distorted sampler-input clocks edg2CLK_in (DIST), edg4CLK_in (DIST), and the block line L4 indicates phases of the distorted sampler-input clocks dat2CLK_in (DIST), dat4CLK_in (DIST).

The phases of the ideal sampler-input clocks edg1CLK_in (IDEAL), dat1CLK_in (IDEAL), edg2CLK_in (IDEAL), dat2CLK_in (IDEAL), edg3CLK_in (IDEAL), dat3CLK_in (IDEAL), edg4CLK_in (IDEAL), dat4CLK_in (IDEAL) and the phases of the distorted sampler-input clocks edg1CLK_in (DIST), dat1CLK_in (DIST), edg2CLK_in (DIST), dat2CLK_in (DIST), edg3CLK_in (DIST), dat3CLK_in (DIST), edg4CLK_in (DIST), dat4CLK_in (DIST)) are summarized and compared in Table 2.

TABLE 2

| | sampler-input clock | | | |
|---|---|---|---|---|
| | p = 1 | p = 2 | p = 3 | p = 4 |
| edge clocks | edg1CLK_in | edg2CLK_in | edg3CLK_in | edg4CLK_in |
| ideal phase | 0° | 90° | 180° | 270° |
| distorted phase | >0° | >90° | >180° | >270° |
| data clocks | dat1CLK_in | dat2CLK_in | dat3CLK_in | dat4CLK_in |
| ideal phase | 45° | 135° | 225° | 315° |
| distorted phase | <45° | >135° | <225° | >315° |

In the quarter-rate scheme, the timing/phase-alignment conditions are crucial. When the phases of the distorted sampler-input clocks edg1CLK_in (DIST), dat1CLK_in (DIST), edg2CLK_in (DIST), dat2CLK_in (DIST), edg3CLK_in (DIST), dat3CLK_in (DIST), edg4CLK_in (DIST), dat4CLK_in (DIST) are inaccurate, the sampling module 153 is incapable of correctly sampling the equalized data signal (eqDAT). Therefore, the distorted sampler-input clocks edg1CLK_in (DIST), dat1CLK_in (DIST), edg2CLK_in (DIST), dat2CLK_in (DIST), edg3CLK_in (DIST), dat3CLK_in (DIST), edg4CLK_in (DIST), dat4CLK_in (DIST) should be calibrated before the sampling module 153 starts using the sampler-input clocks (smpINCLK[r]) for sampling. Otherwise, the receiver 15 cannot function properly.

SUMMARY

The disclosure is directed to a clock calibration module, a high-speed receiver, and an associated calibration method, which are capable of generating sampler-input clocks with precise phases in the fractional-rate scheme. With the clock calibration module, the high-speed receiver, and the associated calibration method, the separate phase errors are respectively calibrated in a route-specific manner, and the potential mismatch phenomena that existed among different paths are solved in the meantime.

According to one embodiment, a clock calibration module is provided. The clock calibration module is electrically connected to a sampler. The sampler samples an equalized data signal with a sampler-input clock and accordingly generates a sampled output. The clock calibration module includes a clock generation module and a phase control circuit. The clock generation module includes R clock generation circuits. A clock generation circuit includes a phase interpolator, a duty cycle corrector, and a phase corrector. The phase interpolator interpolates a reference input clock and accordingly generates an interpolated clock. A phase of the interpolated clock is adjusted by a phase interpolator calibration signal. The duty cycle corrector is electrically connected to the phase interpolator. The duty cycle corrector generates a duty cycle corrected clock based on the interpolated clock. The phase corrector is electrically connected to the duty cycle corrector and the sampler. The phase corrector generates the sampler-input clock based on the duty cycle corrected clock. A phase of the sampler-input clock is adjusted by a phase corrector calibration signal. The phase control circuit includes a phase interpolator setting component and a phase corrector setting component. The phase interpolator setting component is electrically connected to the phase interpolator. The phase interpolator setting component generates the phase interpolator calibration signal in response to a state of a feedback output. The phase corrector setting component is electrically connected to the phase corrector. The phase corrector setting component generates the phase corrector calibration signal in response to the state of the feedback output. The feedback output is originated from the sampled output.

According to another embodiment, a high-speed receiver including the sampler and the clock calibration module is provided.

According to an alternative embodiment, a calibration method applied to the high-speed receiver is provided.

Figure 1:
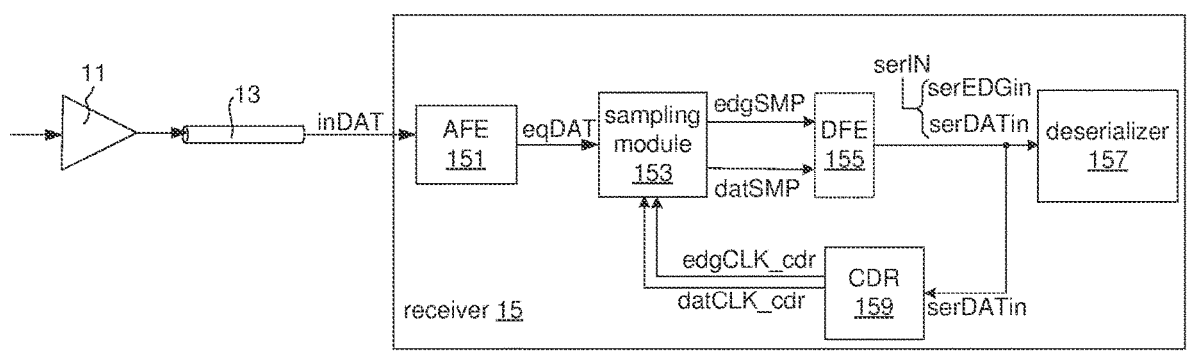
FIG. 1 (prior art) is a schematic diagram illustrating signal transmission between a transmitter and a receiver.

In the following detailed description, for purposes of explanation, numerous specific details are set forth in order to provide a thorough understanding of the disclosed embodiments. However, it will be apparent that one or more embodiments may be practiced without these specific details. In other instances, well-known structures and devices are schematically shown in order to simplify the drawing.

DETAILED DESCRIPTION

Figure 5:
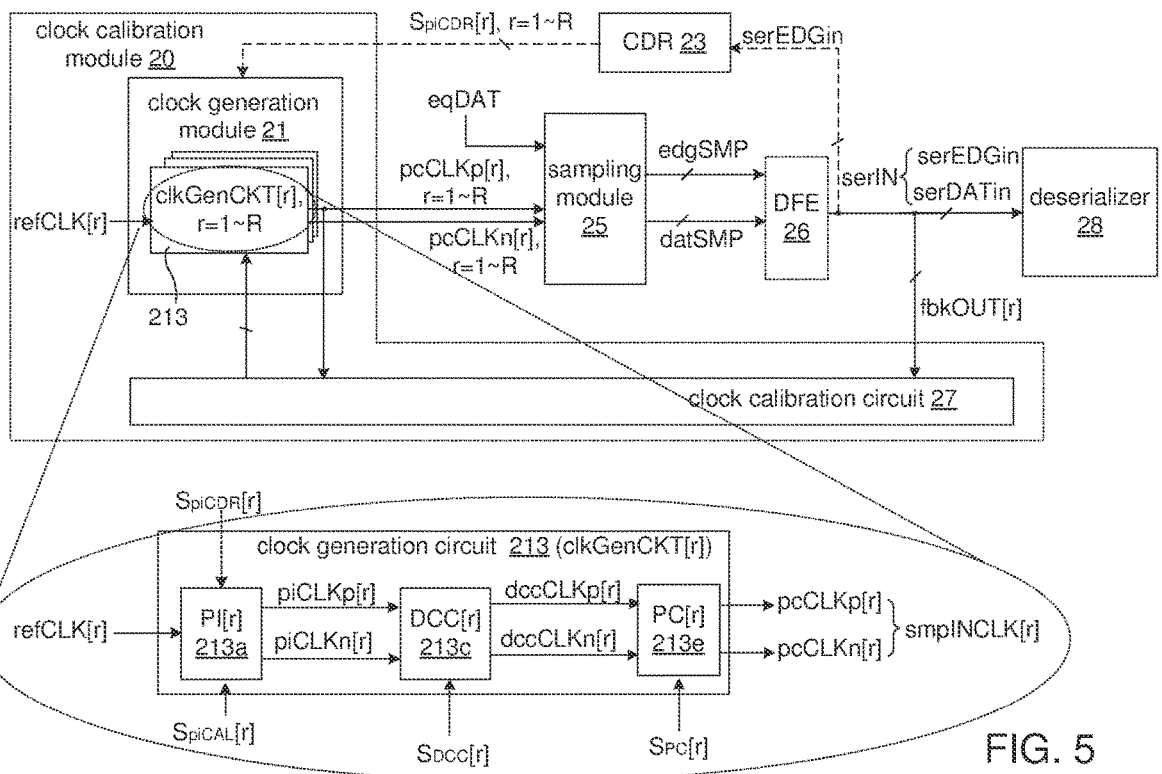
FIG. 5 is a schematic block diagram illustrating the clock calibration module used for the fractional-rate scheme in the high-speed receiver according to the embodiment of the present disclosure.

To ensure the samplers receive their sampler-input clocks with precise phases, a clock calibration module, a high-speed receiver, and an associated calibration method are provided in the specification. FIG. 5 is a schematic block diagram illustrating a clock calibration module used for the fractional-rate scheme in the high-speed receiver according to the embodiment of the present disclosure. Being placed in between the CDR 23 and the sampling module 25, a clock calibration module 20 including a clock generation module 21, and a clock calibration circuit 27 is provided in the disclosure.

Figure 2:
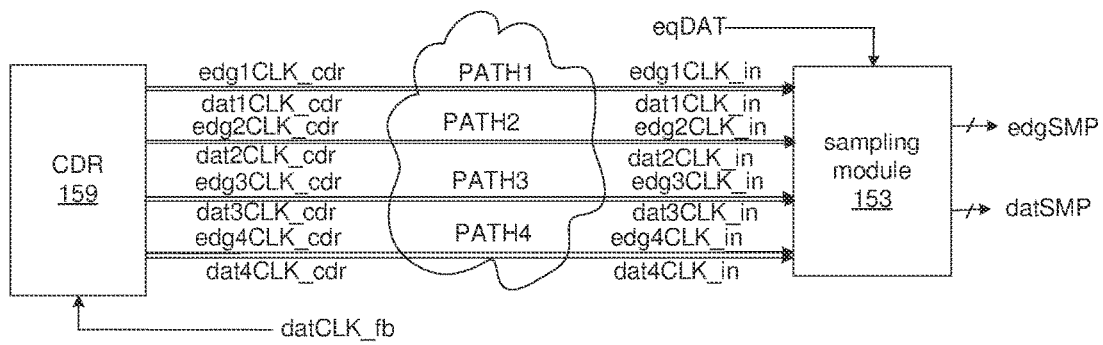
FIG. 2 (prior art) is a schematic diagram showing that the quarter-rate scheme is adopted to accelerate the signal processing speed.
Figure 3:
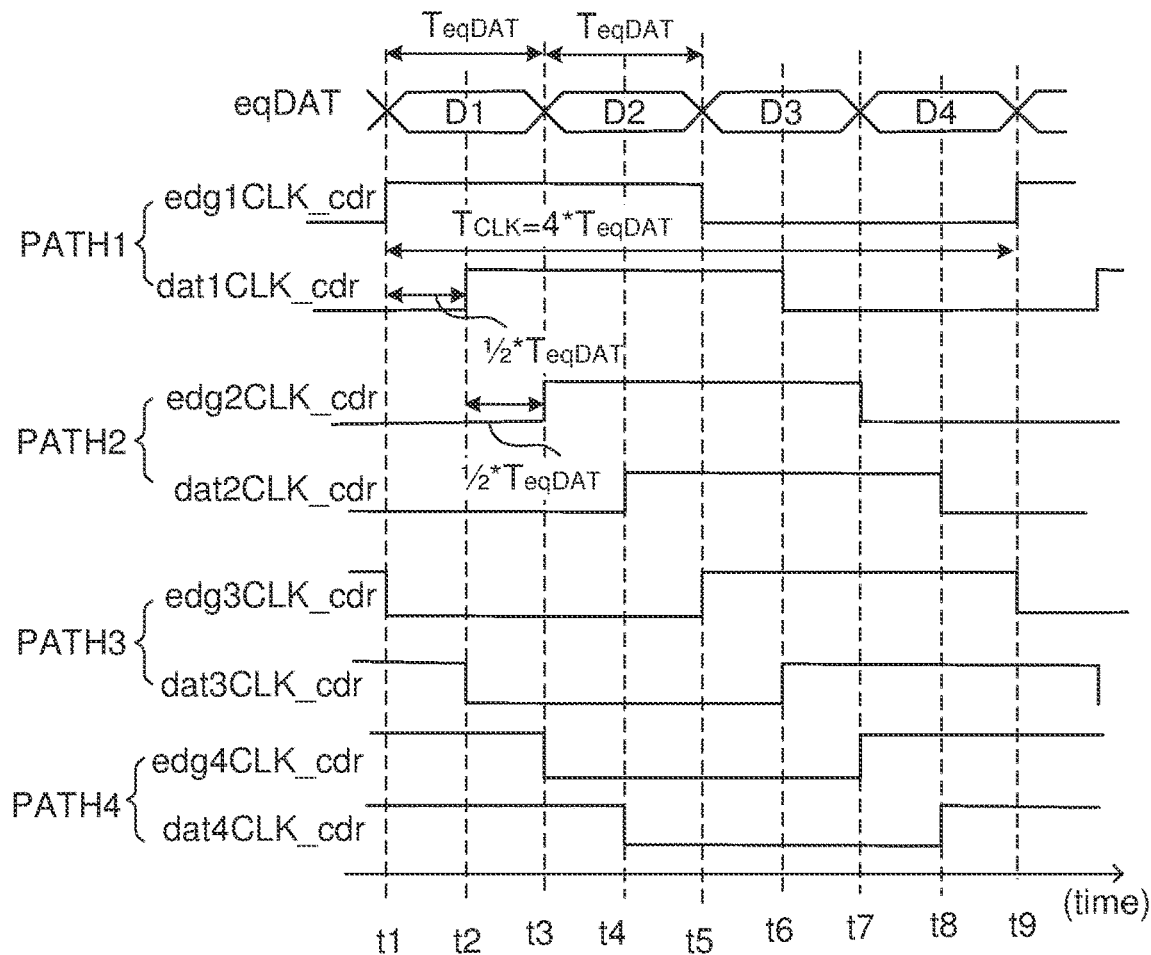
FIG. 3 (prior art) is a waveform diagram illustrating the phases of the recovered clocks in the quarter-rate scheme.
Figure 4:
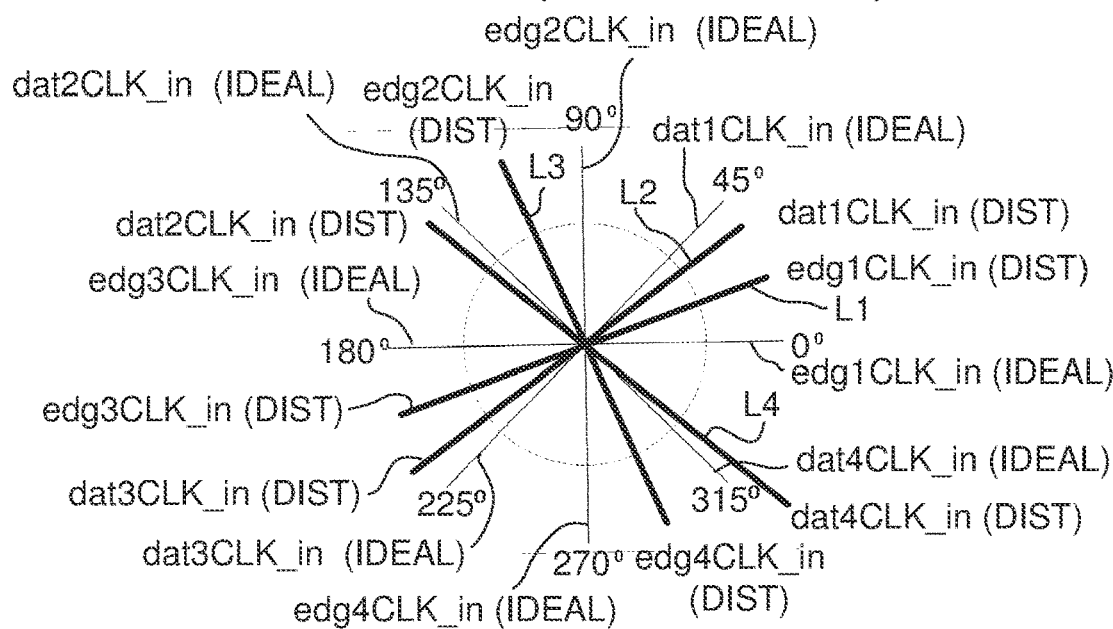
FIG. 4 (prior art) is a phase plane diagram illustrating the phases of the ideal lock points of sampler-input clocks edg1CLK_in (IDEAL)~edg4CLK_in (IDEAL), dat1CLK_in (IDEAL)~dat4CLK_in (IDEAL) and the distorted sampler-input clocks edg1CLK_in (DIST) ~edg4CLK_in (DIST), dat1CLK_in (DIST)~dat4CLK_in (DIST) in the quarter-rate scheme.

Please refer to FIGS. 2, 4, and 5 together. As shown in FIG. 4, due to the phase symmetry, the phases of distorted sampler-input clocks edg1CLK_in (DIST), dat1CLK_in (DIST) corresponding to the first path (PATH1) (p=1) are opposite to the phases of distorted sampler-input clocks edg3CLK_in (DIST), dat3CLK_in (DIST) corresponding to the third path (PATH3) (p=3), and the phases of distorted sampler-input clocks edg2CLK_in (DIST), dat2CLK_in (DIST) corresponding to the second path (PATH2) (p=2) are opposite to the phases of distorted sampler-input clocks edg4CLK_in (DIST), dat4CLK_in (DIST) corresponding to the fourth path (PATH4) (p=4). Thus, only the distorted sampler-input clocks being transmitted along with the first and the second paths (PATH1 (p=1) and PATH2 (p=2)) need to be calibrated.

According to the embodiment of the present disclosure, the clock calibration module 20 includes R clock generation circuits (clkGenCKT[r], r=1~R) 213, wherein each clock generation circuit (clkGenCKT[r]) 213 is related to the generation/calibration of a positive phase-corrected clock (pcCLKp[r]) and the generation/calibration of a negative phase-corrected clock (pcCLKn[r]). Each of the R clock generation circuits (clkGenCKT[r]) 213 can be considered as a clock calibration route, and the phases of the positive phase-corrected clock (pcCLKp[r]) and the negative phase-corrected clock (pcCLKn[r]) in the same clock calibration route (rth route) are 180° apart.

In the specification, variables r, R are defined to indicate the signals and components. The variable "R" represents the total number of clock calibration routes, and the variable "r" represents a selected clock generation route (or clock generation circuit (clkGenCKT[r])). Thus, the variables r, R are positive integers, and the variable "r" is smaller than or equivalent to the variable "R" (r≤R).

Please note that the variables p and r respectively represent different items. For example, the sampler-input clocks (edg1CLK_in dat1CLK_in) correspond to the edge-data clock pair for p=1, and the sampler-input clocks (edg1CLK_in, edg3CLK_in) correspond to the clock calibration route for r=1. According to the embodiment of the present disclosure, the variable "R" and the variable "P" are equivalent (R=P) when calibration procedures of the error clocks are not concerned. Or, the variable "R" is equivalent to 1.5*P (R=1.5*P) when the calibration procedures of the error clocks are concerned.

The clock generation circuits (clkGenCKT[r], r=1~R) 213 operate similarly, and the variable "r" is used to represent any of the clock generation circuits (clkGenCKT[1]~clkGenCKT[R]) 213. The clock generation circuit (clkGenCKT[1]~clkGenCKT[R]) 213 receives its corresponding reference input clock (refCLK[r]) from a reference clock source and receives its corresponding PI setting signal ($S_{piCDR}$[r]) from the CDR 23. The reference clock source provides a source clock (refCLK_src), and the source clock (reflCLK_src) is transformed to the reference input clocks (refCLK[1]~refCLK[R]). The cycle lengths of the source clock (reflCLK_src) and the reference input clocks (refCLK[1]~refCLK[R]) are equivalent to $T_{CLK}$. The reference clock source can be, for example, a phase-locked loop (hereinafter, PLL), a delay-locked loop (hereinafter, DLL), and so forth. More details about how the reference input clocks (refCLK[1]~refCLK[R]) are generated based on the source clock (refCLK_src) can be referred to FIG. 8.

The sampling module 25 further includes 2*R samplers (SPL[1]~SPL[2*R]). The sampled outputs of the sampling module 25, including the sampled edge outputs (edgSMP) and the sampled data outputs (datSMP), are output to the DFE 26 or the deserializer 28. If the DFE 26 is used, the DFE 26 generates the serial inputs (serIN), including the serial edge inputs (serEDGin) and the serial data inputs (serDATin), based on the sampled edge outputs (edgSMP) and the sampled data outputs (DatSMP). The serial edge inputs serEDGin and the serial data inputs (serDATin) are further transmitted to the deserializer 28 and the clock calibration circuit 27. Moreover, the serial edge inputs (serEDGin) are transmitted to the CDR 23 for clock/data recovery operation. The serial data inputs (serDATin) might or might not be transmitted to the CDR 23.

On the other hand, in the case that the DFE 26 is not used, the sampled edge outputs (edgSMP) and the sampled data outputs (datSMP) are directly transmitted to the deserializer 28 and the clock calibration circuit 27. Besides, the sampled edge outputs (edgSMP) are transmitted to the CDR 23 for clock/data recovery operation, and the sampled data outputs (datSMP) might or might not be transmitted to the CDR 23.

In the specification, the feedback outputs (fbkOUT[r], r=1~R) represent the signals fed to the clock calibration circuit 27. The feedback outputs (fbkOUT[r]) are originated/selected from the serial edge inputs serEDGin and/or the serial data inputs serDATin if the DFE 26 is used. Or, the feedback outputs (fbkOUT[r]) are directly originated/selected from the sampled edge outputs edgSMP and/or the sampled data outputs datSMP if the DFE 26 is not used.

The internal design of the clock generation circuit (clkGenCKT[r], r=1~R) 213 is enlarged at the bottom of FIG. 5. The clock generation circuit (clkGenCKT[r]) 213 receives the reference input clock refCLK[r] and generates the sampler-input clock smpINCLK[r]. The clock generation circuit (clkGenCKT[r]) 213 includes a phase interpolator (hereinafter, PI) PI[r] 213a, a duty cycle corrector (hereinafter, DCC) DCC[r] 213c, and a phase corrector (hereinafter, PC) PC[r] 213e, which are controlled by the clock calibration circuit 27. In short, the PI[r] 213a and the PC[r] 213e are used for directly/indirectly adjusting the phase of the sampler-input clock (smpINCLK[r]), and the DCC[r] 213c is used for indirectly adjusting the duty cycle of the sampler-input clock (smpINCLK[r]).

The PI[r] 213a respectively receives the PI setting signal ($S_{piCDR}$[r]) from the CDR 23, the reference input clock (refCLK[r]) from the reference clock source, and the PI calibration signal ($S_{piCAL}$[r]) from the clock calibration circuit 27. Then, the PI[r] 213a interpolates the reference input clock (refCLK[r]) and accordingly generates and transmits a pair of interpolated clocks (including a positive interpolated clock (piCLKp[r]) and a negative interpolated clock (piCLKn[r])) to the DCC[r] 213c. The positive interpolated clock (piCLKp[r]) and the negative interpolated clock (piCLKn[r]) are 180° out of phase. The phases of the positive interpolated clock (piCLKp[r]) and the negative interpolated clock (piCLKn[r]) are set by the PI setting signal ($S_{piCDR}$[r]) and adjusted by the PI calibration signal ($S_{piCAL}$[r]).

The DCC[r] 213c generates a pair of duty cycle corrected clocks (including a positive duty cycle corrected clock (dccCLKp[r]) and a negative duty cycle corrected clock (dccCLKn[r])) based on the positive interpolated clock (piCLKp[r]) and the negative interpolated clock (piCLKn[r]). The positive duty cycle corrected clock (dccCLKp[r]) and the negative duty cycle corrected clock (dccCLKn[r]) are 180° out of phase. The DCC[r] 213c receives the duty cycle corrector setting signal $S_{DCC}$[r] from the clock calibration circuit 27 to adjust the duty cycles of the positive duty cycle corrected clock (dccCLKp[r]) and the negative duty cycle corrected clock (dccCLKn[r]).

The PC[r] 213e receives the positive duty cycle corrected clock (dccCLKp[r]) and the negative duty cycle corrected clock (dccCLKn[r]) from the DCC[r] 213c. In addition, the PC[r] 213e receives the PC calibration signal ($S_{PC}$[r]) from the clock calibration circuit 27. Then, the PC[r] 213e generates a pair of phase-corrected clocks (including the positive phase-corrected clock (pcCLKp[r]) and the negative phase-corrected clock (pcCLKn[r])). The positive phase-corrected clock (pcCLKp[r]) and the negative phase-corrected clock (pcCLKn[r]) are further provided to and utilized by the sampling module 25.

As the phases of the positive phase-corrected clock (pcCLKp[r]) and the negative phase-corrected clock (pcCLKn[r]) are 180° out of phase, the phase calibration of the positive phase-corrected clock (pcCLKp[r]) can be directly applied to the negative phase-corrected clock (pcCLKn[r]), and vice versa. Thus, only one of the positive phase-corrected clock (pcCLKp[r]) and the negative phase-corrected clock (pcCLKn[r]) is required for phase calibration. Alternatively speaking, each clock calibration route includes a positive lane (corresponding to piCLKp[r], dccCLKp[r], and pcCLKp[r]) for generating the positive sampler-input clock (smpINCLKp[r]), and a negative lane (corresponding to piCLKn[r], dccCLKn[r], and pcCLKn[r]) for generating the negative sampler-input clock (smpINCLKn[r]). The calibration settings to one of the positive and the negative lanes can be directly applied to the other lane.

Figure 10A:
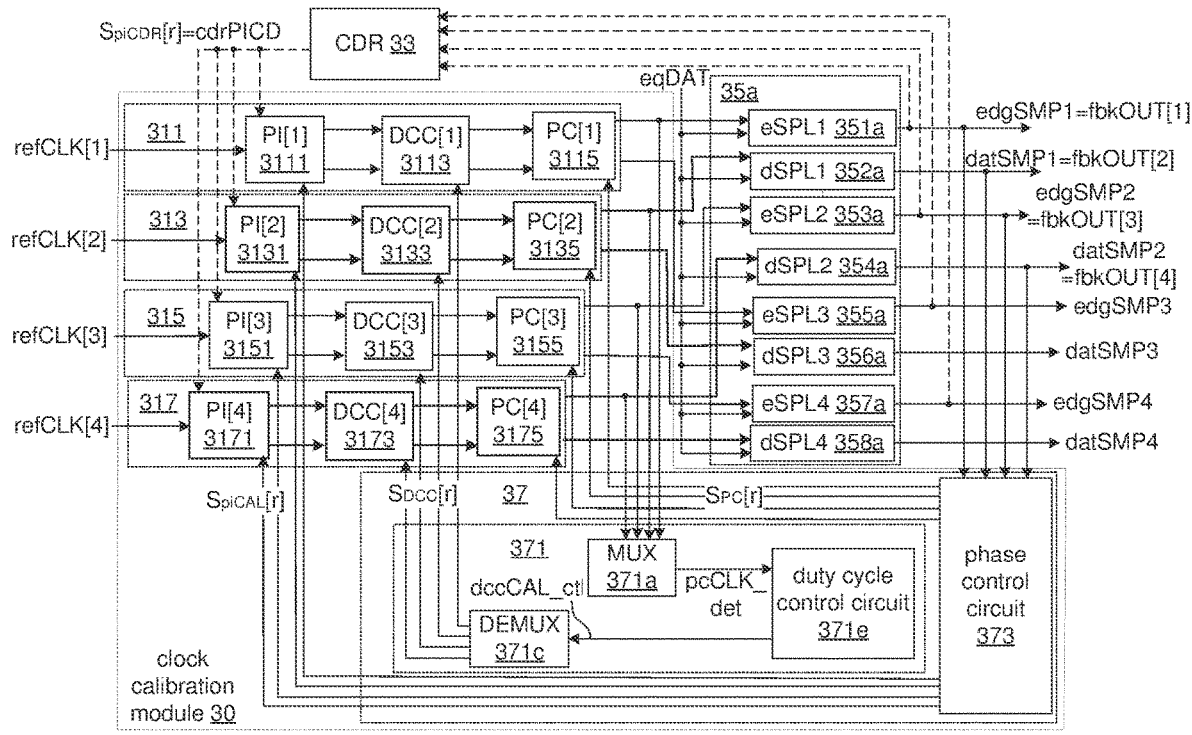
FIG. 10A is a schematic block diagram illustrating the clock calibration module being adopted in the high-speed receiver having the quarter-rate scheme.
Figure 10B:
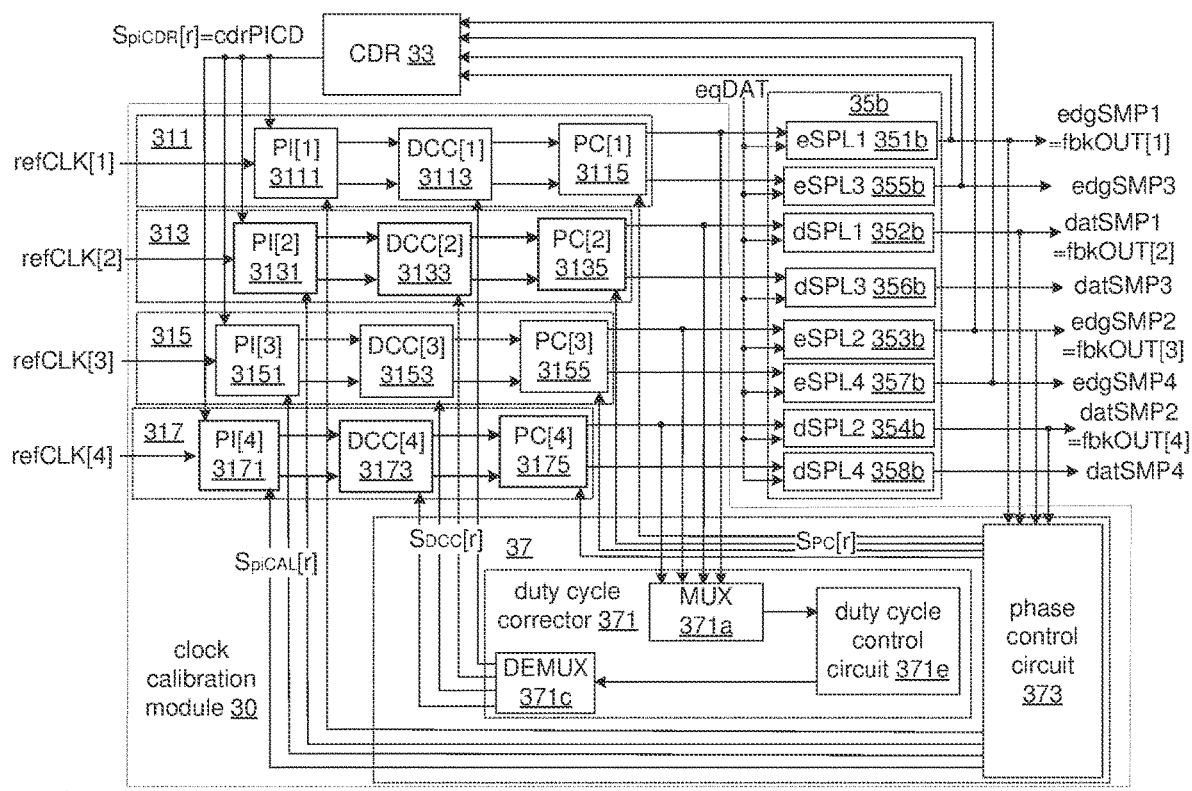
FIG. 10B is a schematic block diagram illustrating another embodiment of the clock calibration module adopted in the quarter-rate high-speed receiver.
Figure 30:
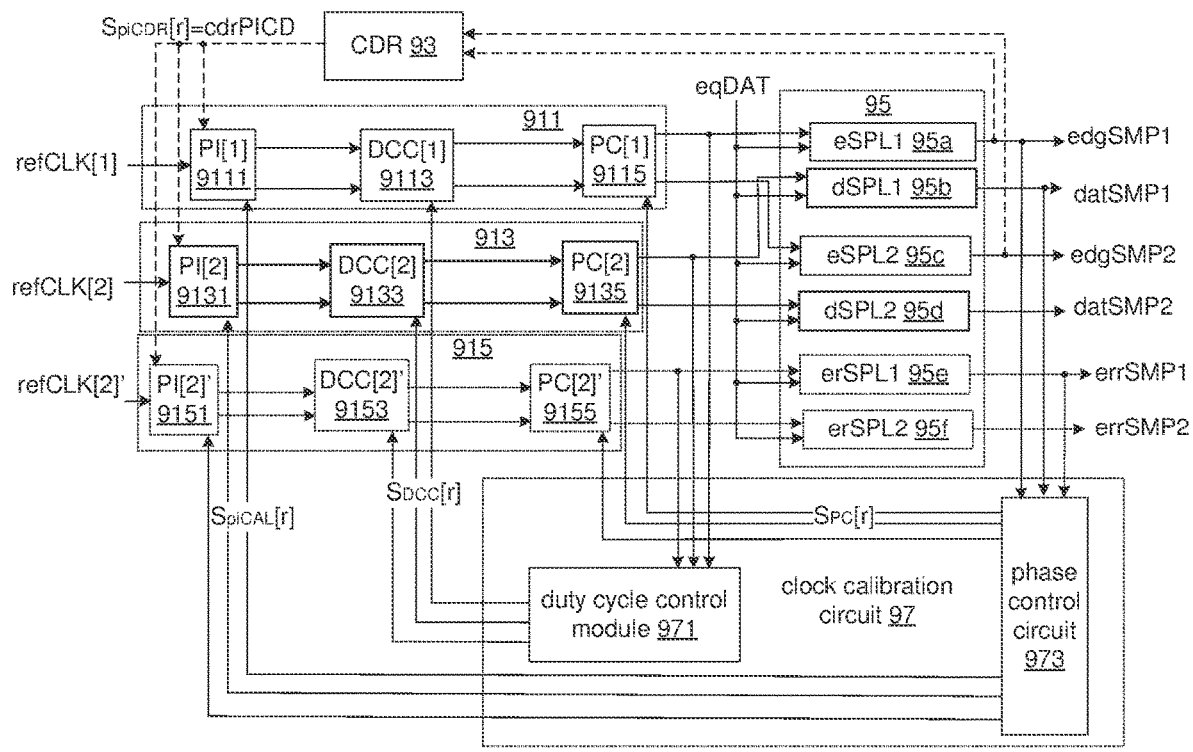
FIG. 30 is a schematic diagram illustrating an embodiment of error samplers in the high-speed receiver with an exemplary half-rate scheme.

Based on the generic block diagram in FIG. 5, different embodiments are provided. The embodiments showing the application to the quarter-rate scheme are shown in FIGS. 10A and 10B, and the embodiment showing the application to the half-rate scheme is shown in FIG. 30.

Figure 6:
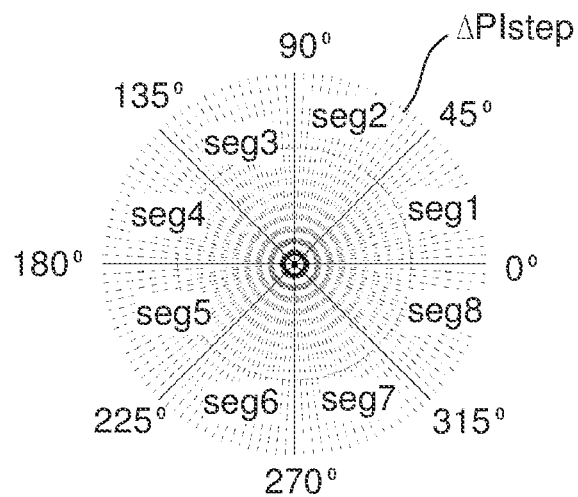
FIG. 6 is a phase plane diagram illustrating the interpolator-steps (ΔPIstep) in the phase segments (seg1~seg8) corresponding to the PI[1]~PI[4].

FIG. 6 is a phase plane diagram illustrating the interpolator-steps (ΔPIstep) in the phase segments (seg1~seg8) corresponding to the PI[1]~PI[4]. As illustrated above, the phase plane can be divided into 2*R phase segments (seg), and each of the phase segments (seg) corresponds to 360°/(2*R). For example, in the quarter-rate scheme (R=4), the phase segment (seg1~seg8) corresponds to 360°/8=45°. In the specification, it is assumed that each phase segment (seg1~seg8) corresponds to 16 interpolator-steps (ΔPIstep), and each PI[1]~PI[4] corresponds to a cyclic PI code range (cycRNGpi) having 128 interpolator-steps (ΔPIstep). That is, cycRNGpi=128*ΔPIstep.

According to the embodiment of the present application, the PI codes of the PI[1]~PI[4] are adjusted in a coarse calibration stage, and the PC codes of the PC[1]~PC[4] are adjusted in a fine calibration stage. In the coarse calibration stage, the PI codes of the PI[1]~PI[4] are adjusted in the unit of interpolator-step (ΔPIstep). In the fine calibration stage, the PC[1]~PC[4] are calibrated in the unit of delay intervals ($\Delta T_{dlyU}$). The fine calibration stage is performed to the PC[1]~PC[4] to further eliminate the non-linearity of the PI[1]~PI[4] and inaccuracy in decision making during the coarse calibration stage. The phase precision of the PI[1]~PI[4] (that is, interpolator-step ΔPIstep) is lower than the phase precision of the PC[1]~PC[4] (that is, delay intervals $\Delta T_{dlyU}$).

The high-speed receiver, according to the embodiment of the present disclosure, may operate in a calibration mode (M1) or a normal mode (M2). In the calibration mode (M1), the clock calibration module 20 calibrates duty cycles and phases of the clock signals being fed to the sampling module 25. The clock calibration circuit 27 searches and acquires settings suitable for the PI[r], DCC[r], and PC[r] in the calibration mode (M1), and the settings acquired in the calibration mode (M1) are adopted in the normal mode (M2). After the calibration mode (M1), the high-speed receiver enters the normal mode (M2). The high-speed receiver may enter the calibration mode (M1) soon after power-on or whenever it is necessary.

Depending on the operation mode of the high-speed receiver, the period of the equalized data signal (eqDAT) can be set with different lengths. In the calibration mode (M1), a calibration mode equalized data signal (eqDAT_cal) having a cycle length of $T_{eqDAT\_cal}$ is defined. In the normal-mode (M2), a normal mode equalized data signal (eqDAT_rx) having a cycle length of $T_{eqDAT\_rx}$ is defined.

The cycle length ($T_{eqDAT\_cal}$) of the calibration mode equalized data signal (eqDAT_cal) is equivalent to R times of the cycle length ($T_{eqDAT\_rx}$) of the normal mode equalized data signal (eqDAT_rx). That is, $T_{eqDAT\_cal} = R * T_{eqDAT\_rx}$. For example, in the high-speed receiver with the quarter-rate scheme (R=4), the cycle length ($T_{eqDAT\_cal}$) of the calibration mode equalized data signal (eqDAT_cal) is equivalent to four times the cycle length ($T_{eqDAT\_rx}$) of the normal mode equalized data signal (eqDAT_rx). That is, $T_{eqDAT\_cal} = 4 * T_{eqDAT\_rx}$.

Figure 7:
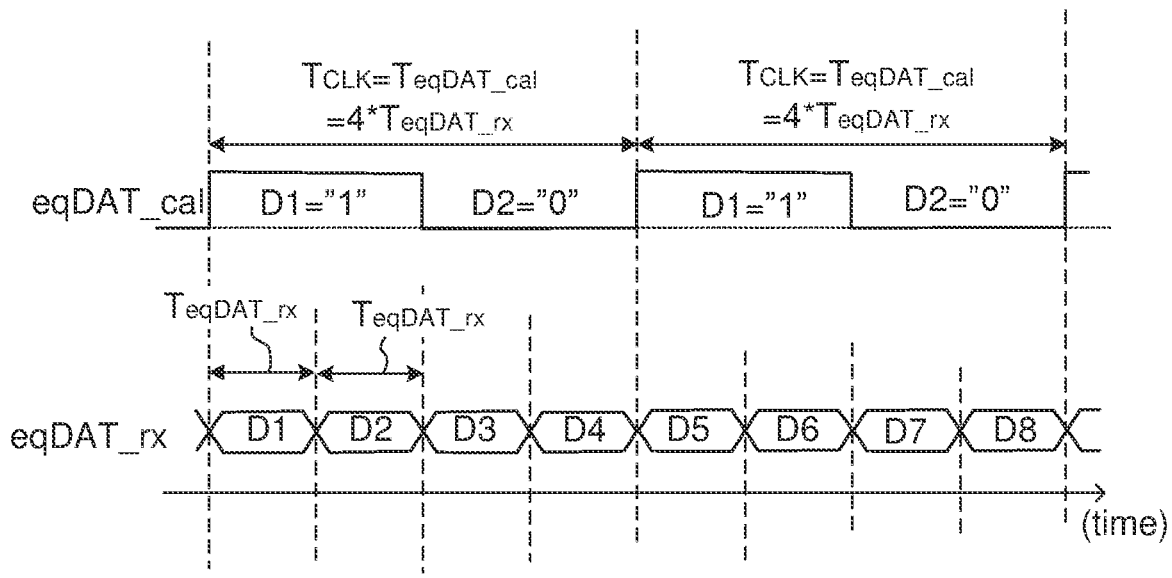
FIG. 7 is a schematic diagram illustrating the cycle lengths of the calibration mode equalized data signal (eqDAT_cal) and the normal mode equalized data signal (eqDAT_rx) in the high-speed receiver with the quarter-rate scheme.

FIG. 7 is a schematic diagram illustrating the cycle lengths of the calibration mode equalized data signal (eqDAT_cal) and the normal mode equalized data signal (eqDAT_rx) in the high-speed receiver with the quarter-rate scheme (R=4). According to the embodiment of the present disclosure, the calibration mode equalized data signal (eqDAT_cal) contains predefined data patterns (alternate "0s" and "1s"). For example, in FIG. 7, it is assumed that the data content of the calibration mode equalized data signal (eqDAT_cal) is set to "1" in the first half cycle (D1="1") and set to "0" in the second half cycle (D2="0"). Alternatively, in some applications, the calibration mode equalized data signal (eqDAT_cal) is set to "0" in the first half cycle and set to "1" in the second half cycle. The calibration mode equalized data signal eqDAT_cal may originate from the source clock refCLK_src. Therefore, generation of the calibration mode equalized data signal eqDAT_cal does not need extra circuitry, and the cycle length ($T_{eqDAT\_cal}$) of the equalized data signal eqDAT_cal is equivalent to the cycle length of the source clock refCLK_src ($T_{CLK}$).

On the other hand, the normal mode equalized data signal (eqDAT_rx) is originated from the transmitter and the AFE, and the content of the normal mode equalized data signal (eqDAT_rx) is changed in a unit of the cycle length of the normal mode equalized data signal ($T_{eqDAT\_rx}$). The cycle length of the normal mode equalized data signal ($T_{eqDAT\_rx}$) is equivalent to a quarter of the cycle length of the source clock refCLK_src ($T_{CLK}$). In FIG. 7, the data contents (D1~D8) are respectively corresponding to 8 consecutive cycles of the normal mode equalized data signal (eqDAT_rx). As the normal mode equalized data signal (eq- DAT_rx) is originated from the transmitter, the clock calibration circuit 27 does not know the content of the normal mode equalized data signal (eqDAT_rx) in advance.

Figure 8:
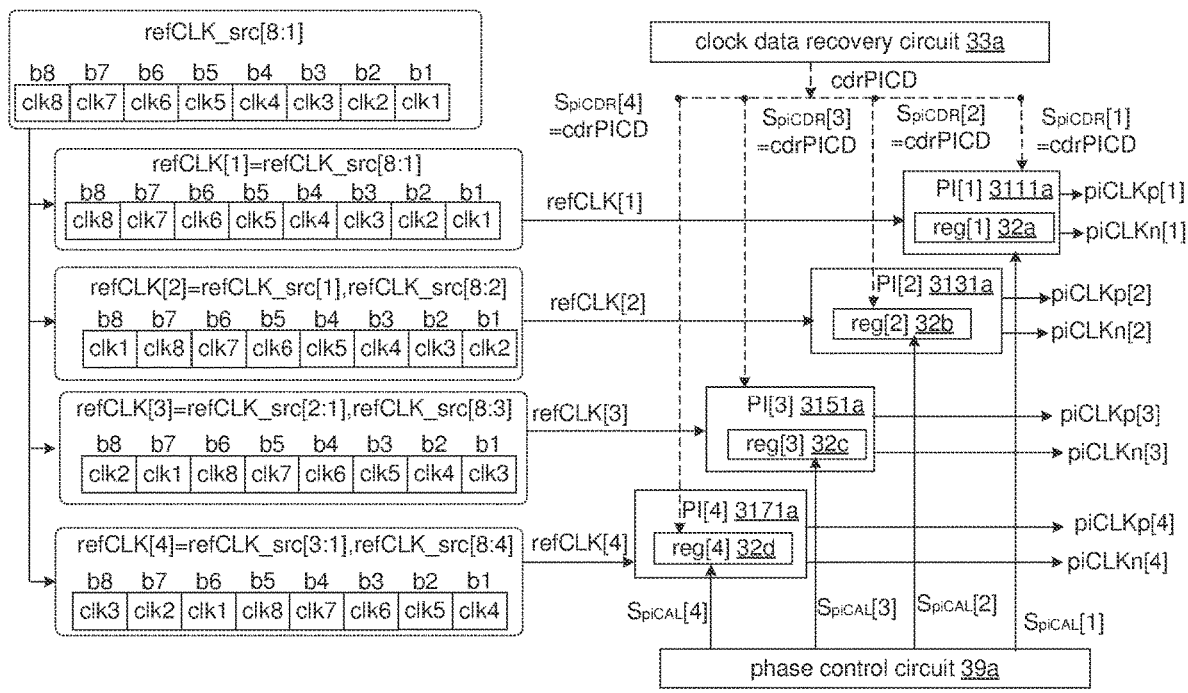
FIG. 8 is a schematic diagram illustrating the signals and functions of the PI[1]~PI[4].

FIG. 8 is a schematic diagram illustrating the signals and functions of the PI[1]~PI[4]. FIG. 8 includes a left part showing the generation of the reference input clocks (refCLK[1]~refCLK[4]) and a right part showing how the reference input clocks (refCLK[1]~refCLK[4]) are referred to set the PI[1]~PI[4].

The left part of FIG. 8 is illustrated first. As illustrated above, the source clock refCLK_src is utilized for generating the reference input clocks (refCLK[1]~refCLK[4]). The source clock refCLK_src and the reference input clocks (refCLK[1]~refCLK[4]) are all 8-bits (b1~b8) long. The most significant bit (hereinafter, MSB) (b8) of the source clock (refCLK_src) is labeled by clk8, the second MSB (b7) of the source clock refCLK_src is labeled by clk7, and so forth.

According to the embodiment of the present disclosure, the connections between the 8 bits of the reference input clocks (refCLK[1]~refCLK[4]) and the 8 bits of the source clock (refCLK_src) are different in respect to different clock generation circuits (clkGenCKT[1]~clkGenCKT[4]) 213. Because the bit order of the source clock refCLK_src is shifted for different clock generation circuits (clkGenCKT[1]~clkGenCKT[4]), the phases of the reference input clock (refCLK[1]~refCLK[4]) are inherently and automatically shifted although the PI codes of the PI[1]~PI[4] are equivalent.

Consequentially, under the assumption that the path mismatch caused by the channel loss is neglected, the phases of the reference input clock (refCLK[1]~refCLK[4]) are sequentially 45° apart when the clock data recover circuit 33a sets the PI[1]~PI[4] with the same PI code. Consequentially, the phase differences of the positive interpolated clocks (piCLKp[1]~piCLKp[4]) are equivalent to 45° as well. In FIG. 8, the CDR 33a sends the recovery setting code (cdrPICD) through the PI setting signals ($S_{piCDR}$[1], $S_{piCDR}$[2], $S_{piCDR}$[3], $S_{piCDR}$[4]) to all PI[1]~PI[4]. The dotted arrows between the CDR 33a and the PI[1]~PI[4] represent that the CDR 33a sends the PI setting signals ($S_{piCDR}$[1], $S_{piCDR}$[2], $S_{piCDR}$[3], $S_{piCDR}$[4]) only in the normal mode (M2). The right part of FIG. 8 shows the signals related to the PI[1]~PI[4], as summarized in Table 3.

As the signals and operations of the PI[1] 3111a~PI[4] 3171a are similar, only the PI[1] 3111a is illustrated as an example. The PI[1] 3111a receives the reference input clock refCLK[1] as its reference clock source. The PI code corresponding to the PI[1] 3111a is simultaneously set by the PI setting signal ($S_{piCDR}$[r]) from the CDR 33a and the PI calibration signal ($S_{piCAL}$[1]) from the phase control circuit 39a. Then, the PI[1] 3111a generates the positive interpolated clock (piCLKp[1]) and the negative interpolated clock (piCLKn[1]) based on the reference input clock (refCLK[1]) and the PI code of the PI[1] 3111a. The PI code of the PI[1] 3111a can be stored at the register (reg[1]) 32a. Details about how the PI code of the PI[1] 311a is generated are illustrated later.

Figure 9:
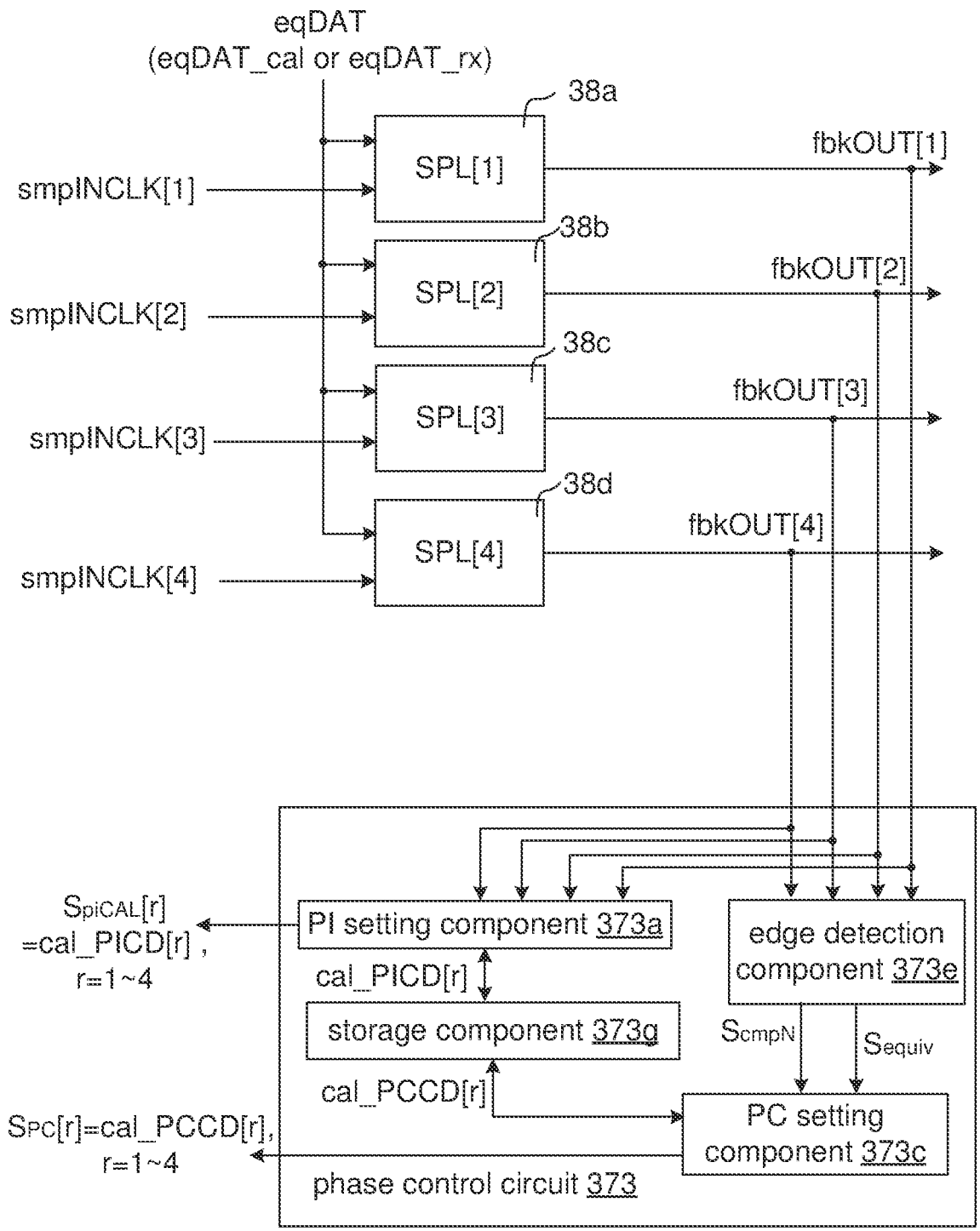
FIG. 9 is a block diagram illustrating the signal relationships between the SPL[1]~SPL[4] and the phase control circuit in the quarter-rate scheme.

FIG. 9 is a block diagram illustrating the signal relationships between the SPL[1]~SPL[4] and the phase control circuit in the quarter-rate scheme. For the sake of illustration, it is assumed that R=4 and the phase control circuit 373 is electrically connected to SPL[1] 38a~SPL[4] 38d. Each of the SPL[1]38a-SPL[4] 38d receives the equalized data signal (eqDAT) and one of the sampler-input clocks (smpINCLK[1]-smpINCLK[4]). The equalized data signal (eqDAT) may represent the calibration mode equalized data signal (eqDAT_cal) or the normal mode equalized data signal (eqDAT_rx), depending on the operation mode of the clock calibration module 20. Moreover, the outputs of the SPL[1] 38a~SPL[4] 38d are directly or indirectly utilized as the feedback outputs (fbkOUT[r], r=1~4).

The phase control circuit 373 includes a storage component 373g, a PI setting component 373a, an edge detection component 373e, and a PC setting component 373c. The storage component 373g is electrically connected to the PI setting component 373a and the PC setting component 373c. The storage component 373g is used to store the calibration results (including cal_PICD[1]~calPICD[R] and cal_PCCD[1]~cal_PCCD[R]). In practical application, implementation of the storage component 373g is not limited. For example, the storage component 373g may include separate storage circuits being respectively embedded in the PI setting component 373a and the PC setting component 373c.

The PI setting component 373a, edge detection component 373e, and the PC setting component 373c are implemented with the finite state machine (hereinafter, FSM) by hardware, software, or their combination. As the proposed design utilizes the existing circuit in the high-speed receiver to determine the path mismatch, no extra circuitry is required.

TABLE 3

| | | input signals of PI[r] | | | output signals of PI[r] | | | |
| --- | --- | --- | --- | --- | --- | --- | --- | --- |
| | | | | PI | positive lane | | negative lane | |
| PI[r] | register reg[r] | reference input clock refCLK[r] | PI setting signal $S_{piCDR}$[r] | calibration signal $S_{piCAL}$[r] | positive interpolated clock piCLKp[r] | phase | negative interpolated clock piCLKn[r] | phase |
| PI[1] 3111a | reg[1] 32a | refCLK[1] | $S_{piCDR}$[1] = $\Phi_{cdrSET}$ | $S_{piCAL}$[1] | piCLKp[1] | 0° | piCLKn[1] | 180° |
| PI[2] 3131a | reg[2] 32b | refCLK[2] | $S_{piCDR}$[2] = $\Phi_{cdrSET}$ | $S_{piCAL}$[2] | piCLKp[2] | 45° | piCLKn[2] | 225° |
| PI[3] 3151a | reg[3] 32c | refCLK[3] | $S_{piCDR}$[3] = $\Phi_{cdrSET}$ | $S_{piCAL}$[3] | piCLKp[3] | 90° | piCLKn[3] | 270° |
| PI[4] 3171a | reg[4] 32d | refCLK[4] | $S_{piCDR}$[4] = $\Phi_{cdrSET}$ | $S_{piCAL}$[4] | piCLKp[4] | 135° | piCLKn[4] | 315° |

The PI setting component 373a is utilized for adjusting the PI codes of the PI[1]~PI[4]. The PI setting component 373a is electrically connected to the PI[1]~PI[4] and the SPL[1] 38a~SPL[4] 38d. The PI setting component 373a generates the PI calibration signal ($S_{piCAL}[1]$~$S_{piCAL}[4]$) to the PI[1]~PI[4] based on the feedback outputs (fbkOUT[1]~fbkOUT[4]).

The edge detection component 373e and the PC setting component 373c are utilized for adjusting the PC codes of the PC[1]~PC[4]. The edge detection component 373e is electrically connected to the SPL[1] 38a~SPL[4]38d and the PC setting component 373c, and the PC setting component 373c is electrically connected to the PC[1]~PC[4]. The edge detection component 373e receives the feedback outputs (fbkOUT[1]~fbkOUT[4]), performs edge detection, and generates a counting comparison signal ($S_{cmpN}$) or an equivalent signal ($S_{equiv}$) to the PC setting component 373c. Then, the PC setting component 373c generates the PC calibration signal ($S_{PC}[r]$) based on the counting comparison signal ($S_{cmpN}$) and the equivalent signal ($S_{equiv}$). Details about the conditions of generating the counting comparison signal ($S_{cmpN}$) and the equivalent signal ($S_{equiv}$) are illustrated later.

According to the embodiment of the present disclosure, the clock calibration module does not need an extra phase detection circuit. Instead, phase detection is directly determined based on the operations of the SPL[r], and there is no extra propagation delay between the SPL[r] and the phase control circuit 373. Therefore, the proposed phase control circuit 373 is low-cost and efficient.

Two exemplary implementations of the clock calibration module 30 with a quarter-rate scheme are shown in FIGS. 10A and 10B. Whereas the implementation of the clock generation module is not limited to the embodiments in the disclosure. The clock calibration module 30 includes four clock generation circuits (clkGenCKT[1]~clkGenCKT[4]). The high-speed receiver with a quarter-rate scheme has four data samplers (dSPL1~dSPL4) and four edge samplers (eSPL1~eSPL4), which are clocked by different sampler-input clocks (smpINCLK[1]-smpINCLK[8]), with 45° apart. The phase distortion accompanied by the reference input clocks (refCLK[1]~refCLK[4]) is compensated by the clock calibration module 30.

In the quarter-rate scheme, the clock generation module is used together with 8 samplers. In FIGS. 10A and 10B, the 8 samplers (eSPL1~eSPL4, dSPL1~dSPL4) respectively generate the sampled edge outputs (edgSMP1~edgSMP4) and the sampled data outputs (datSMP1~datSMP4). The sampled edge outputs (edgSMP) respectively corresponding to the four paths (PATH1~PATH4) are respectively defined as the sampled edge outputs (edgSMP1, edgSMP2, edgSMP3, edgSMP4). The sampled data outputs (datSMP), respectively corresponding to the four paths (PATH1~PATH4), are respectively defined as the sampled data outputs (datSMP1, datSMP2, datSMP3, datSMP4).

FIG. 10A is a schematic block diagram illustrating an embodiment of the clock calibration module being adopted in the quarter-rate high-speed receiver. The signals related to the samplers in the sampling module 35a are summarized in Table 4. Due to the phase symmetry, only the sampled edge output (edgSMP1), the sampled data output (datSMP1), the sampled edge output (edgSMP2), and the sampled data output (datSMP2) are fed back.

TABLE 4

| clock generation circuit clkGenCKT[r] | positive/negative phase-corrected clock (sampler-input clock) smpINCLK[r]) | edge/ data sampler | sampled edge/data output (feedback output fbkOUT[r]) | transmission path (p) |
|---|---|---|---|---|
| clkGenCKT[1] 311 | pcCLKp[1] = smpINCLK[1] | eSPL1 351a | edgSMP1 = fbkOUT[1] | PATH 1 (p = 1) |
| clkGenCKT[2] 313 | pcCLKp[2] = smpINCLK[2] | dSPL1 352a | datSMP1 = fbkOUT[2] | |
| clkGenCKT[3] 315 | pcCLKp[3] = smpINCLK[3] | eSPL2 353a | edgSMP2 = fbkOUT[3] | PATH 2 (p = 2) |
| clkGenCKT[4] 317 | pcCLKp[4] = smpINCLK[4] | dSPL2 354a | datSMP2 = fbkOUT[4] | |
| clkGenCKT[1] 311 | pcCLKn[1] | eSPL3 355a | edgSMP3 | PATH 3 (p = 3) |
| clkGenCKT[2] 313 | pcCLKn[2] | dSPL3 356a | datSMP3 | |
| clkGenCKT[3] 315 | pcCLKn[3] | eSPL4 357a | edgSMP4 | PATH 4 (p = 4) |
| clkGenCKT[4] 317 | pcCLKn[4] | dSPL4 358a | datSMP4 | |

Please refer to FIG. 10A and Table 4 together. The inputs and outputs of the edge samplers (eSPL1~eSPL4) and the data samplers (dSPL1~dSPL4) are illustrated in top-down order.

In addition to the equalized data signal (eqDAT), the edge sampler (eSPL1) 351a receives the positive phase-corrected clock (pcCLKp[1]) of the clock generation circuit (clkGenCKT[1]) 311 as its sampler-input clock (smpINCLK[1]= pcCLKp[1]). Then, the sampled edge output (edgSMP1), being utilized as the feedback output (fbkOUT[1]), is generated by sampling the edge of the equalized data signal (eqDAT) with the sampler-input clock (smpINCLK[1]).

In addition to the equalized data signal (eqDAT), the data sampler (dSPL1) 352a receives the positive phase-corrected clock (pcCLKp[2]) of the clock generation circuit (clkGenCKT[2]) 313 as its sampler-input clock (smpINCLK[2]= pcCLKp[2]). Then, the sampled data output (datSMP1), being utilized as the feedback output (fbkOUT[2]), is generated by sampling the data of the equalized data signal (eqDAT) with the sampler-input clock (smpINCLK[2]).

In addition to the equalized data signal (eqDAT), the edge sampler (eSPL2) 353a receives the positive phase-corrected clock (pcCLKp[3]) of the clock generation circuit (clkGenCKT[3]) 315 as its sampler-input clock (smpINCLK[3]= pcCLKp[3]). Then, the sampled edge output (edgSMP2), being utilized as the feedback output (fbkOUT[3]), is generated by sampling the edge of the equalized data signal (eqDAT) with the sampler-input clock (smpINCLK[3]).

In addition to the equalized data signal (eqDAT), the data sampler (dSPL2) 354a receives the positive phase-corrected clock (pcCLKp[4]) of the clock generation circuit (clkGenCKT[4]) 317 as its sampler-input clock (smpINCLK[4]= pcCLKp[4]). Then, the sampled data output (datSMP2), being utilized as the feedback output (fbkOUT[4]), is generated by sampling the data of the equalized data signal (eqDAT) with the sampler-input clock (smpINCLK[4]).

In addition to the equalized data signal (eqDAT), the edge sampler (eSPL3) 355a receives the negative phase-corrected clock (pcCLKn[1]) of the clock generation circuit (clkGenCKT[1]) 311 as its sampler-input clock (smpINCLK[5]= pcCLKn[1]). Then, the sampled edge output (edgSMP3) is generated by sampling the edge of the equalized data signal (eqDAT) with the sampler-input clock (smpINCLK[5]).

In addition to the equalized data signal (eqDAT), the data sampler (dSPL3) 356a receives the negative phase-corrected clock (pcCLKn[2]) of the clock generation circuit (clk-GenCKT[2]) 313 as its sampler-input clock (smpINCLK [6]= pcCLKn[2]). Then, the sampled data output datSMP3 is generated by sampling the data of the equalized data signal (eqDAT) with the sampler-input clock (smpINCLK [6]).

In addition to the equalized data signal (eqDAT), the edge sampler (eSPL4) 357a receives the negative phase-corrected clock (pcCLKn[3]) of the clock generation circuit (clk-GenCKT[3]) 315 as its sampler-input clock (smpINCLK [7]= pcCLKn[3]). Then, the sampled edge output edgSMP4 is generated by sampling the edge of the equalized data signal (eqDAT) with the sampler-input clock (smpINCLK [7]).

In addition to the equalized data signal (eqDAT), the data sampler (dSPL4) 358a receives the negative phase-corrected clock (pcCLKn[4]) of the clock generation circuit (clk-GenCKT[4]) 317 as its sampler-input clock (smpINCLK [8]= pcCLKn[4]). Then, the sampled data output datSMP4 is generated by sampling the data of the equalized data signal (eqDAT) with the sampler-input clock (smpINCLK [8]).

In FIG. 10A, the duty cycle control module 371 includes a multiplexer (MUX) 371a, a de-multiplexer (DEMUX) 371c, and a duty cycle control circuit 371e. The MUX 371a receives the positive phase-corrected clocks (pcCLKp[1] ~pcCLKp[4]) from the clock generation circuits (clk-GenCKT[1 311]~clkGenCKT[4] 317), and passes one of the positive phase-corrected clocks (pcCLKp[1]~pcCLKp[4]) as a duty cycle detection signal (pcCLK_det) to the duty cycle control circuit 371e, depending on which of the clock generation circuits (clkGenCKT[1] 311~clkGenCKT[4] 317) is selected for calibration. Then the duty cycle control circuit 371e generates a duty cycle control signal (dccCA-L_ctl) to the DEMUX 371c, and the DEMUX 371c transmits the duty cycle corrector setting signal ($S_{DCC}$[1]~$S_{DCC}$ [4]) to one of the clock generation circuits (clkGenCKT[1] 311~clkGenCKT[4] 317).

In some applications, the clock calibration module 30 may adopt extra MUX(es) and DEMUX(es) to reduce the pin number of the phase control circuit 373. Details about such applications are not described in the specification.

FIG. 10B is a schematic block diagram illustrating another embodiment of the clock calibration module being adopted in the quarter-rate high-speed receiver. The signal relationships in FIG. 10B are summarized in Table 5.

TABLE 5

| clock generation circuit clkGenCKT[r] | positive/negative phase-corrected clock (sampler-input clock) smpINCLK[r]) | edge/ data sampler | sampled edge/data output (feedback output fbkOUT[r]) | transmission path |
|---|---|---|---|---|
| clkGenCKT[1] 311 | pcCLKp[1] = smpINCLK[1] | eSPL1 351b | edgSMP1 = fbkOUT[1] | PATH1 (p = 1) |
|  | pcCLKn[1] | eSPL3 355b | edgSMP3 | PATH3 (p = 3) |
| clkGenCKT[2] 313 | pcCLKp[2] = smpINCLK[2] | dSPL1 352b | datSMP1 = fbkOUT[2] | PATH1 (p = 1) |
|  | pcCLKn[2] | dSPL3 356b | datSMP3 | PATH3 (p = 3) |
| clkGenCKT[3] 315 | pcCLKp[3] = smpINCLK[3] | eSPL2 353b | edgSMP2 = fbkOUT[3] | PATH2 (p = 2) |
|  | pcCLKn[3] | eSPL4 357b | edgSMP4 | PATH4 (p = 4) |
| clkGenCKT[4] 317 | pcCLKp[4] = smpINCLK[4] pcCLKn[4] | dSPL2 354b dSPLP4 358b | datSMP2 = fbkOUT[4] datSMP4 | PATH2 (p = 2) PATH4 (p = 4) |

FIGS. 10A and 10B demonstrate that, for R (for example, 4) clock generation circuits clkGenCKT[1]~clkGenCKT [R], 2*R (for example, 8) samplers SPL[1]~SPL[8] are provided. Therefore, each clock generation circuit is electrically connected to two of the samplers.

Please refer to FIGS. 9, 10A, and 10B together. The SPL[1] 38a in FIG. 9 corresponds to the edge samplers (eSPL1) 351a, 351b in FIGS. 10A and 10B, the SPL[2] 38b in FIG. 9 corresponds to the data samplers (dSPL1) 352a, 352b in FIGS. 10A and 10B, the SPL[3] 38c in FIG. 9 corresponds to the edge samplers (eSPL2) 353a, 353b in FIGS. 10A and 10B, and the SPL[4] 38d in FIG. 9 corresponds to the data samplers (dSPL2) 354a, 354b in FIGS. 10A and 10B.

Please note that, in FIGS. 10A and 10B, the outputs of the edge samplers (eSPL1, eSPL2) and the data samplers (dSPL1, dSPL2) are conducted to the phase control circuit 373, as the feedback outputs (fbkOUT[1]~fbkOUT[4]). On the other hand, the outputs of the edge samplers (eSPL3, eSPL4) and the data samplers (dSPL3, dSPL4) are not conducted to the phase control circuit 373.

The clock calibration module 30 respectively calibrates each of the clock generation circuits (clkGenCKT[1]~clk-GenCKT[4]). With such arrangement, even if the edge/data samplers (eSPL1, eSPL2, eSPL3, eSPL4, dSPL1, dSPL2, dSPL3, dSPL4)) receive the equalized data signal (eqDAT) at different time points, the distortions accompanied with the path mismatch do not affect the sampled edge/data outputs (edgSMP1, edgSMP2, edgSMP3, edgSMP4, datSMP1, datSMP2, datSMP3, datSMP4). Therefore, for the edge samplers (eSPL1~eSPL4), the rising edges of the sampler-input clocks (smpINCLK[r]) after calibration are aligned with the transition edges of the equalized data signal (eq-DAT). Moreover, for the data samplers (dSPL1~dSPL4), the rising edges of the sampler-input clocks (smpINCLK [r]) after calibration are aligned with the data centers of the equalized data signal (eqDAT).

Although the equalized data signal (eqDAT) being transmitted to the SPL[1]~SPL[4] are simultaneously originated from the AFE, the actual time points that different SPL[1] ~SPL[4] receive the equalized data signal (eqDAT) may vary, and such variation is caused by path mismatch. The existence of path mismatch implies that the PI calibration signal $S_{piCAL}$[r] and the PC calibration signal $S_{PC}$[r] acquired for one clock calibration route might not be suitable for another clock calibration route. For the sake of illustration, a scenario showing that the SPL[1] and SPL[3] do not receive the normal mode equalized data signal (eqDAT_rx) simultaneously is discussed in FIG. 11.

Figure 11:
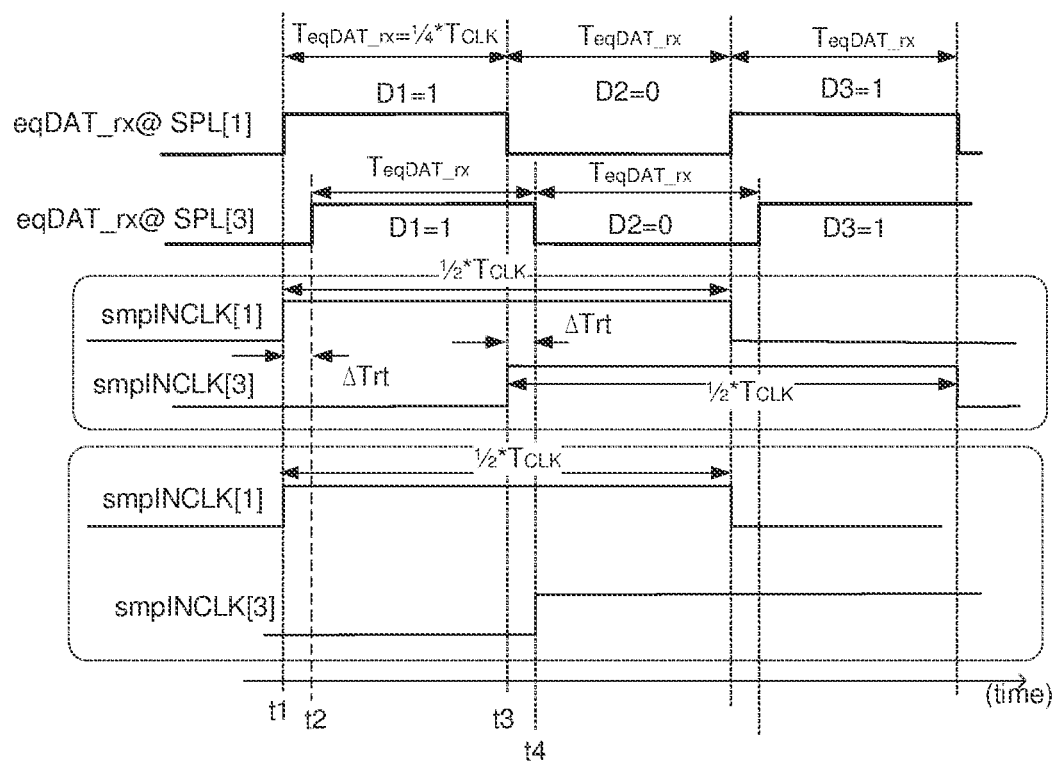
FIG. 11 is a waveform diagram illustrating the advantage of the route-specific phase-calibration approach.

FIG. 11 is a waveform diagram illustrating the advantage of the route-specific phase-calibration approach. The horizontal axis in FIG. 11 represents time.

The first and the second waveforms represent that the normal mode equalized data signal (eqDAT_rx) is received by the SPL[1], SPL[3] at different time points. Please note that the first and the second waveforms actually represent the same normal mode equalized data signal (eqDAT_rx), but the normal mode equalized data signal (eqDAT_rx) is received/sampled by the SPL[1] 38a and SPL[3] 38c at different time points.

For the sake of illustration, it is assumed that the data contents of the normal mode equalized data signal (eqDAT_rx) in the first cycle, the second cycle, and the third cycle are respectively equivalent to "1" (D1=1), "0" (D2=0), and "1" (D3=1). In FIG. 11, the first cycle of the normal mode equalized data signal (eqDAT_rx) received by the SPL[1] rises at time point t1, and the first cycle of the normal mode equalized data signal (eqDAT_rx) received by the SPL[3] rises at time point t2. The time difference (t2−t1) is defined as an inter-route mismatch time ΔTrt.

The waveforms shown in FIG. 11 are illustrated as an example. On some occasions, the time point that the SPL[1] receives the normal mode equalized data signal (eqDAT_rx) might be slightly later than the time point that the SPL[3] receives the normal mode equalized data signal (eqDAT_rx). Moreover, the inter-route mismatch may exist between any two of the SPL[1]38a, SPL[2] 38b, SPL[3] 38c, SPL[4] 38d.

The third and the fourth waveforms, being circulated by an upper dotted frame, represent that the sampler-input clocks (smpINCLK[1], smpINCLK[3]) are generated in the scenario when the PI codes of PI[1], PI[3] are equivalent and the PC codes of PC[1], PC[3] are equivalent. That is, the clock generation circuits (clkGenCKT[1], clkGenCKT[3]) are calibrated with an identical setting.

The first and third waveforms in FIG. 11 show that the SPL[1] 38a samples the first cycle of the normal mode equalized data signal (eqDAT_rx) (D1=1) with the sampler-input clock (smpINCLK[1]) at time point t1, and the "0→1" transition of the normal mode equalized data signal (eqDAT_rx) is aligned with time point t1. The second and fourth waveforms in FIG. 11 show that the SPL[3] samples the first cycle of the normal mode equalized data signal (eqDAT_rx) with the sampler-input clock (smpINCLK[3]) at time point t3, but the "1→0" transition of the normal mode equalized data signal (eqDAT_rx) is aligned with time point t4. Accordingly, when the clock generation circuits (clkGenCKT[1], clkGenCKT[3]) are calibrated with an identical setting, the sampled edge output of the SPL[1] (edgSMP1) is accurate, but the sampled edge output of the SPL[3] (edgSMP2) is inaccurate.

The fifth and the sixth waveforms, being circulated by a lower dotted frame, represent that the sampler-input clocks (smpINCLK[1], smpINCLK[3]) are generated in the scenario when the PI codes of PI[1], PI[3] are different, and the PC codes of PC[1], PC[3] are different. That is, the clock generation circuits (clkGenCKT[1], clkGenCKT[3]) are calibrated with different settings.

The first and fifth waveforms show that the SPL[1] 38a samples the first cycle of the normal mode equalized data signal (eqDAT_rx) (D1=1) with the sampler-input clock (smpINCLK[1]) at time point t1, and the "0→1" transition of the normal mode equalized data signal (eqDAT_rx) is aligned with time point t1. The second and sixth waveforms show that the SPL[3] 38c samples the second cycle of the normal mode equalized data signal (eqDAT_rx) with the sampler-input clock (smpINCLK[3]) at time point t4, and the "1→0" transition of the normal mode equalized data signal (eqDAT_rx) is aligned with time point t4. Accordingly, when the clock generation circuits (clkGenCKT[1], clkGenCKT[3]) are calibrated with different settings, the sampled edge outputs of the SPL[1], SPL[3] (edgSMP1, edgSMP2) are both accurate.

Figure 12:
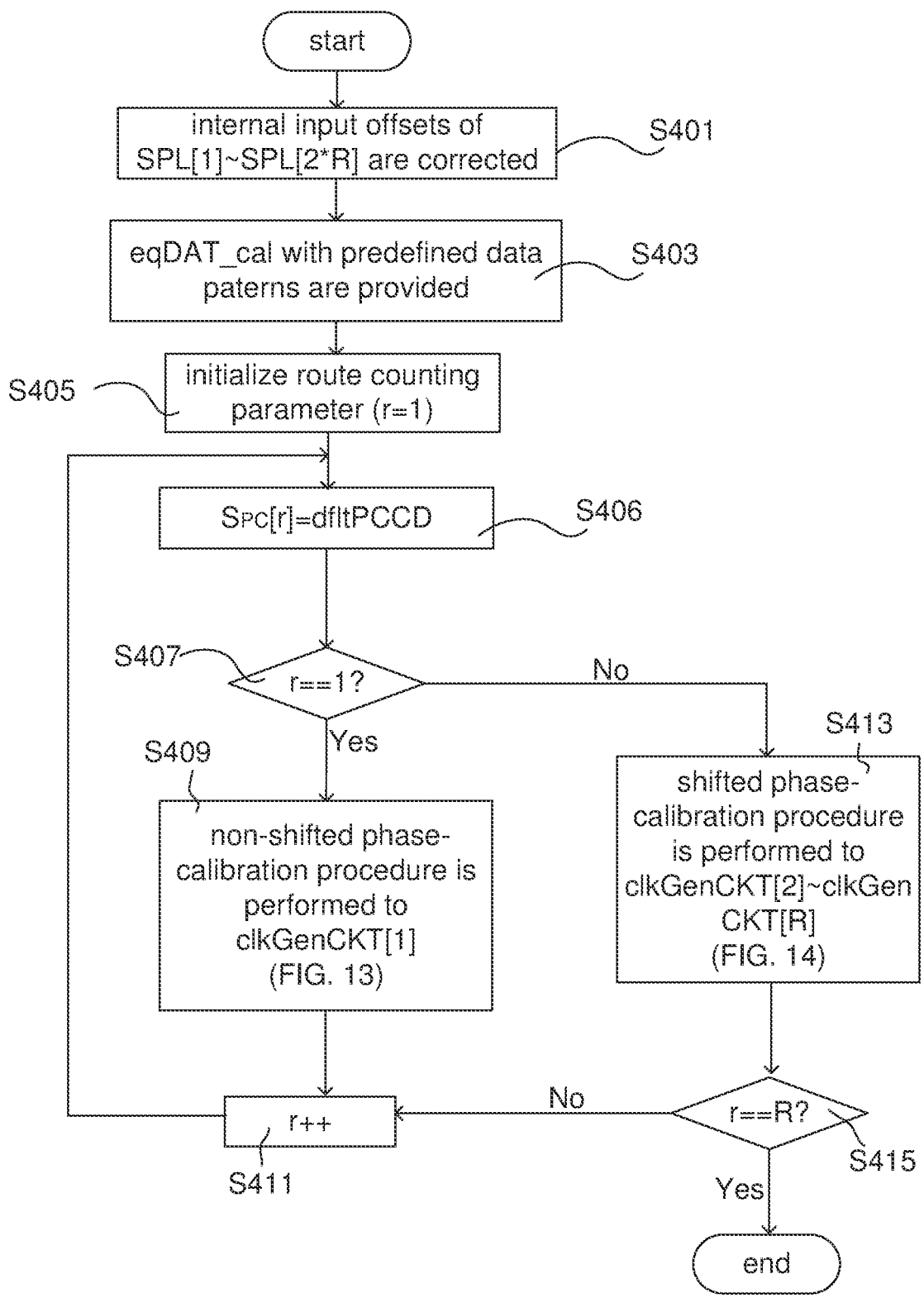
FIG. 12 is a flow diagram illustrating the operation of the fractional-rate high-speed receiver in the calibration mode (M1).

FIG. 12 is a flow diagram illustrating the operation of the fractional-rate high-speed receiver in the calibration mode (M1). The clock calibration module 20 performs the steps shown in FIG. 12 before the fractional-rate high-speed receiver enters the normal mode (M2). In the calibration mode (M1), the clock calibration module 20 calibrates phases and duty cycles of the sampler-input clocks (smpINCLK[r], r=1~R). The embodiments of the present disclosure focus on the phase correction aspect.

In practical design, the two inputs of the same samplers SPL[1]~SPL[2*R] may have an inherent mismatch (internal input offset) due to manufacturing. To prevent such inherent mismatch from affecting the accuracy of the SPL[1]~SPL[2*R], the internal input offsets of all SPL[1]~SPL[2*R] are firstly corrected (step S401). Then, the calibration mode equalized data signal (eqDAT_cal) with predefined data patterns (such as a sequence of "0101" or a sequence of "1010") is continuously provided to the SPL[1]~SPL[2*R] (step S403).

Later, a route counting parameter (r) is initialized (r=1) (step S405), and the PC code of PC[r] is set to a default PC code (dfltPCCD), through the PC calibration signal $S_{PC}[r]$ ($S_{PC}[r]$=dfltPCCD) (step S406). According to the embodiment of the present disclosure, different phase-calibration procedures are performed to the clock generation circuits (clkGenCKT[r]), depending on the value of the route counting parameter (r).

In step S407, it is determined whether the route counting parameter (r) is equivalent to 1 (r==1?) (step S407). For r=1, a non-shifted phase-calibration procedure (see FIG. 13) is performed to the clock generation circuit clkGenCKT[1] and a fine-calibrated sampler-input clock (f-cal smpINCLK[1]) is generated accordingly (step S409). Then, the route counting parameter (r) counts up (r++) (step S411), and step S406 is performed again.

On the other hand, for r=2~R, a shifted phase-calibration procedure (see FIG. 14) is performed to the clock generation circuit clkGenCKT[r](r=2~R), and a backward-shifted sampler-input clock (b-shft smpINCLK[r]) is generated (step S413).

After step S413, it is determined whether all the clock generation circuits (clkGenCKT[1]~clkGenCKT[R]) have been calibrated (r==R?) (step S415). If the determination result of step S415 is positive, the route phase-calibration procedure ends. If the determination result of step S415 is negative, the route counting parameter (r) counts up (r++) (step S411), and step S413 is performed again to another clock generation circuit (clkGenCKT[r], r=3~R).

Figure 13:
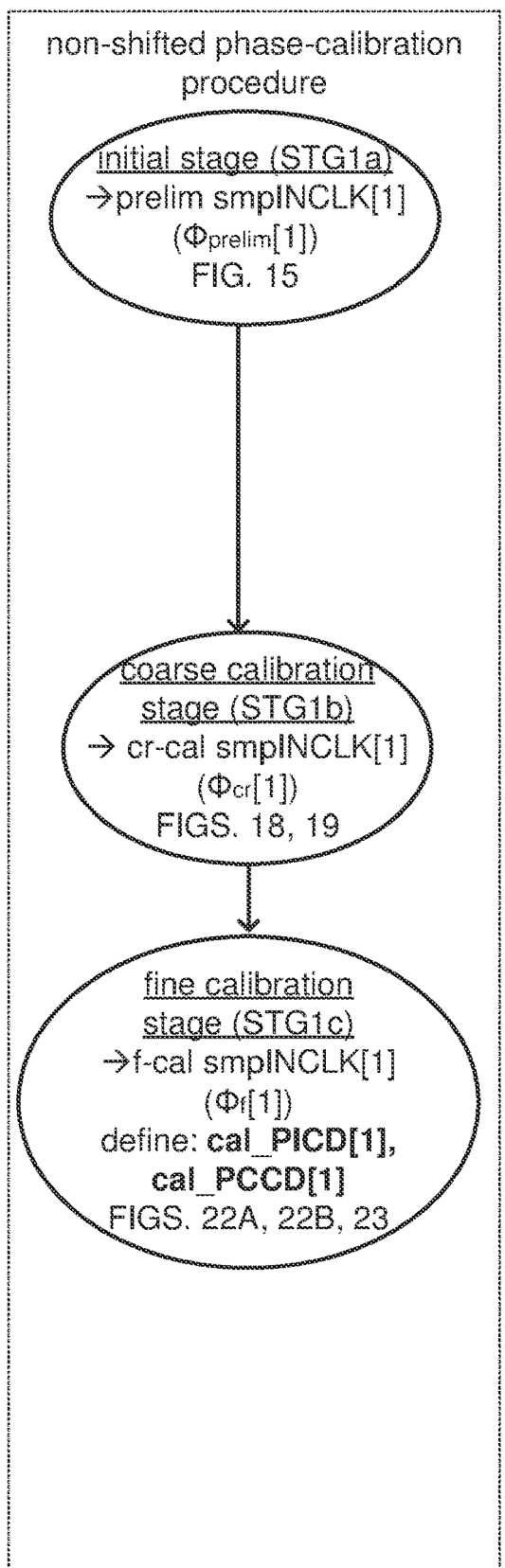
FIG. 13 is a state diagram illustrating the non-shifted phase-calibration procedure performed to the clock generation circuit (clkGenCKT[1]).

FIG. 13 is a state diagram illustrating the non-shifted phase-calibration procedure performed to the clock generation circuit (clkGenCKT[1]). The non-shifted phase-calibration procedure includes three stages, including an initial stage (STG1a), a coarse calibration stage (STG1b), and a fine calibration stage (STG1c).

Figure 15:
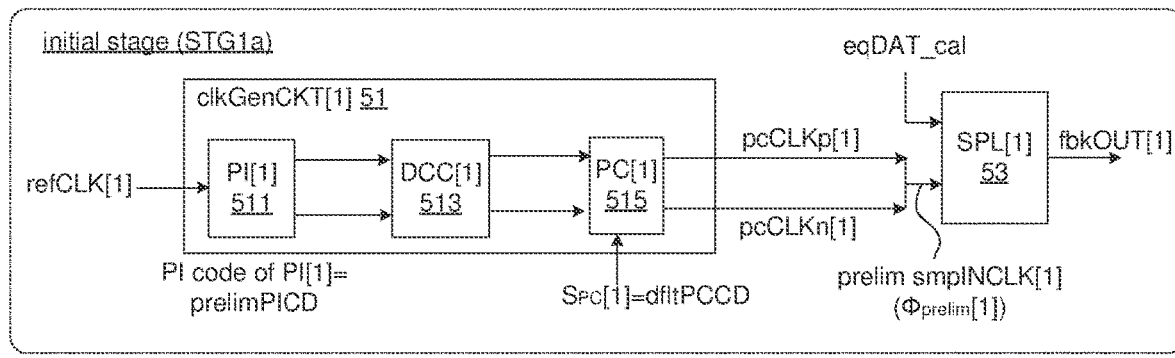
FIG. 15 is a schematic diagram illustrating signals related to the clock generation circuit (clkGenCKT[1]) at the initial stage (STG1a).

In the initial stage (STG1a), a preliminary sampler-input clock (prelim smpINCLK[r]) having a preliminary phase ($\phi_{prelim}[1]$) is generated (see FIG. 15). In the coarse calibration stage (STG1b), a coarse-calibrated sampler-input clock (cr-cal smpINCLK[1]) having a coarse-calibrated phase ($\phi_{cr}[1]$) is generated (see FIGS. 18 and 19). In the fine-calibration stage (STG1c), a fine-calibrated sampler-input clock (f-cal smpINCLK[1]) having a fine-calibrated phase ($\phi_f[1]$) is generated (see FIGS. 22A, 22B, and 23). By the end of the fine-calibration stage (STG1c), a calibrated PI code (cal_PICD[1]) and a calibrated PC code (cal_PCCD [1]) are defined and stored. Later, the calibrated PI code (cal_PICD[1]) and the calibrated PC code (cal_PCCD[1]) are utilized in the normal mode (M2).

Figure 14:
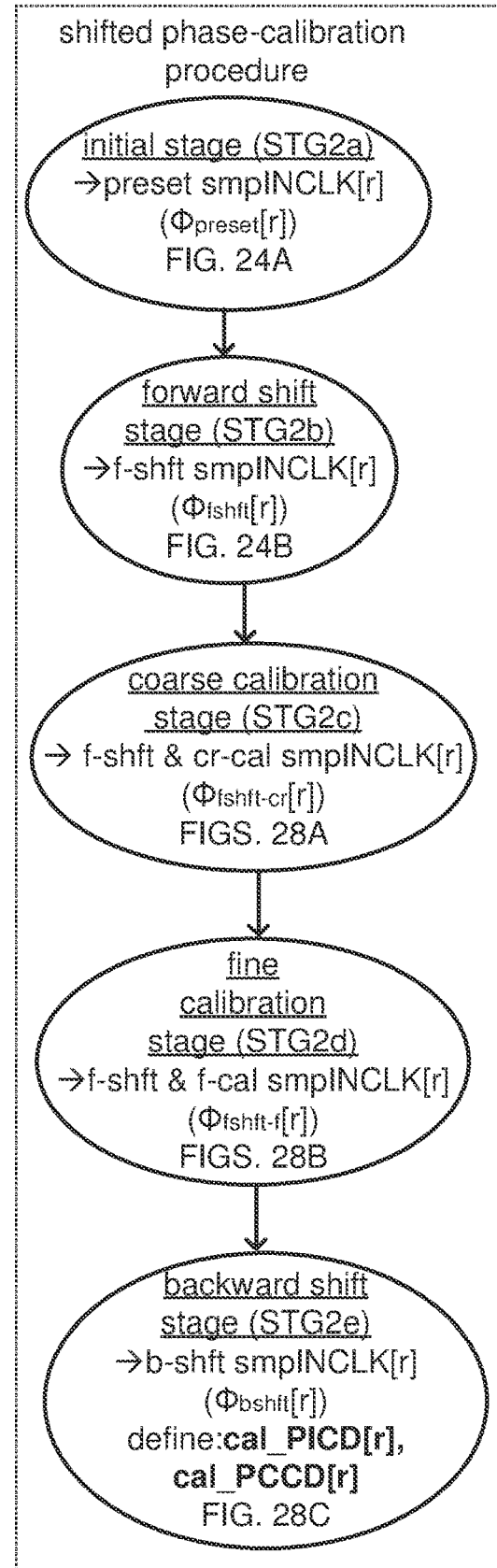
FIG. 14 is a state diagram illustrating the shifted phase-calibration procedure performed to the clock generation circuits (clkGenCKT[2]~clkGenCKT[R]).

FIG. 14 is a state diagram illustrating the shifted phase-calibration procedure performed to the clock generation circuits (clkGenCKT[r], r=2~R). The shifted phase-calibration procedure includes five stages, including an initial stage (STG2a), a forward shift stage (STG2b), a coarse calibration stage (STG2c), a fine calibration stage (STG2d), and a backward shift stage (STG2e).

Figure 24A:
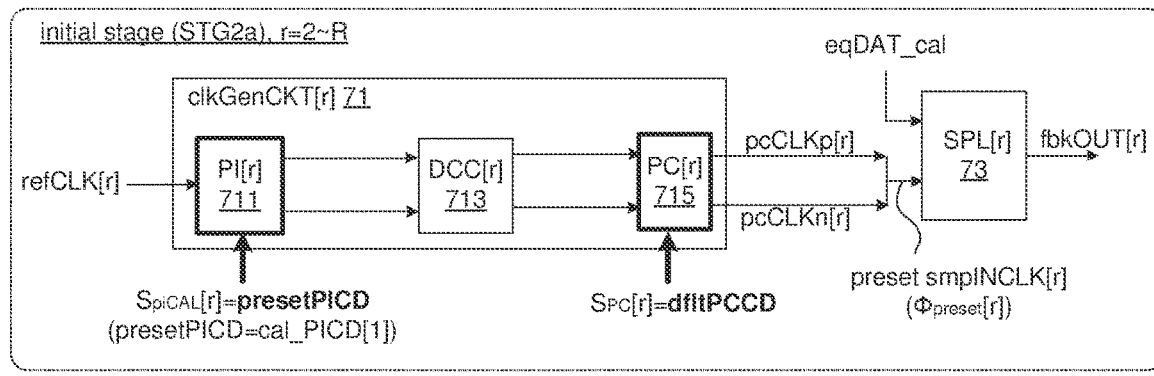
FIG. 24A is a schematic diagram illustrating signals related to the clock generation circuits (clkGenCKT[2] ~clkGenCKT[R]) at the initial stage (STG2a).

In the initial stage (STG2a), the PI[r] is preset by the PI calibration signal $S_{pi}CAL[r]$ with the calibrated PI code (cal_PICD[1]), and a preset sampler-input clock (preset smpINCLK[r]) having a preset phase ($\phi_{preset}[r]$) is generated accordingly (see FIG. 24A). In the forward shift stage (STG2b), a forward-shifted sampler-input clock (f-shft smpINCLK[r]) having a forward-shifted phase ($\phi_{fshft}[r]$) is generated (see FIG. 24B). In the coarse calibration stage (STG2c), a forward-shifted plus coarse-calibrated sampler-input clock (f-shift & cr-cal smpINCLK[r]) having a forward-shifted plus coarse-calibrated phase ($\phi_{fshft-cr}[r]$) is generated (see FIG. 28A). In the fine-calibration stage (STG2d), a forward-shifted plus fine-calibrated sampler-input clock (f-shift & f-cal smpINCLK[r]) having a forward-shifted plus fine-calibrated phase ($\phi_{fshft-f}[r]$) is generated (see FIG. 28B). In the backward shift stage (STG2e), a backward-shifted sampler-input clock (b-shft smpINCLK[r]) having a backward-shifted phase ($\phi_{bshft}[r]$) is generated (see FIG. 28C). By the end of the backward shift stage (STG2e), a calibrated PI code (cal_PICD[r]) and a calibrated PC code (cal_PCCD [r]) are defined and stored. Later, the calibrated PI code (cal_PICD[r]) and the calibrated PC code (cal_PCCD[1]) are utilized in the normal mode (M2).

In the following, FIGS. 15~23 firstly demonstrate the non-shifted phase-calibration procedure performed to the clock generation circuit clkGenCKT[1] 51. Then, FIGS. 24A~28C demonstrate the shifted phase-calibration procedure performed to the clock generation circuits clkGenCKT [2]~clkGenCKT[R].

Figure 19:
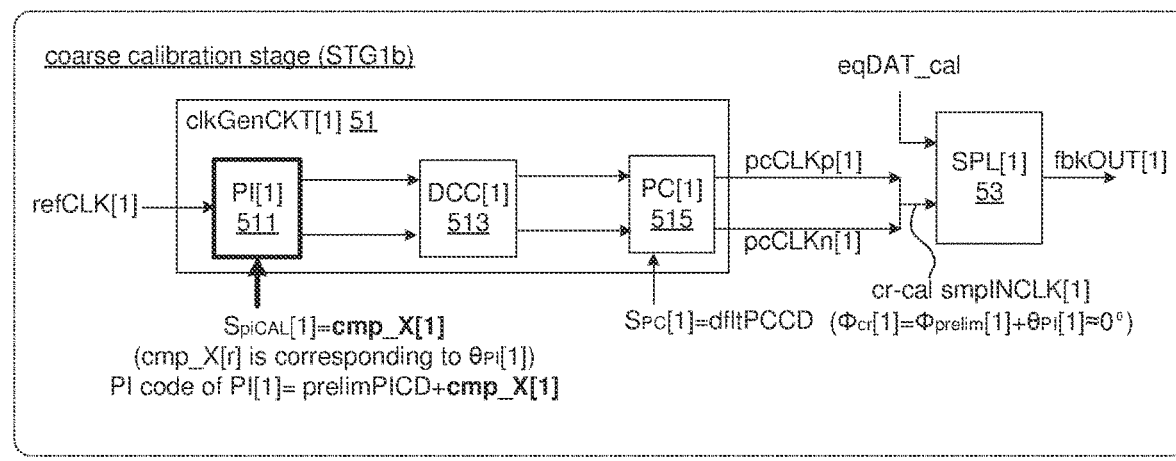
FIG. 19 is a schematic diagram illustrating signals related to the clock generation circuit (clkGenCKT[1]) at the coarse calibration stage (STG1b).
Figure 23:
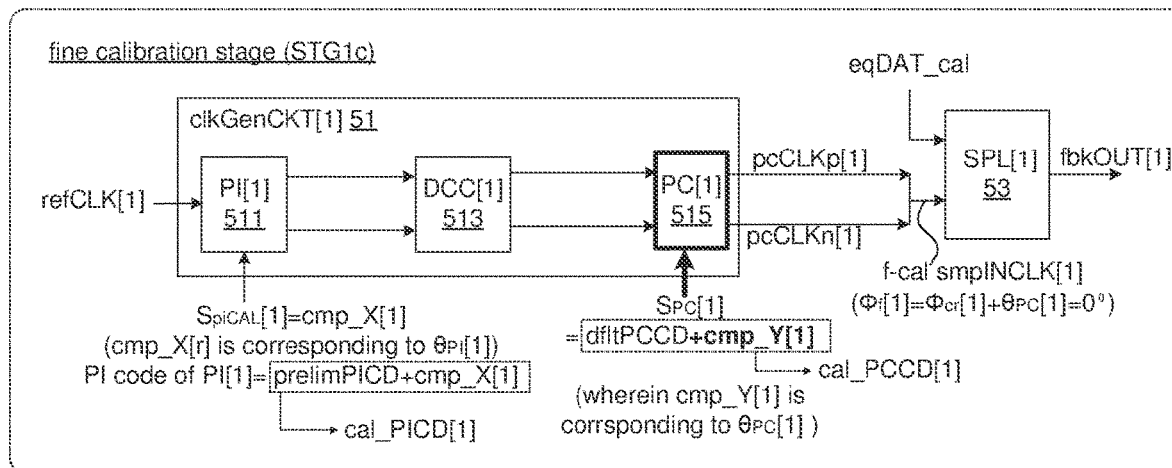
FIG. 23 is a schematic diagram illustrating signals related to the clock generation circuit (clkGenCKT[1]) at the fine calibration stage (STG1c).

In FIGS. 15, 19, and 23, block diagrams showing the clock generation circuit clkGenCKT[1] 51 with different settings at different stages are provided. In these figures, the clock generation circuit clkGenCKT[1] 51 includes the PI[1] 511, the DCC[1] 513, and the PC[1] 515. The clock generation circuit clkGenCKT[1] 51 receives the reference input clock refCLK[1], the PI calibration signal $S_{piCAL}[1]$, and the PC calibration signal $S_{PC}[1]$. The outputs of the clock generation circuit (clkGenCKT[1]) 51 include a positive phase-corrected clock (pcCLKp[1]) and a negative phase-corrected clock (pcCLKn[1]), and one of which is provided to the SPL[1] 53 as the sampler-input clock (smpINCLK[1]). The SPL[1] 53 samples the calibration mode equalized data signal (eqDAT_cal) with the sampler-input clock (smpINCLK[1]), and the sampling result of the SPL [1] 53 is considered as the feedback output (fbkOUT[1]).

FIG. 15 is a schematic diagram illustrating signals related to the clock generation circuit (clkGenCKT[1]) at the initial stage (STG1a). The PI[1] has a preliminary PI code (prelimPICD), and the PC[1] is set to a default PC code (dfltPCCD). The preliminary PI code (prelimPICD) can be, for example, 0 (prelimPICD=0).

As the preliminary phase ($\phi_{prelim}[1]$) is not precise, the preliminary sampler-input clock (prelim smpINCLK[1]) needs to be compensated. In the specification, the phase difference between the preliminary phase ($\phi_{prelim}[1]$) and the ideal phase ($\phi_{ideal}[1]=0°$) is compensated in two stages, including the coarse calibration stage (STG1b) described in FIGS. 16A, 16B, 16C, 17, 18, 19, and the fine calibration stage (STG1c) described in FIGS. 20A, 20B, 20C, 21A, 21B, 22A, 22B, 23.

Figure 16A:
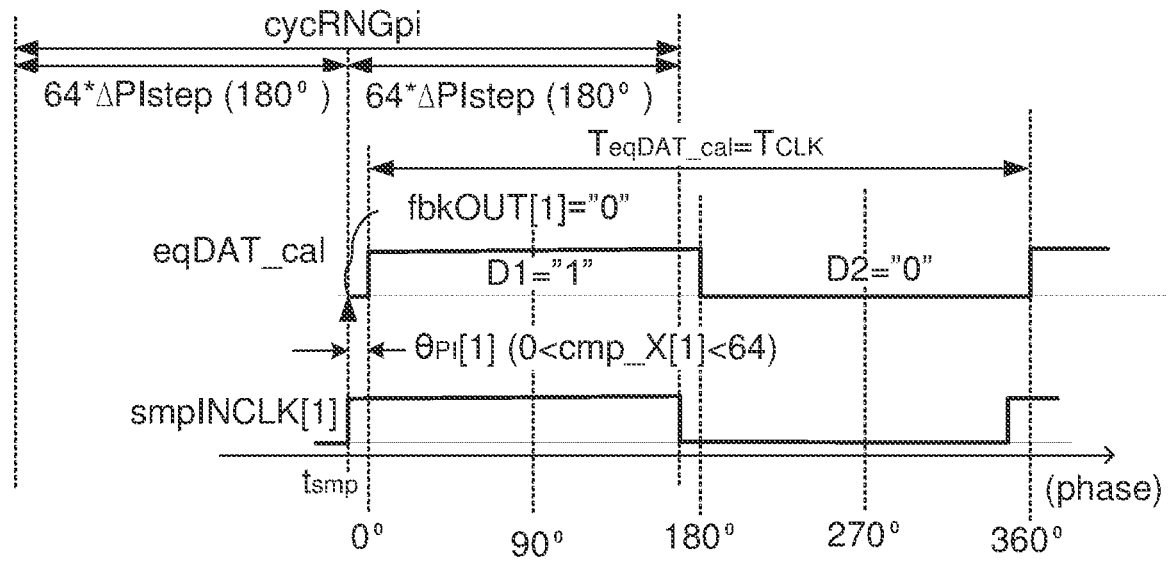
FIGS. 16A, 16B, and 16C are waveform diagrams illustrating different timing relationships between the "0→1" transition of the equalized data signal (eqDAT) and the rising edge of the sampler-input clock (smpINCLK[r]).
Figure 16B:
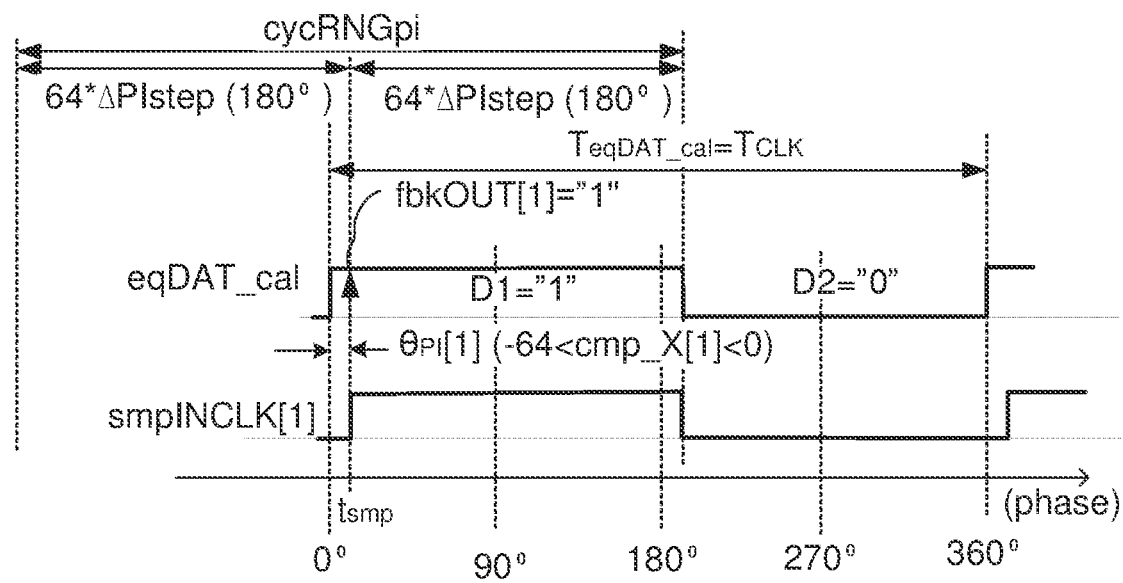
Figure 16C:
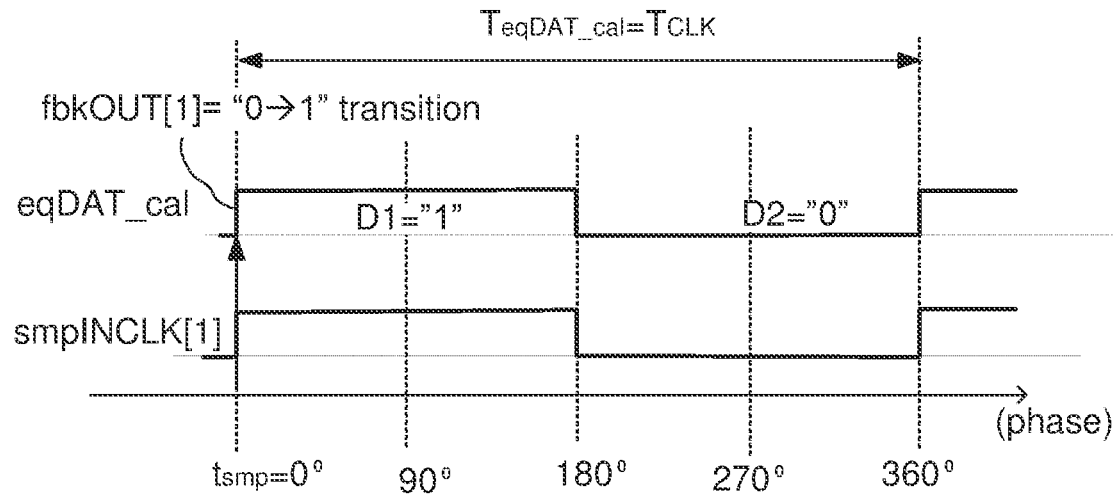

FIGS. 16A, 16B, and 16C are waveform diagrams illustrating different timing relationships between the "0→1" transition of the equalized data signal (eqDAT) and the rising edge of the sampler-input clock (smpINCLK[1]). FIGS. 16A, 16B, and 16C respectively represent that the rising edge of the sampler-input clock smpINCLK[1] leads, lags, and aligns with the "0→1" transition of the calibration mode equalized data signal (eqDAT_cal). In FIGS. 16A, 16B, 16C, the time point when the sampler-input clock (smpINCLK[1]) rises is defined as a sampling time point ($t_{smp}$). The sampling time point ($t_{smp}$) can be considered as the center of the cyclic PI code range (cycRNGpi) corresponding to the PI[1].

In FIG. 16A, when the sampling time point $t_{smp}$ is ahead of the "0→1" transition of the calibration mode equalized data signal (eqDAT_cal), the feedback output (fbkOUT[1]) is equivalent to "0". Under such a circumstance, the sampling time point ($t_{smp}$) should be shifted backward, and the PI code of PI[1] should be increased. The PI code increment of PI[1] is defined as a compensation PI code (cmp_X[1]), and a phase increment corresponding to the compensation PI code (cmp_X[1]) is defined as a PI compensation phase ($\theta_{PI}[1]$). Then, the upper half (0~64) of the cyclic PI code range (cycRNGpi) is swept until the time point when the feedback output (fbkOUT[1]) indicates that the sampling time point ($t_{smp}$) aligns with the "0→1" transition of the calibration mode equalized data signal (eqDAT_cal).

In FIG. 16B, when the sampling time point ($t_{smp}$) is behind the "0→1" transition of the calibration mode equalized data signal (eqDAT_cal), the feedback output (fbkOUT [1]) is equivalent to "1". Under such a circumstance, the sampling time point ($t_{smp}$) should be shifted forward, and the PI code of PI[1] should be decreased. The PI code decrement of PI[1] is defined as a compensation PI code (cmp_X[1]), and a phase decrement corresponding to the compensation PI code (cmp_X[1]) is defined as a PI compensation phase ($\theta_{PI}[1]$). Then, the lower half (−64~0) of the cyclic PI code range (cycRNGpi) is swept until the time point when the feedback output (fbkOUT[1]) indicates that the sampling time point ($t_{smp}$) aligns with the "0→1" transition of the calibration mode equalized data signal (eqDAT_cal).

In FIG. 16C, when the sampling time point ($t_{smp}$) is aligned with the "0→1" transition of the calibration mode equalized data signal (eqDAT_cal), the feedback output (fbkOUT[1]) is in transition. Thus, the transition state of the feedback output (fbkOUT[1]) can represent that the sampling time point ($t_{smp}$) aligns with the "0→1" transition of the calibration mode equalized data signal (eqDAT_cal).

Figure 17:
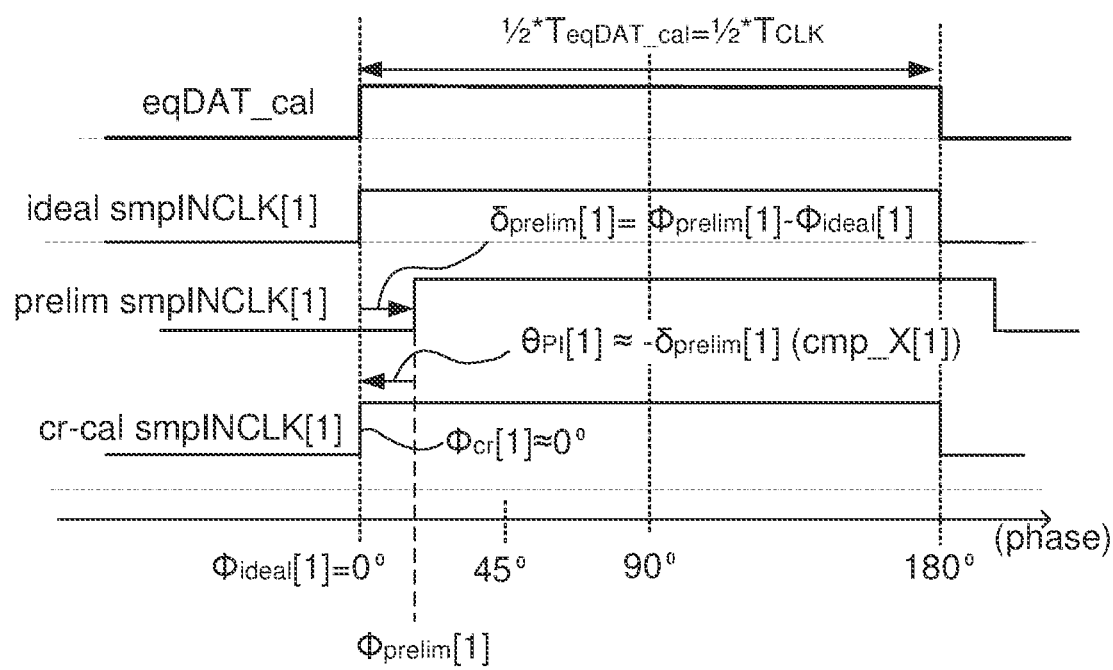
FIG. 17 is a waveform diagram illustrating the generation of the coarse-calibrated sampler-input clock (cr-cal smpIN-CLK[1]).
Figure 18:
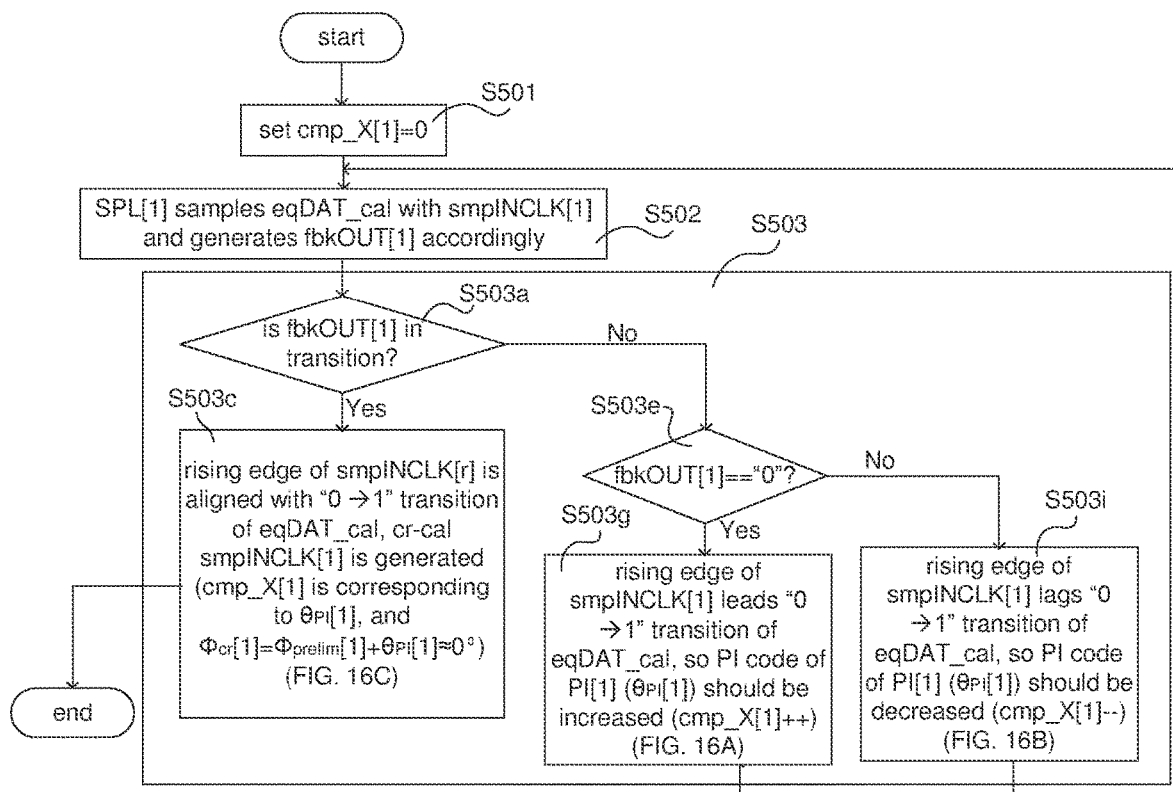
FIG. 18 is a flow diagram illustrating the coarse calibration stage (STG1b) corresponding to the PI[1].

As illustrated in FIGS. 16A-16C, the PI setting component 373a knows that the sampling time point $t_{smp}$ is ahead of the "0→1" transition of the calibration mode equalized data signal (eqDAT_cal) based on the feedback output (fbkOUT[1]) with a "0" state (fbkOUT[1]="0") (see FIG. 16A), the sampling time point ($t_{smp}$) is behind the "0→1" transition of the calibration mode equalized data signal (eqDAT_cal) based on the feedback output (fbkOUT[1]) with a "1" state (fbkOUT[1]="1") (see FIG. 16B), and the sampling time point ($t_{smp}$) is aligned with the "0→1" transition of the calibration mode equalized data signal (eqDAT_cal) based on the feedback output (fbkOUT[1] with a transition state (fbkOUT[1]="0→1" transition) (see FIG. 16C). Furthermore, based on the state of the feedback output (fbkOUT[1]), the PI setting component 373a can recognize the phase relationship and change the phase relationship between the calibration mode equalized data signal (eqDAT_cal) and the preliminary sampler-input clock (prelim smpINCLK[1]) by adjusting the PI code of PI[1]. FIGS. 17 and 18 demonstrate that the coarse calibration stage (STG1b) is proceeded based on the conclusions of FIGS. 16A-16C.

Please note that, in FIGS. 16A, 16B, and 16C, it is assumed that the sampling time point ($t_{smp}$) is close to the "0→1" transition of the calibration mode equalized data signal (eqDAT_cal). Whereas, it is possible to determine the phase relationship between the sampler-input clock (smpINCLK[1]) and the calibration mode equalized data signal (eqDAT_cal) when the sampling time point $t_{smp}$ is close to the "1→0" transition of the calibration mode equalized data signal (eqDAT_cal). In such a case, the determination made based on the feedback output (fbkOUT[1]) should be modified accordingly.

FIG. 17 is a waveform diagram illustrating the generation of the coarse-calibrated sampler-input clock (cr-cal smpINCLK[1]). In FIG. 17, the rising edge of the ideal sampler input clock (ideal smpINCLK[1]) is aligned with the "0→1" transition of the calibration mode equalized data signal (eqDAT_cal). That is, $\phi_{ideal}[1]=0°$. Whereas the rising edge of the preset sampler-input clock (smpINCLK[1]) is behind the "0→1" transition of the calibration mode equalized data signal (eqDAT_cal). In the specification, the phase difference between the preliminary phase ($\phi_{prelim}[1]$) and the ideal phase ($\phi_{ideal}[1]$) is defined as a route-specific phase error $\delta_{prelim}[1]=\phi_{prelim}[1]-\phi_{ideal}[1]$.

In FIG. 17, the relationship between the preliminary sampler-input clock (prelim smpINCLK[1]) and the calibration mode equalized data signal (eqDAT_cal) is similar to the ones in FIG. 16B. Therefore, the PI setting component 373a is aware that the compensation PI code (cmp_X[1]) should be decreased. The compensation PI code (cmp_X[1]) is gradually decreased until its corresponding PI compensation phase ($\theta_{PI}[1]$) is close to an inversed route-specific phase error ($\delta_{prelim}[1]$). That is, $\theta_{PI}[1]\approx-\delta_{prelim}[1]=-(\phi_{prelim}[1]-\phi_{ideal}[1])$. The acquiring procedure of the compensation PI code (cmp_X[1]) is illustrated in FIG. 18. By the end of the coarse calibration stage (STG1b), the coarse-calibrated phase ($\phi_{cr}[1]$), being equivalent to the summation of the preliminary phase ($\phi_{prelim}[1]$) and the PI compensation phase ($\theta_{PI}[1]$), is generated. That is, $\phi_{cr}[1]=\phi_{prelim}[1]+\theta_{PI}[1]$.

FIG. 18 is a flow diagram illustrating the coarse calibration stage (STG1b) corresponding to the PI[1]. Firstly, the compensation PI code (cmp_X[1]) is initialized to 0 (step S501). Then, the SPL[1] samples the calibration mode equalized data signal (eqDAT_cal) with the preliminary sampler-input clock (prelim smpINCLK[1]) and generates the feedback output (fbkOUT[1]) accordingly (step S502). Based on the feedback output (fbkOUT[1]), the PI setting component 373a selectively modifies the PI code of the PI[1] (step S503).

Step S503 further includes the following steps. The PI setting component 373a determines whether the feedback output (fbkOUT[1]) is in transition (step S503a). If the determination result of step S503a is positive, the PI setting component 373a confirms that the rising edge of the sampler-input clock (smpINCLK[1]) is aligned with "0→1" transition of the calibration mode equalized data signal (eqDAT_cal) (see FIG. 16C), and the coarse-calibrated sampler-input clock (cr-cal smpINCLK[1]) is generated (step S503c), and the flow ends. When the flow ends, the value of the compensation PI code (cmp_X[1]) corresponds to the PI compensation phase ($\theta_{PI}[1]$).

If the determination result of step S503a is negative, the PI setting component 373a determines whether the feedback output (fbkOUT[1]) is equivalent to "0" (step S503e).

If the determination result of step S503e is positive, the PI setting component 373a knows that the rising edge of the sampler-input clock (smpINCLK[1]) leads to the "0→1" transition of the calibration mode equalized data signal (eqDAT_cal) (see FIG. 16A). Then, the PI setting component 373a increases the compensation PI code of the PI[1] (cmp_X[1]++) (step S503g), and step S502 is performed again.

If the determination result of step S503e is negative, the PI setting component 373a knows that the rising edge of the sampler-input clock (smpINCLK[1]) lags the "0→1" transition of the calibration mode equalized data signal (eqDAT_cal) (see FIG. 16B). Then, the PI setting component 373a decreases the compensation PI code of the PI[1] (cmp_X[1]--) (step S503i), and step S502 is performed again.

FIG. 19 is a schematic diagram illustrating signals related to the clock generation circuit (clkGenCKT[1]) at the coarse calibration stage (STG1b). At the coarse calibration stage (STG1b), the PI code of the PI[1] 511 is set to be equivalent to the summation of the preliminary PI code (prelimPICD) and the compensation PI code (cmp_X[1]) (prelimPICD+cmp_X[1]), and the PC code of the PC[1] remains to be equivalent to the default PC code (dfltPCCD).

The coarse-calibrated phase ($\phi_{cr}[1]$) is equivalent to the summation of the preliminary phase ($\phi_{prelim}[1]$) and the PI compensation phase ($\theta_{PI}[1]$). That is, $\phi_{cr}[1]=\phi_{prelim}[1]+\theta_{PI}[1]$. Moreover, confined to the phase precision of the PI[1], there is still a minor phase difference between the coarse-calibrated phase ($\phi_{cr}[1]$) and the ideal phase ($\phi_{ideal}[1]$). That is, $\phi_{cr}[1]=\phi_{prelim}[1]+\theta_{PI}[1]\approx0°$. Later, the minor phase difference is further eliminated by the PC[1] during the fine calibration stage (STG1c).

Figure 20A:
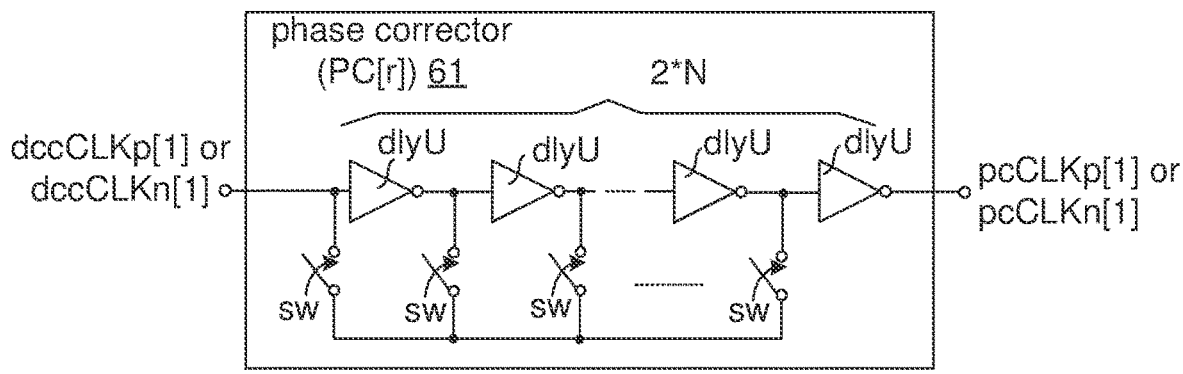
FIG. 20A is a schematic diagram illustrating the exemplary design of the PC[1].

FIG. 20A is a schematic diagram illustrating the exemplary design of the PC[1]. The PC[1]~PC[4] are implemented with the same design. The PC[1] receives one of the positive duty cycle corrected clock (dccCLKp[1]) and the negative duty cycle corrected clock (dccCLKn[1]) and outputs one of the positive phase-corrected clock (pcCLKp[1]) and the negative phase-corrected clock (pcCLKn[1]). The PC[1] includes 2*N delay units (dlyU) and 2*N switches (sw). Each delay unit (dlyU) has a delay interval ($\Delta T_{dlyU}$). The range of the PC code of PC[1] corresponds to the number of the delay units. Thus, the PC code PC[1] ranges 0~2*N.

The switching statuses of the switches sw are controlled by the PC calibration signal ($S_{PC}[1]$). Depending on the switching statuses of the switches (sw), the delay duration between the input and the output of the PC[1] 61 can be adjusted. The more switches (sw) are turned on, the more delay units (dlyU) are enabled, and the longer the delay time that the PC[1] 61 provides to the sampler-input clock (smpINCLK[1]).

Figure 20B:
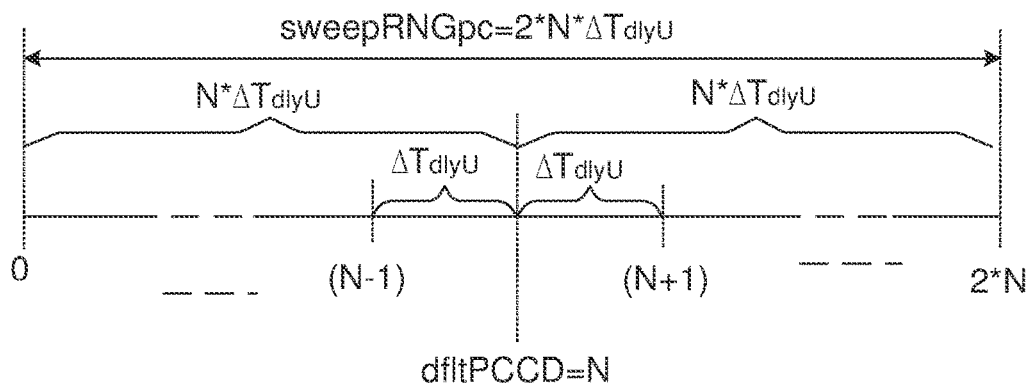
FIG. 20B is a schematic diagram illustrating the relationship between the delay interval ($\Delta T_{dlyU}$) and the PC sweep range (sweepRNGpc).

To cover the variation in delays between components and the inaccuracy in the coarse calibration stage (STG1b), a PC sweep range (sweepRNGpc), representing a phase range that the PC[1] can calibrate, is defined. FIG. 20B is a schematic diagram illustrating the relationship between the delay interval ($\Delta T_{dlyU}$) and the PC sweep range (sweepRNGpc). The PC sweep range (sweepRNGpc) is divided into 2*N delay intervals ($\Delta T_{dlyU}$). That is, sweepRNGpc=2*N*$\Delta T_{dlyU}$.

Ideally, the PC sweep range (sweepRNGpc) may be equivalent to 1 PI step (sweepRNGpc=ΔPIstep). Whereas the PC sweep range (sweepRNGpc) is preferred to be greater than 1 PI step (sweepRNGpc>ΔPIstep) to accommodate the inaccuracy in the coarse calibration stage (STG1b). For example, it can be assumed that sweepRNGpc=2*ΔPIstep, or sweepRNGpc=3*ΔPIstep. In practical application, the PC sweep range (sweepRNGpc) is unnecessary to be an integer multiple of the interpolator-steps (ΔPIstep).

In FIG. 20B, the minimum PC code of the PC[1] is equivalent to 0, and the maximum PC code of the PC[1] is equivalent to 2*N. As locking of the PI code of the PI[1] and the signal propagation between the PI[1] and the SPL[1] may bring an extra delay, the default PC code (dfltPCCD) of the PC[1] is initialized to the middle PC code (dfltPCCD=N) to ensure that the delay provided by the PC[1] can be decreased to compensate such extra delay. In short, by setting the default PC code (dfltPCCD) as the middle PC code (dfltPCCD=N), the PC[1] could have flexible tolerance for phase adjustment.

Figure 20C:
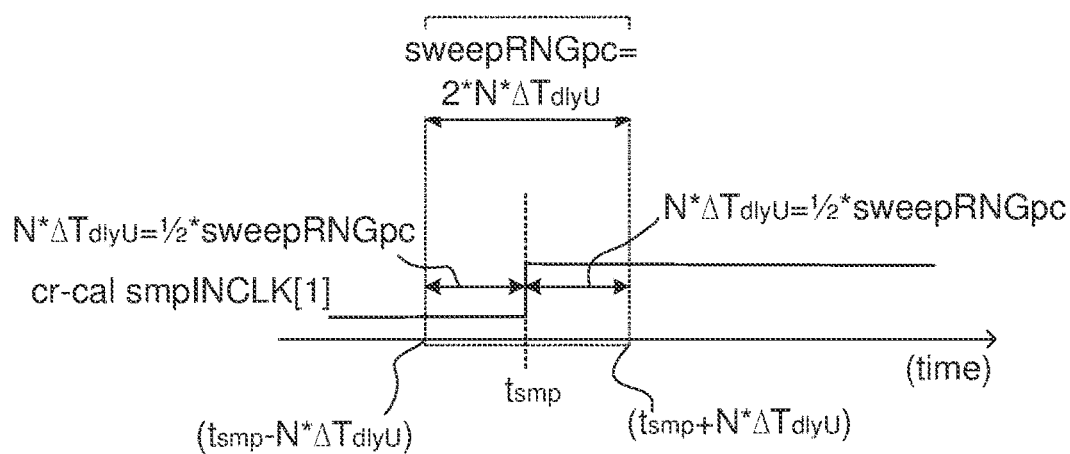
FIG. 20C is a schematic diagram illustrating that the sampling time point ($t_{smp}$) and the PC sweep range (sweepRNGpc) are defined based on the rising edge of the coarse-calibrated sampler-input clock (cr-cal smpINCLK[1]).

FIG. 20C is a schematic diagram illustrating that the sampling time point ($t_{smp}$) and the PC sweep range (sweepRNGpc) are defined based on the rising edge of the coarse-calibrated sampler-input clock (cr-cal smpINCLK[1]). At the beginning of the fine calibration stage (STG1c), the SPL[1] samples the calibration mode equalized data signal (eqDAT_cal) with the coarse-calibrated sampler-input clock (cr-cal smpINCLK[1]). Thus, a sampling time point ($t_{smp}$) representing the timepoint corresponding to the rising edge of the coarse-calibrated sampler-input clock (cr-cal smpINCLK[1]) is defined. The sampling time point ($t_{smp}$) is considered as the center of the PC sweep range (sweepRNGpc), and the PC sweep range (sweepRNGpc) being scanned during the fine calibration stage (STG1c) covers from the time point ($t_{smp}$-N*$\Delta T_{dlyU}$) to the time point ($t_{smp}$+N*$\Delta T_{dlyU}$). The change amount of the PC code of the PC[1] during the sweeping procedure is defined as a compensation PC code (cmp_Y[1]), and the sampler-input clock (cr-cal smpINCLK[1]) generated during the fine calibration stage (STG1c) is defined as a testing sampler-input clock (tst smpINCLK[1]). The testing sampler-input clocks (tst smpINCLK[1]) are repetitively generated in response to different values of the compensation PC code (cmp_Y[1]). Therefore, the time point ($t_{smp}$-N*$\Delta T_{dlyU}$) corresponds to the minimum value of the compensation PC code (cmp_Y[1]=-N), and the time point ($t_{smp}$+N*$\Delta T_{dlyU}$) corresponds to the maximum value of the compensation PC code (cmp_Y[1]=N).

After the coarse calibration stage (STG1b), the sampling time point ($t_{smp}$) is very close to the "0→1" transition of the calibration mode equalized data signal (eqDAT_cal). However, there is still a minor phase error between the coarse-calibrated sampler-input phase ($\phi_{cr}$[1]) and the ideal phase ($\phi_{ideal}$[1]=0) ($\phi_{cr}$[1]≠$\phi_{ideal}$[1]=0°). Therefore, the minor phase difference is eliminated by gradually adjusting the number of the enabled delay units (dlyU).

Figure 21A:
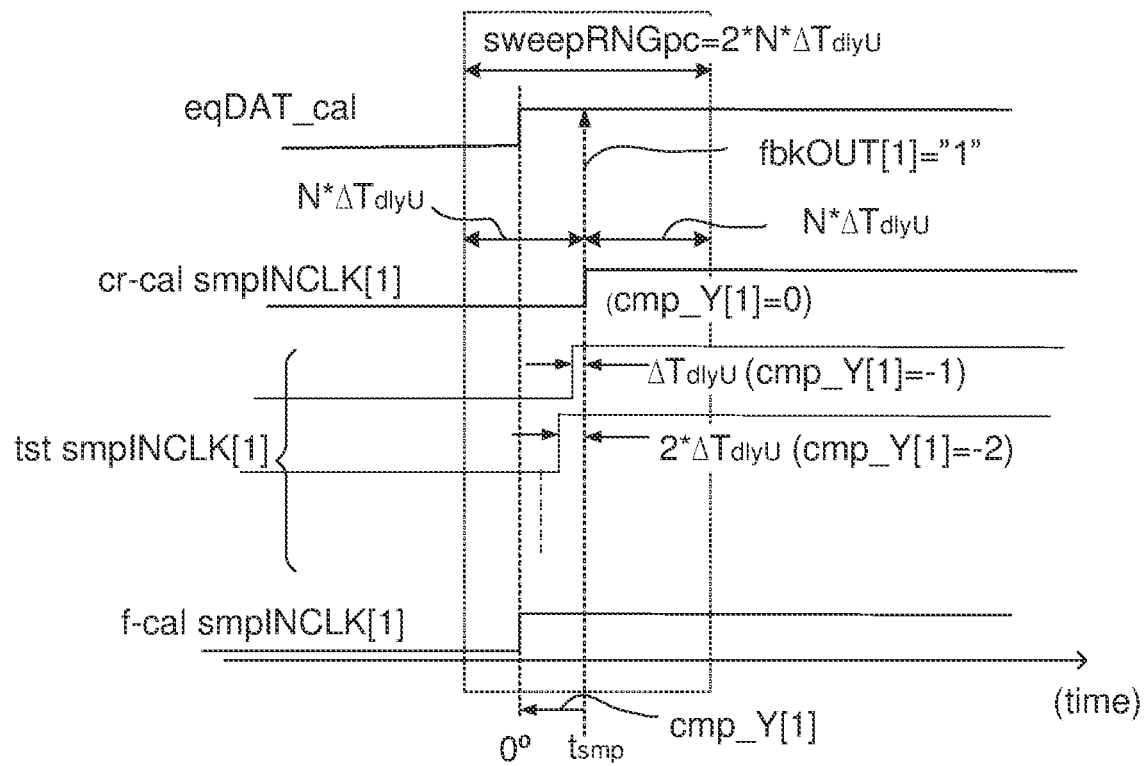
FIGS. 21A and 21B are schematic diagrams illustrating the adjustment of the PC code of the PC[1] at the fine calibration stage (STG1c).
Figure 21B:
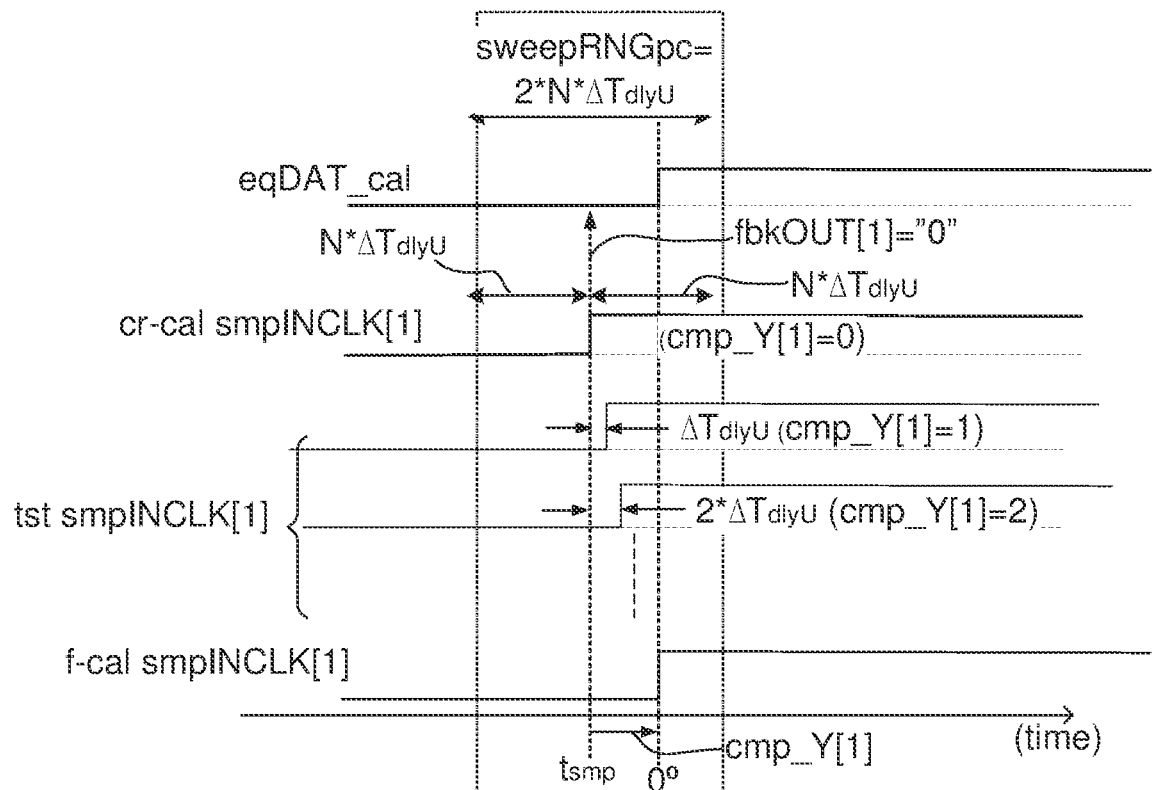

FIGS. 21A and 21B are schematic diagrams illustrating the adjustment of the PC code of the PC[1] at the fine calibration stage (STG1c). FIG. 21A represents the scenario when the sampling time point ($t_{smp}$) is after the "0→1" transition of the calibration mode equalized data signal (eqDAT_cal); and FIG. 21B represents the scenario when the sampling time point ($t_{smp}$) is before the "0→1" transition of the calibration mode equalized data signal (eqDAT_cal).

In FIG. 21A, when the sampling time point ($t_{smp}$) is behind the "0→1" transition of the calibration mode equalized data signal (eqDAT_cal), the PC codes of the PC[1] corresponding to the smaller half part (($t_{smp}$-1/2*sweepRNGpc)~$t_{smp}$) of the PC sweep range (sweepRNGpc) are alternatively selected and repetitively tested, and several (for example, M) testing sampler-input clocks (tst smpINCLK[1]) are generated accordingly.

In FIG. 21B, when the sampling time point ($t_{smp}$) is ahead of the "0→1" transition of the calibration mode equalized data signal (eqDAT_cal), the PC codes of the PC[1] corresponding to the greater half part ($t_{smp}$~($t_{smp}$+1/2*sweepRNGpc)) of the PC sweep range (sweepRNGpc) are alternatively selected and repetitively tested, and several (for example, M) testing sampler-input clocks (tst smpINCLK[1]) are generated accordingly.

In FIGS. 21A and 21B, whenever a value of the compensation PC code (cmp_Y[1]) is set, M cycles of the testing sampler input clocks (tst smpINCLK[1]) should be generated to determine the phase relationship between the rising edge of the testing sampler-input clocks (tst smpINCLK[1]) and the calibration mode equalized data signal (eqDAT_cal). Alternatively speaking, the SPL[1] needs to repeatedly sample the calibration mode equalized data signal (eqDAT_cal) with the same testing sampler-input clock (tst smpINCLK[1]) for M cycles so that M sampled results are generated. Then, before the edge detection component 373e determines which of the sampling time point ($t_{smp}$) and the "0→1" transition of the calibration mode equalized data signal (eqDAT_cal) is earlier based on the M sampled results.

After the M cycles, M feedback outputs (fbkOUT[1]) are generated. Among the M feedback outputs (fbkOUT[1]), the number of the feedback output fbkOUT[1] equivalent to "0" (fbkOUT[1]="0") (that is, an accumulated counting parameter CNT_0), and the number of the feedback output fbkOUT[1] equivalent to "1" (fbkOUT[1]="1") (that is, an accumulated counting parameter CNT_1) are respectively counted. Then, the accumulated counting parameters (CNT_0, CNT_1) are compared. The summation of the accumulated counting parameters (CNT_0, CNT_1) is equivalent to M (CNT_0+CNT_1=M).

According to FIG. 21A, the feedback output (fbkOUT[1]) should be equivalent to "1" when the sampling time point $t_{smp}$ is after the "0→1" transition of the calibration mode equalized data signal (eqDAT_cal). Thus, when the accumulated counting parameter CNT_0 is smaller than the accumulated counting parameter CNT_1 (CNT_0>CNT_1), the edge detection component 373e confirms that in the majority of the M cycles, the sampling time point $t_{smp}$ is behind the "0→1" transition of the calibration mode equalized data signal (eqDAT_cal). Accordingly, the PC setting component 373c should gradually decrease the number of the enabled delay units (dlyU) to shift the sampling time point ($t_{smp}$) forward. In FIG. 21A, a compensation PC code (cmp_Y[1]) is gradually decreased until the edge detection component 373e confirms that the accumulated counting parameters CNT_0, CNT_1 are equivalent (CNT_0=CNT_1).

On the other hand, according to FIG. 21B, the feedback output (fbkOUT[1]) should be equivalent to "0" when the sampling time point $t_{smp}$ is before the "0→1" transition of the calibration mode equalized data signal (eqDAT_cal). Thus, when the accumulated counting parameter CNT_0 is greater than the accumulated counting parameter CNT_1 (CNT_0>CNT_1), the edge detection component 373e confirms that in the majority of the M cycles, the sampling time point $t_{smp}$ is ahead of the "0→1" transition of the calibration mode equalized data signal (eqDAT_cal). Accordingly, PC setting component 373c should gradually increase the number of the enabled delay units (dlyU) to shift the sampling time point ($t_{smp}$) backward. In FIG. 21B, the compensation PC code (cmp_Y[1]) is gradually increased until the edge detection component 373e confirms that the accumulated counting parameters CNT_0, CNT_1 are equivalent (CNT_0=CNT_1).

As the adjustment of the number of the delay units (dlyU) is based on which of the accumulated counting parameters (CNT_0, CNT1) has a greater value, such determination procedure is defined as a majority vote approach. Each time, when the compensation PC code (cmp_Y[1]) is adjusted/updated, the testing sampler-input clock (tst smpINCLK[1]) is repetitively generated for M cycles, and the calibration mode equalized data signal (eqDAT_cal) is repetitively sampled for M times. The majority vote approach is applied again and again until the PC setting component 373c confirms that the rising edge of the testing sampler-input clock (tst smpINCLK[1]) is aligned with the "0→1" transition of the calibration mode equalized data signal (eqDAT_cal). Then, the testing sampler-input clock (tst smpINCLK[1]), whose rising edge is aligned with the "0→1" transition of the calibration mode equalized data signal (eqDAT_cal), is defined as the fine-calibrated sampler-input clock (f-cal smpINCLK[1]). The fine-calibrated phase ($\phi_f[1]$) is equivalent to the ideal phase ($\phi_{ideal}[1]=0°$). More details about the fine calibration stage (STG1c) can be referred to FIGS. 22A and 22B.

Figure 22A:
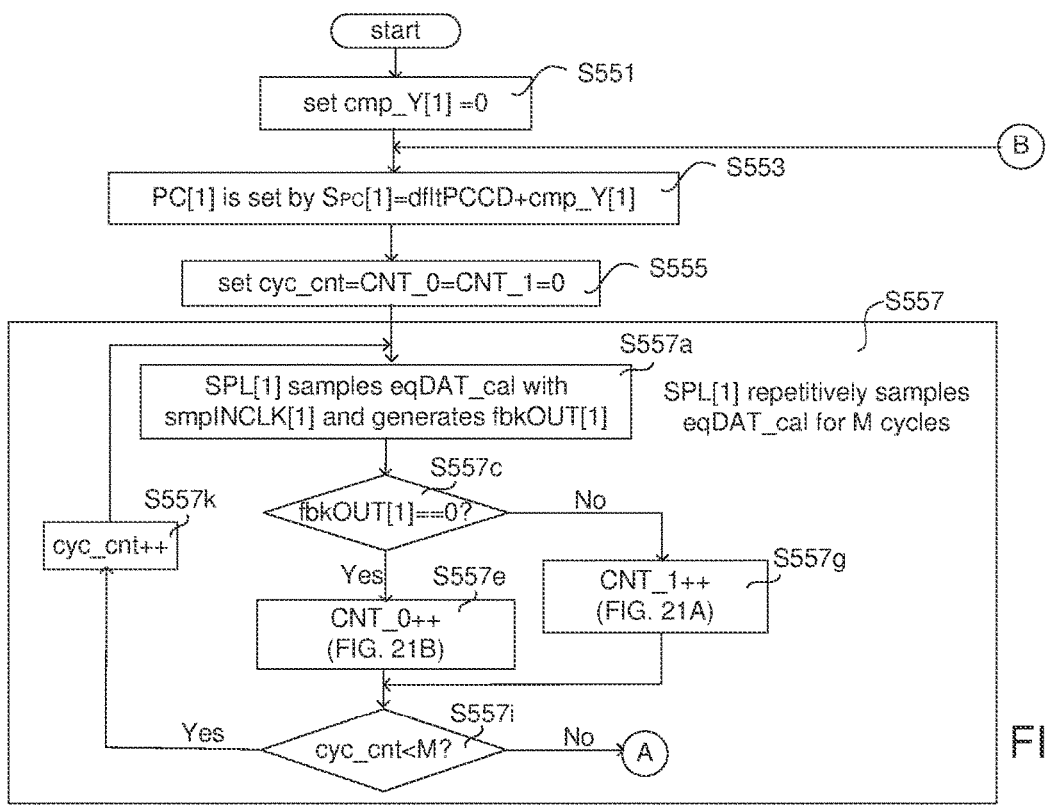
FIGS. 22A and 22B are flow diagrams illustrating the fine calibration stage (STG1c) corresponding to the clock generation circuit (clkGenCKT[1]).
Figure 22B:
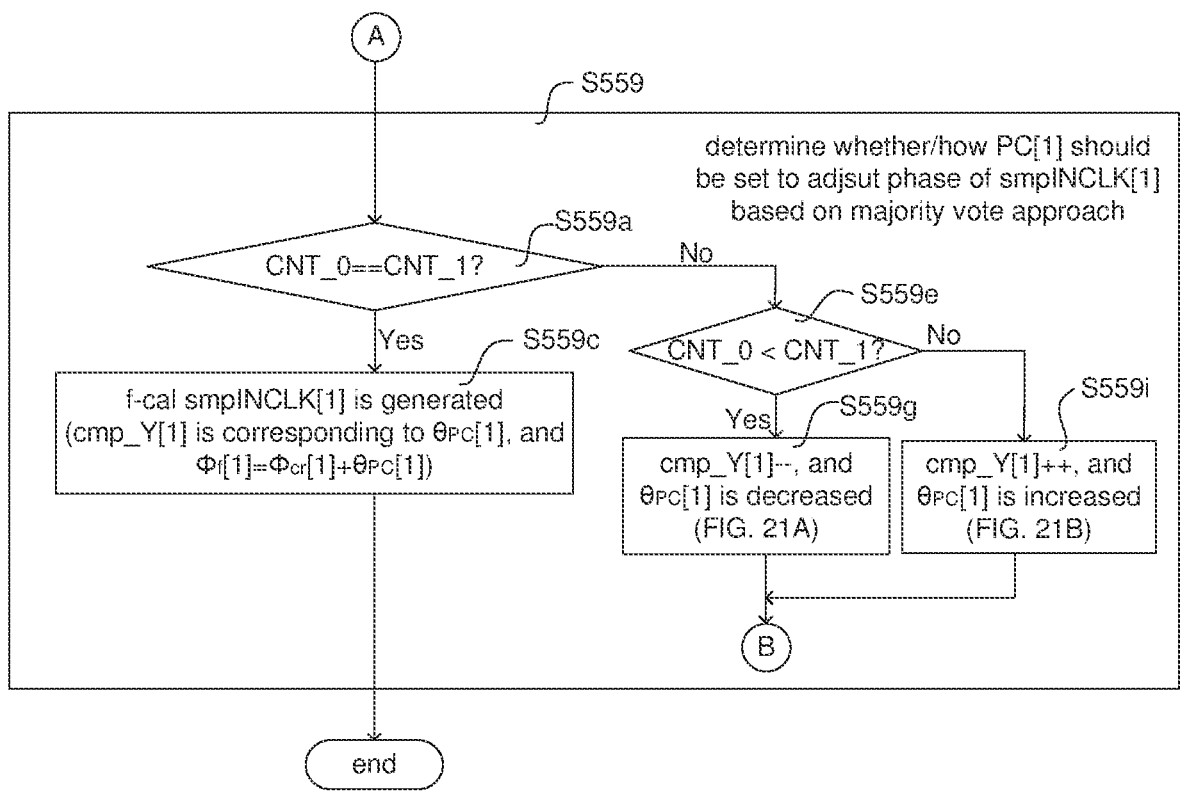

FIGS. 22A and 22B are flow diagrams illustrating the fine calibration stage (STG1c) corresponding to the clock generation circuit (clkGenCKT[1]). Please refer to FIGS. 9, 21A, 21B, 22A, and 22B together.

Firstly, the PC setting component 373c initializes the compensation PC code (cmp_Y[1]=0) (step S551), and the PC setting component 373c sets the PC code of the PC[1] as the summation of the default PC code (dfltPCCD) and the compensation PC code (cmp_Y[1]), that is, ($S_{PC}[1]$=dfltPCCD+cmp_Y[1]) (step S553). Then, the edge detection component 373e initializes a cycle count parameter (cyc_cnt) and accumulated counting parameters (CNT_0, CNT_1) with 0 (cyc_cnt=CNT_0=CNT_1=0) (step S555). After initialization, the SPL[1] 38a starts to repetitively samples the calibration mode equalized data signal (eqDAT_cal) with the sampler-input clock (smpINCLK[1]) for M cycles (step S557). The cycle count parameter (cyc_cnt) is increased by 1 in every cycle, and the edge detection component 373e repetitively receives the feedback output (fbkOUT[1]) from the SPL[1] 38a during the M cycles. The variable M is a predefined positive integer, for example, M=1000. The accumulated counting parameters (CNT_0, CNT_1) are respectively accumulated during the M cycles, depending on the state of the feedback output (fbkOUT[1]). After the M cycles passed, the accumulated counting parameters (CNT_0, CNT_1) are compared to determine whether the compensation PC code (cmp_Y[1]) should be increased or decreased (step S559).

Step S557 further includes the following steps. The SPL[1] 38a samples the calibration mode equalized data signal (eqDAT_cal) with the sampler-input clock (smpINCLK[1]) and generates the feedback output (fbkOUT[1]) (step S557a). Then, depending on the value of the feedback output (fbkOUT[1]) (step S557c), the edge detection component 373e counts up one of the accumulated counting parameters (CNT_0, CNT_1). If the feedback output (fbkOUT[1]) is equivalent to "0", the accumulated counting parameter (CNT_0) is increased by 1 (step S557e). If the feedback output (fbkOUT[1]) is equivalent to "1", the accumulated counting parameter (CNT_1) is increased by 1 (step S557g). Later, the edge detection component 373e checks if the M cycles have passed (step S557i). If step S557 has been performed for M times, step S559 is performed. Otherwise, the cycle count parameter (cyc_cnt) is added by 1 (cyc_cnt++) (step S557k) and step S557 is repeatedly performed.

In a case that the rising edge of the testing sampler-input clock (tst smpINCLK[1]) is precisely aligned with the "0→1" transition of the calibration mode equalized data signal (eqDAT_cal), the probability of the feedback output fbkOUT[1]="0" is equivalent to the probability of the feedback output fbkOUT[1]="1". Accordingly, if the accumulated counting parameter (CNT_0) and the accumulated counting parameter (CNT_1) are equivalent (CNT_0=CNT_1=M/2), it implies that the rising edge of the testing sampler-input clock (tst smpINCLK[1]) is precisely aligned with the "0→1" transition of the calibration mode equalized data signal (eqDAT_cal), and the sampler-input clock (smpINCLK[1]) no longer needs further calibration. Thus, it can be confirmed that the target of acquiring the fine-calibrated sampler-input clock (f-cal smpINCLK[1]) has been achieved. Therefore, if the determination result of step S559a is positive, the edge detection component 373e generates the equivalent signal ($S_{equiv}$) to the PC setting component 373c to indicate that the fine calibration stage (STG1c) ends. Then, the PC setting component 373c generates the PC calibration signal ($S_{PC}[1]$=dfltPCCD+cmp_Y[1]) to set the PC[1], and the fine-calibrated sampler-input clock (f-cal smpINCLK[1]) is generated accordingly.

On the other hand, if the determination result of step S559a is negative, the edge detection component 373e further determines which of the accumulated counting parameter (CNT_0) and the accumulated counting parameter (CNT_1) is greater (step S559e).

If the edge detection component 373e determines that the accumulated counting parameter (CNT_0) is smaller than the accumulated counting parameter (CNT_1) (CNT_0<CNT_1), the edge detection component 373e generates the counting comparison signal ($S_{cmpN}$=1) to the PC setting component 373c. Accordingly, the PC setting component 373c is aware that the current sampling time point ($t_{smp}$) lags the "0→1" transition of the calibration mode equalized data signal (eqDAT_cal) (see FIG. 21A). To shift the sampling time point ($t_{smp}$) forward, the PC setting component 373c should decrease the compensation PC code (cmp_Y[1]) by 1 (cmp_Y[1]--) (step S559g), and steps S553, S555, S557 are performed again to another testing sampler-input clock (tst smpINCLK[1]) based on the updated compensation PC code (cmp_Y[1]).

If the edge detection component 373e determines that the accumulated counting parameter (CNT_0) is greater than the accumulated counting parameter (CNT_1) (CNT_0>CNT_1), the edge detection component 373e generates the counting comparison signal ($S_{cmpN}$=0) to the PC setting component 373c. Accordingly, the PC setting component 373c is aware that the current sampling time point ($t_{smp}$) leads the "0→1" transition of the calibration mode equalized data signal (eqDAT_cal) (see FIG. 21B). To shift the sampling time point ($t_{smp}$) backward, the PC setting component 373c should increase the compensation PC code (cmp_Y[1]) by 1 (that is, cmp_Y[1]++) (step S559i), and steps S553, S555, S557 are performed again to another testing sampler-input clock (tst smpINCLK[1]) based on the updated compensation PC code (cmp_Y[1]).

By the end of the fine calibration stage (STG1c), the phase setting of the PC[1] is collectively determined by the default PC code (dfltPCCD) and the compensation PC code (cmp_Y[1]). Therefore, the fine-calibrated phase ($\phi_f[1]$) is equivalent to the summation of the coarse-calibrated phase ($\phi_{cr}[1]$) and the PC compensation phase ($\theta_{PC}[1]$). That is, $\phi_f[1]$=$\phi_{cr}[1]$+$\theta_{PC}[1]$.

Please note that, in FIGS. 21A, 21B, 22A, and 22B, it is assumed that the sampling time point ($t_{smp}$) is close to the "0→1" transition of the calibration mode equalized data signal (eqDAT_cal). In the case that the sampling time point ($t_{smp}$) is close to the "1→0" transition of the calibration mode equalized data signal (eqDAT_cal), the determination bases of the majority vote approach will be different, and the operations regarding how the PC[1] should be calibrated needs to be modified as well. Details about such a scenario are omitted.

FIG. 23 is a schematic diagram illustrating signals related to the clock generation circuit (clkGenCKT[1]) at the fine calibration stage (STG1c). At the fine calibration stage (STG1c), the PI code of the PI[1] 511 remains the same as the coarse calibration stage (STG1c), and the PC code of the PC[1] is equivalent to the summation of the default PC code (dfltPCCD) and the compensation PC code (cmp_Y[1]). That is, dfltPCCD+cmp_Y[1]. Accordingly, the fine-calibrated phase (($\phi_f[1]$) is equivalent to the summation of the coarse-calibrated phase ($\phi_{cr}[1]$) and the PC compensation phase ($\theta_{PC}[1]$). Moreover, the fine-calibrated phase ($\phi_f[1]$) is equivalent to 0°. That is, $\phi_f[1]$=$\phi_{cr}[1]$+$\theta_{PC}[1]$=0°.

By the end of the fine calibration stage (STG1c), the PI code of the P[1] is defined as a calibrated PI code (cal_PICD[1]), and the PC code of the PC[1] is defined as a calibrated PC code (cal_PCCD[1]). The calibrated PI code (cal_PICD[1]) and the calibrated PC code (cal_PCCD[1]) are stored and utilized later in the normal mode (M2).

Table 6 briefly compares the settings of PI[1] and PC[1] in different stages of the non-shifted phase-calibration procedure (r=1). Details of Table 6 can be referred to as FIGS. 15~23.

TABLE 6

| clkGenCKT[1] | PI code of PI[1] | PC code of PC[1] | phase of smplNCLK[1] |
|---|---|---|---|
| initial stage (STG1a) FIG. 15 | prelimPICD | dfltPCCD | $\Phi_{prelim}[1]$ |
| coarse calibration stage (STG1b) FIG. 19 | prelimPICD + cmp_X[1] | | $\Phi_{cr}[1] = \Phi_{prelim}[1] + \theta_{PI}[1] \approx 0°$ |
| fine calibration stage (STG1c) FIG. 23 | | dfltPCCD + cmp_Y[1] | $\Phi_f[1] = \Phi_{cr}[1] + \theta_{PC}[1] = 0°$ |

As illustrated in FIG. 12, the non-shifted phase-calibration procedure is performed to r=1, and the shifted calibration procedure is performed to r=2~R. Below, FIGS. 24A~28 demonstrate the shifted phase-calibration procedure (for r=2~R).

In FIGS. 24A, 24B, 28A, 28B, and 28C, block diagrams showing the clock generation circuit clkGenCKT[r] (r=2~R) 71 with different settings at different stages are provided. In these figures, the clock generation circuit clkGenCKT[r] 71 includes the PI[r] 711, the DCC[r] 713, and the PC[r] 715. The clock generation circuit (clkGenCKT[r]) 71 receives the reference input clock refCLK[r], the PI calibration signal $S_{piCAL}[r]$, and the PC calibration signal $S_{PC}[r]$. The outputs of the clock generation circuit (clkGenCKT[r]) 71 include a positive phase-corrected clock (pcCLKp[r]) and a negative phase-corrected clock (pcCLKn[r]), and one of which is provided to the SPL[r] as the sampler-input clock (smpIN-CLK[r]). The SPL[r] 73 samples the calibration mode equalized data signal (eqDAT_cal) with the sampler-input clock (smpINCLK[r]) and the sampling result is considered as the feedback output (fbkOUT[r]).

FIG. 24A is a schematic diagram illustrating signals related to the clock generation circuits (clkGenCKT[2]~clkGenCKT[R]) at the initial stage (STG2a). At the initial stage (STG2a), the PI code of the PI[r] is set to a preset PI code (presetPICD), and the PC code of the PC[r] is set to the default PC code (dfltPCCD). According to the embodiment of the present disclosure, the preset PI code (presetPICD) is equivalent to the calibrated PI code (cal_PICD[1]). That is, presetPICD=cal_PICD[1]. With such a setting, the path delay mismatch between different routes can be limited to be within a one-clock phase cycle. In FIG. 24A, the preset phase ($\phi_{preset}[r]$) is related to the preset PI code (presetPICD) and the default PC code (dfltPCCD).

Please refer to FIGS. 15 and 24A together. FIG. 15 corresponds to the initial stage when r=1, and FIG. 24A corresponds to the initial stage when r=2~R. For r=1, the preliminary PI code (prelimPICD) is set to PI[1]. For r=2~R, the preset PI code (presetPICD) is set to PI[2]~PI[R]. On the other hand, the default PC code (dfltPCCD) is set to all PC[1]~PC[R] at the initial stages, regardless of the value of r.

After the initial stage (STG2a), the clock generation circuit (clkGenCKT[r], r=2~R) enters a forward shift stage (STG2b). The forward shift stage (STG2b) does not apply to r=1. A temporal PI code (tmpPICD[r], r=2~R) is provided to adjust the PI code of the PI[r] in the forward shift stage (STG2b). With the temporal PI code (tmpPICD[r], r=2~R), the phase of the sampler-input clock (smpINCLK[r], r=2~R) is dramatically changed in the forward shift stage (STG2b). The phase change corresponding to the temporal PI code (tmpPICD[r], r=2~R) is defined as a target-to-origin phase offset ($\phi_{OFST2ogn}[r]$, r=2~R).

Figure 24B:
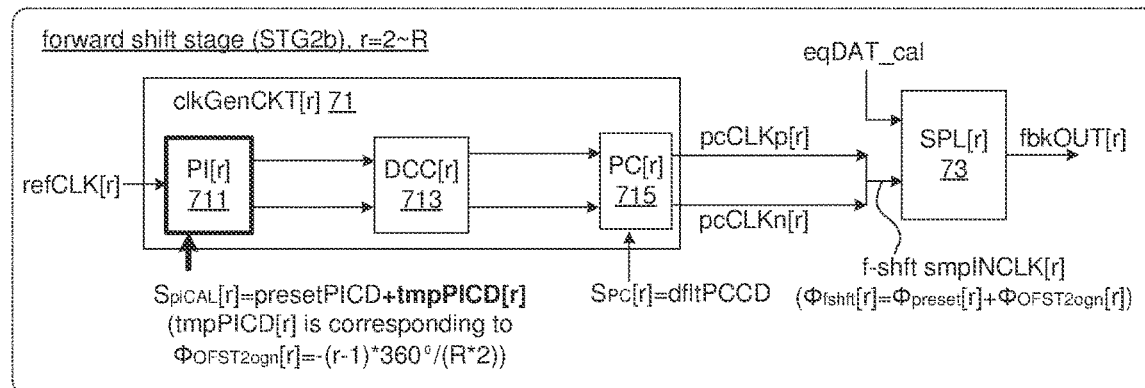
FIG. 24B is a schematic diagram illustrating signals related to the clock generation circuit (clkGenCKT[2]~clkGenCKT[R]) at the forward shift stage (STG2b).

FIG. 24B is a schematic diagram illustrating signals related to the clock generation circuit (clkGenCKT[r], r=2~R) at the forward shift stage (STG2b). At the forward shift stage (STG2b), the PI code of the PI[r] 711 is set to a summation of the preset PI code (presetPICD) and the temporal PI code (ftmpPICD[r]), and the PC code of the PC[r] 715 is not adjusted. According to the embodiment of the present disclosure, a temporal PI code (tmpPICD[r]) corresponding to a target-to-origin phase offset ($\phi_{OFST2ogn}[r]$) is defined. In FIG. 24B, the forward-shifted phase ($\phi_{fshft}[r]$) is determined by the summation of the preset PI code (presetPICD), the temporal PI code (tmpPICD[r]), and the default PC code (dfltPCCD).

In the specification, for r=2~R, the coarse calibration stage (STG2c) and the fine calibration stage (STG2d) are performed on a phase-shifted basis. That is, instead of directly calibrating the preset sampler-input clock (preset smpINCLK[r]), the forward-shifted sampler-input clock (f-shft smpINCLK[r]) is calibrated in the coarse calibration stage (STG2c). Moreover, instead of calibrating the coarse-calibrated sampler-input clock (cr-cal smpINCLK[r]), the forward-shifted plus coarse-calibrated sampler-input clock (f-shft & cr-cal smpINCLK[r]) is calibrated in the fine calibration stage (STG2d).

Figure 25A:
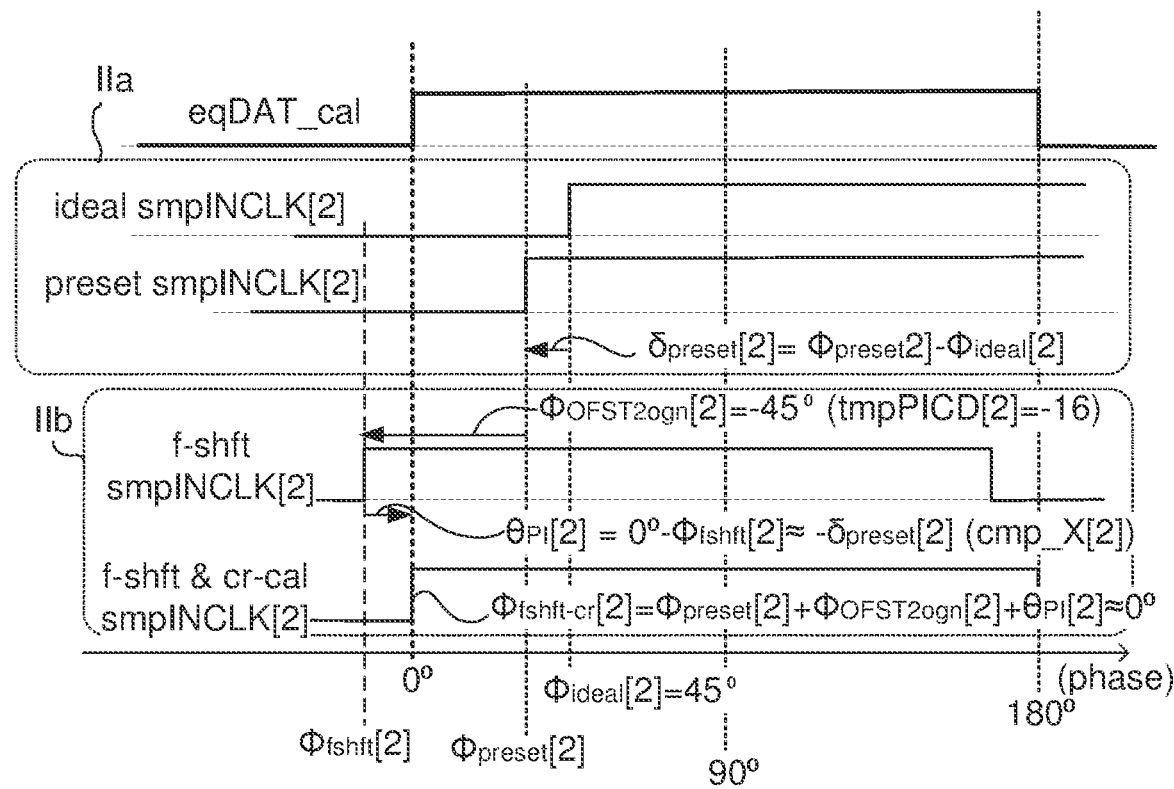
FIG. 25A is a waveform diagram illustrating the generation of the forward-shifted plus coarse-calibrated sampler-input clock (f-shft & cr-cal smpINCLK[2]).
Figure 25B:
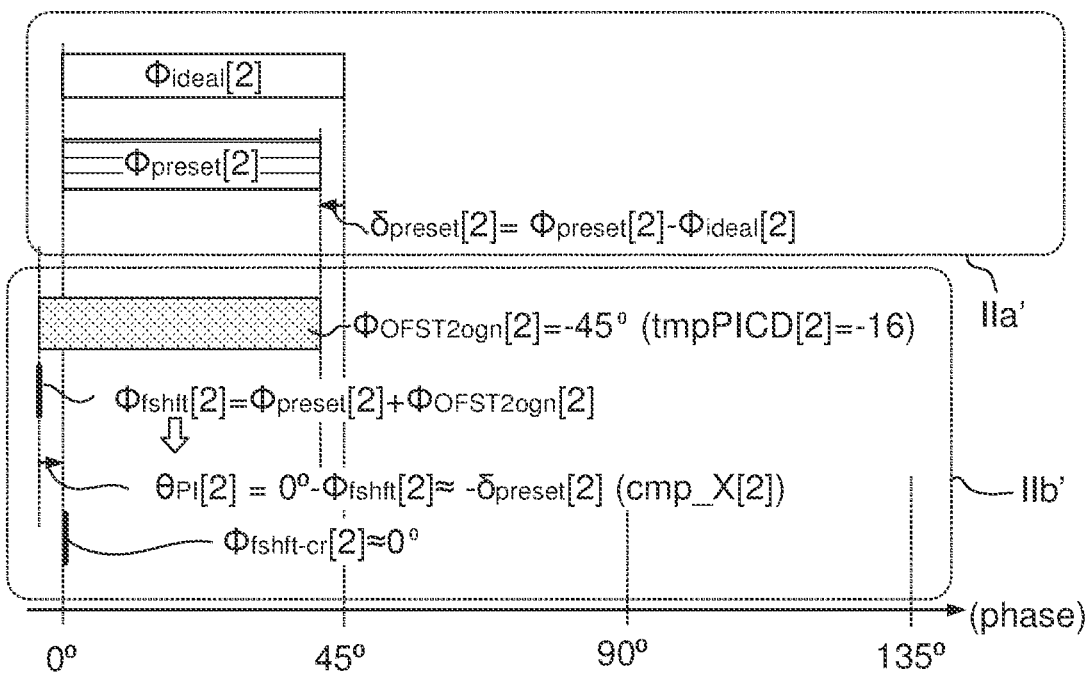
FIG. 25B is a horizontal bar diagram illustrating how the PI compensation phase ($\theta_{PI}[2]$) is acquired.

To illustrate the initial stage (STG2a), the forward shift stage (STG2b), and the coarse calibration stage (STG2c) in the shifted calibration procedure physically, waveforms showing different stages of the sampler-input clock (smpINCLK[2]) are shown in FIG. 25A, and the phases corresponding to different stages of the sampler-input clock (smpINCLK[2]) are shown in FIG. 25B.

FIG. 25A is a waveform diagram illustrating the generation of the forward-shifted plus coarse-calibrated sampler-input clock (f-shft & cr-cal smpINCLK[2]). FIG. 25A shows the waveforms of the calibration mode equalized data signal (eqDAT_cal), the ideal sampler input clock (ideal smpINCLK[2]), the preset sampler input clock (preset smpINCLK [2]), the forward-shifted sampler-input clock (f-shft smpINCLK[2]), and the forward-shifted plus coarse-calibrated sampler-input clock (f-shft & cr-cal smpINCLK[2]).

The ideal sampler input clock (ideal smpINCLK[2]) and the preset sampler input clock (preset smpINCLK[2]) are circuited by an upper dotted frame IIa. The forward-shifted sampler-input clock (f-shft smpINCLK[2]) and the forward-shifted plus coarse-calibrated sampler-input clock (f-shft & cr-cal smpINCLK[2]) are circulated by a lower dotted frame IIb.

FIG. 25B is a horizontal bar diagram illustrating how the PI compensation phase ($\theta_{PI}[2]$) is acquired. The phases in FIG. 25B corresponds to the waveforms in FIG. 25A. In FIG. 25B, the dotted frames IIa', IIb' respectively correspond to the dotted frames IIa, IIb in FIG. 25A.

Please refer to FIG. 24A, the waveforms in the dotted frame IIa in FIG. 25A, and the horizontal bars in the dotted frame IIa' in FIG. 25B together. In the initial stage (STG2a), the PI[2] is set by the PI calibration signal ($S_{piCAL}[2]$) with a preset PI code (presetPICD), and the preset PI code is equivalent to the calibrated PI code cal_PICD[1] (that is, $S_{piCAL}[2]$=presetPICD=cal_PICD[1]). The waveforms in the dotted frame IIa correspond to the ideal sampler-input clock (ideal smpINCLK[2]) and the preset sampler-input clock (preset smpINCLK[2]). At the bottom of the dotted frames IIa, IIa', the short arrows toward the left indicate that the phase difference between the preset phase ($\phi_{preset}[2]$) and the ideal phase ($\phi_{ideal}[2]$) is defined as a route-specific phase error ($\delta_{preset}[2]=\phi_{preset}[2]-\phi_{ideal}[2]$).

Please refer to FIG. 24B, the waveforms in the dotted frame IIb in FIG. 25A, and the horizontal bars in the dotted frame IIb' in FIG. 25B together. In the forward shift stage (STG2b), the PI code of the PI[2] is set to the summation of the preset PI code (presetPICD) and the temporal PI code (tmpPICD[2]). Therefore, the forward-shifted sampler-input clock (f-shft smpINCLK[2]) is generated by shifting the preset sampler-input clock (preset smpINCLK[2]) with the target-to-origin phase offset ($\phi_{OFST2ogn}[2]=-45°$). The target-to-origin phase offset ($\phi_{OFST2ogn}[2]=-45°$) is corresponding to the temporal PI code (tmpPICD[2]=-16).

According to FIGS. 25A and 25B, it can be concluded that the phase relationship between the preset phase ($\phi_{preset}[2]$) and the ideal phase ($\phi_{ideal}[2]$) can be analog to the relationship between the forward-shifted phase ($\phi_{fshft}[2]$) and the common origin phase (0°). Based on the resemblance, the calibration setting obtained based on the comparison between the forward-shifted phase ($\phi_{fshft}[2]$) and the common origin phase (0°) can be directly and easily applied to the comparison between the preset phase ($\phi_{preset}[2]$) and the ideal phase ($\phi_{ideal}[2]$).

A PI compensation phase ($\theta_{PI}[2]$) can be acquired based on a flow similar to the acquiring procedure of the PI compensation phase (ep[1]) in FIG. 18. The PI compensation phase ($\theta_{PI}[2]$) represents the phase difference between the forward-shifted phase ($\phi_{fshft}[2]$) and the common origin phase (0°). The PI compensation phase ($\theta_{PI}[2]$) is shown with a short arrow toward the right in FIGS. 25A and 25B. The PI compensation phase ($\theta_{PI}[2]$) and the route-specific phase error ($\delta_{preset}[2]$) have the same magnitude and opposite signs ($\theta_{PI}[2]=-\delta_{preset}[2]$), and the PI compensation phase ($\theta_{PI}[2]$) is utilized to compensate the route-specific phase error ($\delta_{preset}[2]$).

By the end of the coarse calibration stage (STG2c), the PI setting component 373a stops adjusting the PI code of the PI[2] and records the compensation PI code (cmp_X[2]). Then, the forward-shifted plus coarse-calibrated sampler-input clock (f-shft & cr-cal smpINCLK[2]) is generated, and the forward-shifted plus coarse-calibrated phase ($\phi_{fshft}$-cr [2]) is close to the common origin phase (0°). That is, $\phi_{fshft-cr}[2] \approx 0°$.

FIGS. 25A and 25B demonstrate that the forward-shifted plus coarse-calibrated phase ($\phi_{fshft-cr}[2]$) is equivalent to the summation of the preset phase ($\phi_{preset}[2]$), the target-to-origin phase offset $\phi_{OFST2ogn}[2]=-45°$, and the PI compensation phase $\theta_{PI}[2]$ (that is, $\phi_{fshft-cr}[2]=\phi_{preset}[2]+\phi_{OFST2ogn}[2]+\theta_{PI}[2]$).

Figure 26:
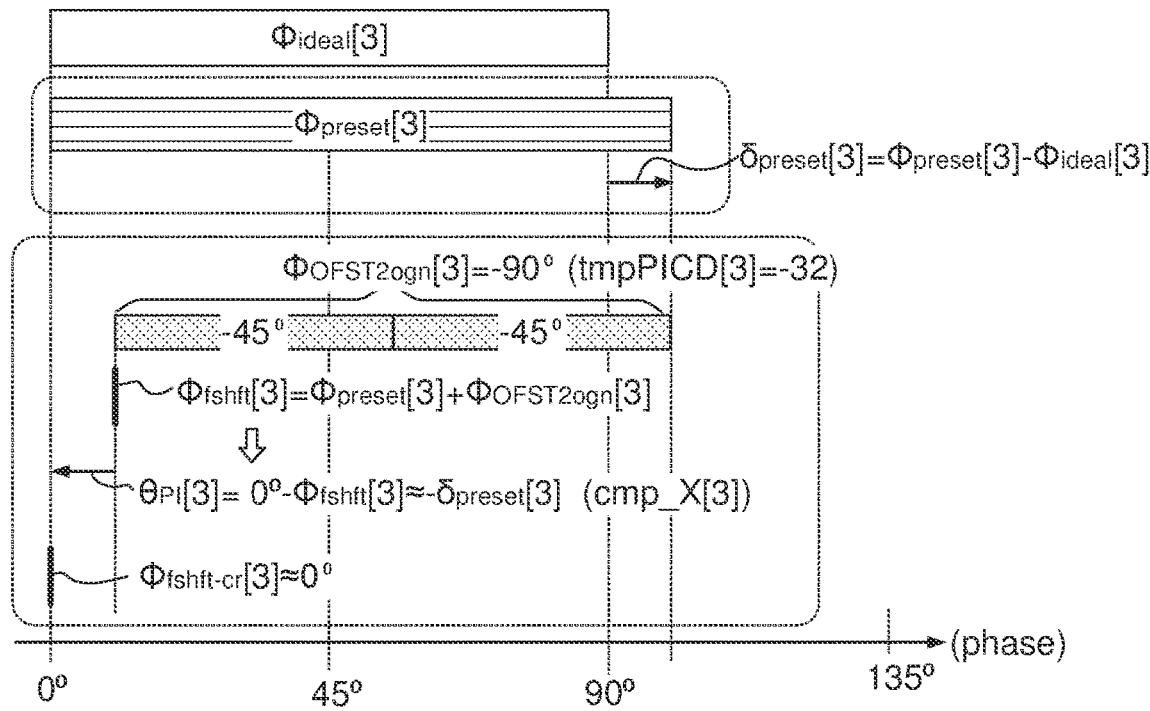
FIG. 26 is a horizontal bar diagram illustrating how the PI compensation phase ($\theta_{PI}[3]$) is acquired.
Figure 27:
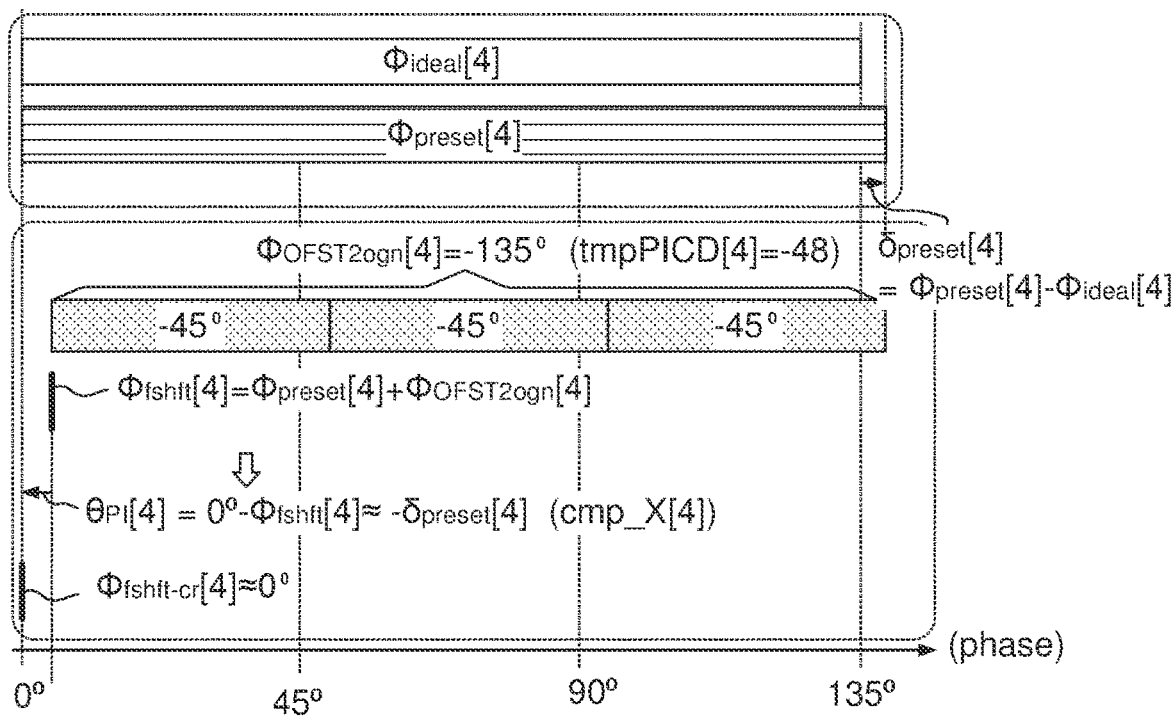
FIG. 27 is a horizontal bar diagram illustrating how the PI compensation phase ($\theta_{PI}[4]$) is acquired.

In the specification, different screen tones are utilized to represent different types of phases in the horizontal bar diagrams (FIGS. 25B, 26, and 27). The white horizontal bars represent the ideal phase ($\phi_{ideal}[2]\sim\phi_{ideal}[R]$). The horizontal bars with horizontal screentone represent the preset phases ($\phi_{preset}[2]\sim\phi_{preset}[R]$). The horizontal bars with dotted screentone represent the target-to-origin phase offsets ($\phi_{OFST2ogn}[2]\sim\phi_{OFST2ogn}[R]$). The horizontal bars with vertical screentone represent the forward-shifted plus coarse-calibrated phases ($\phi_{fshft-cr}[2]\sim\phi_{fshft-cr}[R]$).

FIG. 26 is a horizontal bar diagram illustrating how the PI compensation phase ($\theta_{PI}[3]$) is acquired, and FIG. 27 is a horizontal bar diagram illustrating how the PI compensation phase ($\theta_{PI}[4]$) is acquired. The signal changes and the phase changes in the forward-shifted stage (STG2b) and the coarse calibration stage (STG2c) when r=3 or 4 are similar to those in FIGS. 25A, 25B, except that some parameter values (for example, $\phi_{OFST2ogn}[r]$, tmpPICD[r]) are different. Therefore, details about the coarse calibration stage (STG2c) performed to the sampler-input clocks (smpINCLK[3], smpINCLK[4]) are not particularly described.

FIGS. 25A, 25B, 26, and 27 demonstrate that, instead of directly using the ideal phases ($\phi_{ideal}[2]\sim\phi_{ideal}[R]$) as a comparison target, the common origin phase (0°) is set and compared. Based on such assumption, the coarse calibration stage (STG2c) performed to the PI[2]~PI[R] is similar to that performed to the PI[1]. Based on such similarity, the flow diagram shown in FIG. 19 can be slightly modified to fit the coarse calibration stages (STG2c) of PI[2]~PI[R]. Table 7 summarizes the parameters related to the coarse calibration stages (STG1b, STG2c).

TABLE 7

Figure 28A:
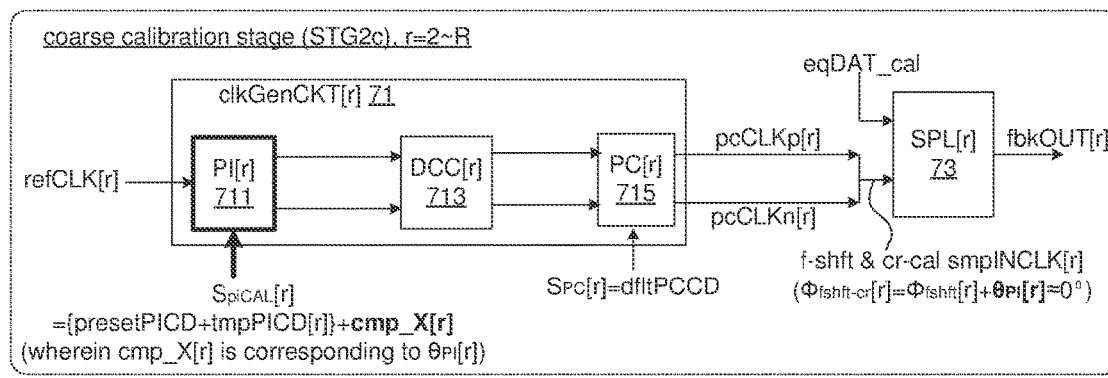
FIG. 28A is a schematic diagram illustrating signals related to the clock generation circuits (clkGenCKT[2] ~clkGenCKT[R]) at the coarse calibration stage (STG2c).

| coarse calibration stage | | FIGS. 18, 19, STG1b | FIG. 28A, STG2c r = 2~R |
|---|---|---|---|
| phase interpolator | | PI[1] | PI[r] |
| feedback output | | fbkOUT[1] | fbkOUT[r] |
| compensation PI code | | cmp_X[1] | cmp_X[r] |
| PI compensation phase | | $\theta_{PI}[1]$ | $\theta_{PI}[r]$ |
| before coarse calibration stage | sampler-input clock | prelim smpINCLK[r] | f-shft smpINCLK[r] |
| | phase | $\Phi_{prelim}[1]$ | $\Phi_{fshft}[r]$ |
| | PI code | prelimPICD | presetPICD + tmpPICD[r] |
| after coarse calibration stage | sampler-input clock | cr-cal smpINCLK[r] | f-shft & cr-cal smpINCLK[r] |
| | phase | $\Phi_{cr}[1]$ | $\Phi_{fshft-cr}[r]$ |
| | PI code | prelimPICD + cmp_X[1] | presetPICD + tmpPICD[r] + cmp_X[r] |

FIG. 28A is a schematic diagram illustrating signals related to the clock generation circuits (clkGenCKT[2]~clkGenCKT[R]) at the coarse calibration stage (STG2c). At the coarse calibration stage (STG2c), the PI code of the PI[r] is equivalent to summation of the preset PI code (presetPICD), the temporal PI code (tmpPICD[r]), and the compensation PI code (cmp_X[r]). That is, $S_{piCAL}[r]$=presetPICD+tmpPICD[r]+cmp_X[r]. The PC code of the PC[r] is equivalent to the default PC code (dfltPCCD). That is, $Sec[r]$=dfltPCCD.

After the coarse calibration stage (STG2c), the fine calibration stage (STG2d) is performed. Similarly, the flow diagram shown in FIGS. 22A and 22B can be slightly modified to fit the fine calibration stage (STG2d). Table 8 summarizes the parameters related to the fine calibration stage.

TABLE 8

Figure 28B:
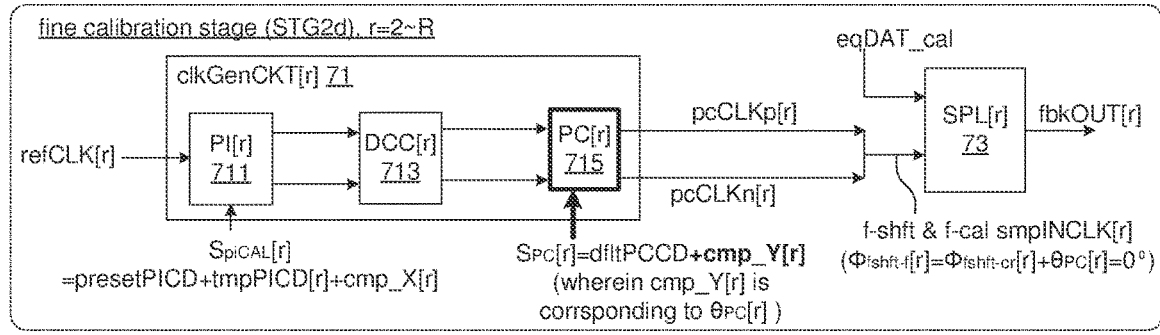
FIG. 28B is a schematic diagram illustrating signals related to the clock generation circuits (clkGenCKT[2] ~clkGenCKT[R]) at the fine calibration stage (STG2d).

| fine calibration stage | | FIGS. 22A, 22B, 23, STG1c (r = 1) | FIG. 28B, STG2d (r = 2~R) |
|---|---|---|---|
| phase corrector | | PC[1] | PC[r] |
| feedback output | | fbkOUT[1] | fbkOUT[r] |
| compensation PC code | | cmp_Y[1] | cmp_Y[r] |
| PC compensation phase | | $\theta_{PC}[1]$ | $\theta_{PC}[r]$ |
| before fine calibration stage | sampler-input clock | cr-cal smpINCLK[1] | f-shft & cr-cal smpINCLK[r] |
| | phase | $\Phi_{cr}[1]$ | $\Phi_{fshft-cr}[r]$ |
| | PC code | dfltPCCD | dfltPCCD |
| after fine calibration stage | sampler-input clock | f-cal smpINCLK[r] | f-shft & f-cal smpINCLK[r] |
| | Phase | $\Phi_r[1]$ | $\Phi_{fshft-r}[r]$ |
| | PC code | dfltPCCD + cmp_Y[1] | dfltPCCD + cmp_Y[r] |

FIG. 28B is a schematic diagram illustrating signals related to the clock generation circuits (clkGenCKT[2]~clkGenCKT[R]) at the fine calibration stage (STG2d). At the fine calibration stage (STG2d), the PI code of the PI[r] is equivalent to summation of the preset PI code (presetPICD), the temporal PI code (tmpPICD[r]), and the compensation PI code (cmp_X[r]). That is, $S_{piCAL}[r]$=presetPICD+tmpPICD[r]+cmp_X[r]. The PC code of the PC[r] is equivalent to the summation of the default PC code (dfltPCCD=N) and the compensation PC code (cmp_Y[r]). That is, $S_{PC}[r]$=dfltPCCD+cmp_Y[r].

Figure 28C:
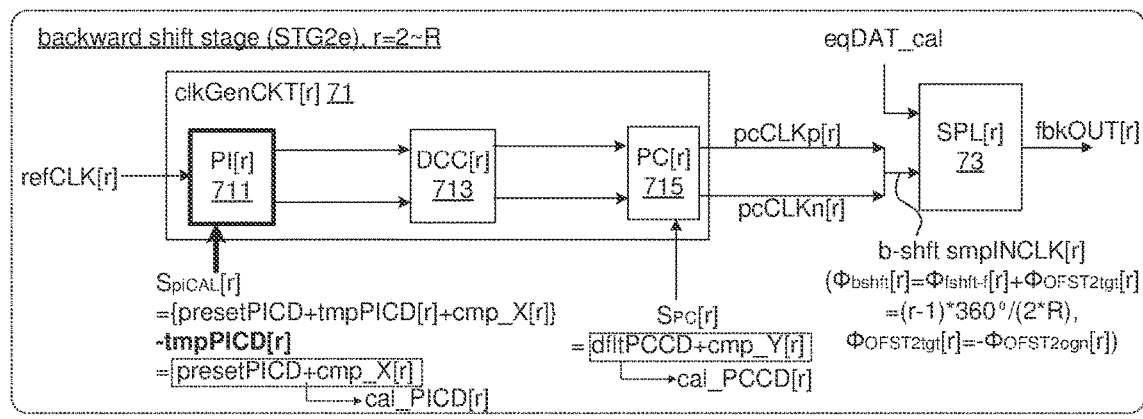
FIG. 28C is a schematic diagram illustrating signals related to the clock generation circuits (clkGenCKT[2] ~clkGenCKT[R]) at the backward shift stage (STG2e).

After the fine calibration stage (STG2d), the backward shift stage (STG2e) is performed. FIG. 28C is a schematic diagram illustrating signals related to the clock generation circuits (clkGenCKT[2]~clkGenCKT[R]) at the backward shift stage (STG2e). The backward shift stage (STG2e) is the last in the shifted phase-calibration procedure corresponding to the clock generation circuit (clkGenCKT[r]).

Compared with the fine calibration stage (STG2d), the PI code of the PI[r] 711 in the backward shift stage (STG2e) is further adjusted by deducting the temporal PI code (tmpPICD[r]). Alternatively speaking, the PI code of the PI[r] at the backward shift stage (STG2e) is equivalent to the PI code of the PI[r] at the fine calibration stage (STG2d) (that is, presetPICD+tmpPICD[r]+cmp_X[r]) minus the temporal PI code (tmpPICD[r]). That is, {presetPICD+tmpPICD[r]+cmp_X[r]}-tmpPICD[r]=presetPICD+cmpX[r]. The deduction of the temporal PI code (tmpPICD[r]) implies that a phase opposite to the target-to-origin phase offset ($\phi_{OFST2ogn}[r]$) is applied, and it is defined as an origin-to-target phase offset ($\phi_{OFST2tgt}[r]$=$\phi_{OFST2ogn}[r]$=(r-1)*360°/(R*2)). For example, for r=2, $\phi_{OFST2tgt}[2]$=45°, and $\phi_{OFST2ogn}[2]$=−45°.

Consequentially, during the backward shift stage (STG2e), the PI code of the PI[r] 711 is jointly determined by the summation of the preset PI code (presetPICD) and the compensation PI code (cmp_X[r]). That is, $S_{piCAL}[r]$=presetPICD+cmp_X[r]. On the other hand, the PC code of the PC[r] remains the same as that in the fine calibration stage (STG2d). That is, $S_{PC}[r]$=dfltPCCD+cmp_Y[r].

Based on the above illustrations, In the backward shift stage (STG2e), the backward-shifted sampler-input clock (b-shft smpINCLK[r]) can be obtained by shifting the forward-shifted plus fine-calibrated sampler-input clock (f-shft & f-cal smpINCLK [r]) with the origin-to-target phase offset $\phi_{OFST2tgt}[r]$. Accordingly, at the backward shift stage (STG2e), the backward-shifted phase $\phi_{bshft}[r]$ (r=2~R) is equivalent to the summation of the forward-shifted plus fine-calibrated phase ($\phi_{fshft-f}[r]$) and the origin-to-target phase offset ($\phi_{OFST2tgt}[r]$=(r-1)*360°/(R*2)). That is, $\phi_{bshft}[r]$=$\phi_{fshft-f}[r]$+$\phi_{OFST2tgt}[r]$=0°+(r-1)*360°/(R*2)=(r-1)*360°/(R*2).

After the backward shift stage (STG2e) completes, the PI code of the PI[r] is further defined as the calibrated PI code (cal_PICD[r]), and the PC code of the PC[r] is further defined as the calibrated PC code (cal_PCCD[r]). The calibrated PI code (cal_PICD[r]) and the calibrated PC code (cal_PCC[r]) are temporarily recorded and utilized later when the high-speed receiver operates in the normal mode (M2).

Table 9 briefly compares different settings of PI codes of PI[r] (r=2~R) and PC codes of PC[r] (r=2~R) and the phase change of the sampler-input clock (smpINCLK[r], r=2~R) in the shifted phase-calibration procedure. As details of Table 9 can be referred to as FIGS. 24A-28C, illustrations are omitted.

TABLE 9

| clkGenCKT[r] | PI code of PI[r] | PC code of PC[r] | phase of sampler-input clock smpINCLK[r] |
|---|---|---|---|
| initial stage (STG2a) FIG. 24A | presetPICD = cal_PICD[1] | dfltPCCD = N | $\Phi_{preset}[r]$ |
| forward shift stage (STG2b) FIG. 24B | presetPICD + tmpPICD [r] | | $\Phi_{fshft}[r]$ = $\Phi_{preset}[r]$ + $\Phi_{OFST2ogn}[r]$ |
| coarse calibration stage (STG2c) FIG. 28A | presetPICD + tmpPICD[r] + cmp_X[r] | | $\Phi_{fshft-cr}[r]$ = $\Phi_{preset}[r]$ + $\Phi_{OFST2ogn}[r]$ + $\theta_{PI}[r] \approx 0°$ |
| fine calibration stage (STG2d) FIG. 28B | | dfltPCCD + cmp_Y[r] | $\Phi_{fshft-f}[r]$ = $\Phi_{preset}[r]$ + $\Phi_{OFST2ogn}[r]$ + $\theta_{PI}[r]$ + $\theta_{PC}[1]$ = 0° |
| backward shift stage (STG2e) FIG. 28O | presetPICD + cmp_X[r] | | $\Phi_{bshft}[r]$ = $\Phi_{fshft-f}[r]$ + $\Phi_{OFST2tgt}[r]$ = $\Phi_{preset}[r]$ + + $\theta_{PI}[r] + \theta_{PC}[1]$ = (r-1)*360°/(2*R) |

Compared with the non-shifted phase-calibration procedure (r=1), the shifted phase-calibration procedure (r=2~R) further includes a forward shift stage (STG2b) and backward shift stage (STG2e). In the forward shift stage (STG2b), a phase comparison base is shifted from the ideal phase ($\phi_{ideal}[r]$) to the common origin phase (0°). Later, in the backward shift stage (STG2e), the phase calibration result is shifted from the common origin phase (0°) to the ideal phase ($\phi_{ideal}[r]$). The ideal phase ($\phi_{ideal}[r]$) is different for each clock generation circuit (clkGenCKT[r]), but the common origin phase (0°) is identical to all clock generation circuits (clkGenCKT[2]~clkGenCKT[R]).

Figure 29:
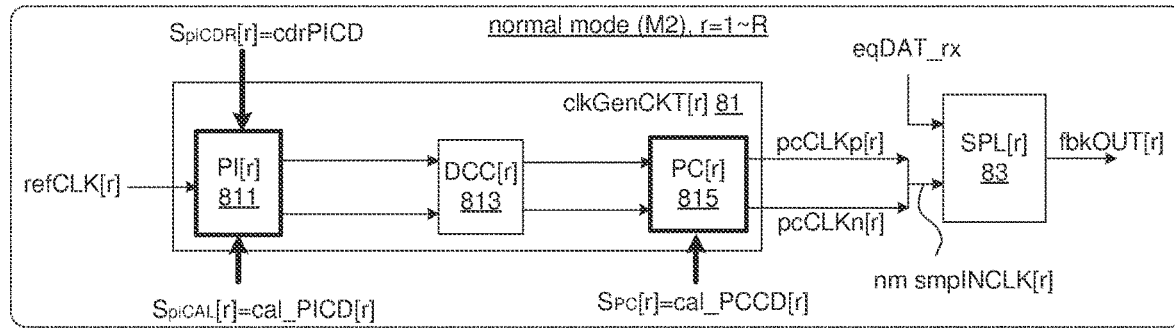
FIG. 29 is a schematic diagram illustrating signals related to the clock generation circuits (clkGenCKT[1]~clkGenCKT[R]) when the high-speed receiver operates in the normal mode (M2).

After the calibration mode (M1), the clock calibration module enters the normal mode (M2). FIG. 29 is a schematic diagram illustrating signals related to the clock generation circuits (clkGenCKT[1]~clkGenCKT[R]) when the high-speed receiver operates in the normal mode (M2).

In FIG. 29, the clock generation circuit clkGenCKT[r] (r=1~R) 81 includes the PI[r] 811, the DCC[r] 813, and the PC[r] 815. The clock generation circuit clkGenCKT[r] receives the reference input clock refCLK[r], the PI calibration signal $S_{piCAL}[r]$, and the PC calibration signal $S_{PC}[r]$. The outputs of the clock generation circuit (clkGenCKT[r]) 81 include a positive phase-corrected clock (pcCLKp[r]) and a negative phase-corrected clocks (pcCLKn[r]), and one of which is provided to the SPL[r] 83 as the sampler-input clock (smpINCLK[r]). The SPL[r] 83 samples the normal mode equalized data signal (eqDAT_rx) with the sampler-input clock (smpINCLK[r]) and the sampling result is considered as the feedback output (fbkOUT[r]).

In the normal mode (M2), the PI[r] (r=1~R) simultaneously receives the PI setting signal ($S_{piCDR}[r]$=cdrPICD) from the CDR and the PI calibration signal ($S_{piCAL}[r]$= cal_PICD[r]) from the PI setting component 373a, and the PC[r] receives the PC calibration signal ($S_{PC}[r]$=cal_PCCD [r]) from the PC setting component 373c. The recovery setting code (cdrPICD) is dynamically generated by the CDR, in response to the sampled edge outputs (edgSMP).

In the normal mode M2, the phase of the normal mode sampler-input clock (nm smpINCLK[r]) is defined as a normal mode phase ($\phi_{nm}[r]$, r=1~R), and the normal mode phase ($\phi_{nm}[r]$) is jointly determined by the recovery setting code (cdrPICD), the calibrated PI code (cal_PICD[r]), and the calibrated PC code (cal_PCCD[r]). The recovery setting code (cdrPICD) is an identical PI code applied to all PI[1l]~PI[R], whereas the calibrated PI codes (cal_PICD[1] ~cal_PICD[R]) are respectively corresponding to different PI[1]~PI[R], and the calibrated PC codes (cal_PCCD[1] ~cal_PCCD[R]) are respectively corresponding to the different PC[1]~PC[R].

In practical application, R is equivalent to a power of two when the calibration of the error clock is not concerned, and the present disclosure can be applied to other fractional-rate schemes. Moreover, the concept of the present disclosure can be applied to the error clocks. The number of the clock generation circuits (clkGenCKT[1]~clkGenCKT[R]) 213 is related to the clock rate and whether the error clocks are considered. As the phase criteria of the error clocks are the same as those of the data clocks, the route phase-calibration procedure and circuit design related to the error clocks are similar to those of the data clocks.

FIG. 30 is a schematic diagram illustrating an embodiment showing the high-speed receiver having error samplers, with an exemplary half-rate scheme. Similar to the block diagrams shown in FIGS. 10A and 10B, a clock calibration circuit 97 is electrically connected to the clock generation circuits 911, 913, 915, the CDR 93, and the sampling module 95. The clock generation circuits 911, 913, 915 are respectively corresponding to the edge clock route, the data clock route, and the error clock route. The clock calibration circuit 97 includes a duty cycle control module 971 and a phase control circuit 973.

As the route-specific phase-calibration procedure performed by the clock generation circuit 915 corresponding to the error clock is similar to the one performed by the clock generation circuit 913 corresponding to the data clock, the variable "r=2" is repetitively used in the clock calibration circuits 913, 915. An apostrophe symbol (') is used for indicating the signals and route related to the error clock.

The sampling module 95 includes edge samplers (eSPL1) 95a, (eSPL2) 95c, data samplers (dSPL1) 95b, (dSPL2) 95d, and error samplers (erSPL1) 95e, (erSPL2) 95f. The samplers receive the equalized data signal (eqDAT) from the AFE, and their corresponding sampler-input clocks from the clock generation circuits 911, 913, 915. The edge samplers (eSPL1) 95a (eSPL2) 95c respectively generate sampled edge outputs edgSMP1 edgSMP2, the data samplers (dSPL1) 95b-(dSPL2) 95d respectively generate sampled data outputs datSMP1, datSMP2, and the error samplers (erSPL1) 95e, (erSPL2) 95f respectively generate sampled error outputs errSMP1, errSMP2.

The clock generation circuit 911 includes a PI[1] 9111, a DCC[1] 9113, and a PC[1] 9115. The PC[1] 9115 is electrically connected to the edge samplers (eSPL1) 95a, (eSPL2) 95c. The clock generation circuit 913 includes a PI[2] 9131, a DCC[2] 9133, and a PC[2] 9135. The PC[2] 9135 is electrically connected to the data samplers (dSPL1) 95b, (dSPL2) 95d. The clock generation circuit 915 includes a PI[2]' 9151, a DCC[2]' 9153, and a PC[2]' 9155. The PC[2]' 9155 is electrically connected to the error samplers (erSPL1) 95e, (erSPL2) 95f. Details about operations of the components in FIG. 30 are not illustrated to avoid redundancy.

In the present disclosure, the samplers are directly utilized to detect its path delay, and no extra phase detection circuit is required. As the phase detection is made in a route-specific base, the path mismatch phenomena no longer exist, and the phase distortion is solved. All the analog and digital circuitry used for phase detection are an essential part of high-speed receiver design. Therefore, the phase calibration flow can be easily applied to different fractional-rate schemes, regardless of the error clocks should be concerned or not.

Instead of detecting the phase distortion within the individual path, the present disclosure detects the path mismatch, which is the root cause of the phase distortion. The samplers themselves function as path mismatch detectors, and this eliminates the additional path for detection. Accordingly, the phase distortions within the individual clock generation route are eliminated, and the path mismatches crossing different clock generation routes are solved.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A clock calibration module electrically connected to a first sampler, wherein the first sampler samples an equalized data signal with a first sampler-input clock and accordingly generates a first sampled output, wherein the clock calibration module comprises:
a clock generation module, comprising R clock generation circuits, wherein a first clock generation circuit among the R clock generation circuits comprises:
a first phase interpolator, configured for interpolating a first reference input clock and accordingly generating a first interpolated clock, wherein a phase of the first interpolated clock is adjusted by a first phase interpolator calibration signal;

a first duty cycle corrector, electrically connected to the first phase interpolator, configured for generating a first duty cycle corrected clock based on the first interpolated clock; and a first phase corrector, electrically connected to the first duty cycle corrector and the first sampler, configured for generating the first sampler-input clock based on the first duty cycle corrected clock, wherein a phase of the first sampler-input clock is adjusted by a first phase corrector calibration signal; and a phase control circuit, comprises:

a phase interpolator setting component, electrically connected to the first phase interpolator, configured for generating the first phase interpolator calibration signal in response to a state of a first feedback output; and a phase corrector setting component, electrically connected to the first phase corrector, configured for generating the first phase corrector calibration signal in response to the state of the first feedback output, wherein the first feedback output is originated from the first sampled output.

2. The clock calibration module according to claim 1, wherein the clock calibration module is electrically connected to an rth sampler, and the rth sampler samples the equalized data signal with an rth sampler-input clock and accordingly generates an rth sampled output, wherein an rth clock generation circuit among the R clock generation circuits comprises:

an rth phase interpolator, electrically connected to the phase interpolator setting component, configured for interpolating an rth reference input clock and accordingly generating an rth interpolated clock, wherein a phase of the rth interpolated clock is adjusted by an rth phase interpolator calibration signal, wherein the phase interpolator setting component generates the rth phase interpolator calibration signal in response to a state of an rth feedback output, and the first reference clock and the rth reference clock are originated from a source clock;

an rth duty cycle corrector, electrically connected to the rth phase interpolator, configured for generating an rth duty cycle corrected clock based on the rth interpolated clock; and an rth phase corrector, electrically connected to the phase corrector setting component, the rth duty cycle corrector, and the rth sampler, configured for generating the rth sampler-input clock based on the rth duty cycle corrected clock, wherein a phase of the rth sampler-input clock is adjusted by an rth phase corrector calibration signal, and the phase corrector setting component generates the rth phase corrector calibration signal in response to the state of the rth feedback output, wherein the rth feedback output is originated from the rth sampled output.

3. The clock calibration module according to claim 2, wherein r and R are positive integers, r is greater than 1, and r is smaller than or equivalent to R.

4. The clock calibration module according to claim 2, wherein the clock calibration module operates in a calibration mode comprising:

a first-first stage, during which a first phase interpolator code of the first phase interpolator is set to a preliminary phase interpolator code, and a first phase corrector code of the first phase corrector is set to a default phase corrector code;

a second-first stage, during which the first phase interpolator code is equivalent to a summation of the preliminary phase interpolator code and a first compensation phase interpolator code being transmitted by the first phase interpolator calibration signal, wherein the phase interpolator setting component determines the first compensation phase interpolator code based on the state of the first feedback output in a cycle; and a third-first stage, during which the first phase corrector code is equivalent to a summation of the default phase corrector code and a first compensation phase corrector code being transmitted by the first phase corrector calibration signal, wherein the phase corrector setting component determines the first compensation phase corrector code based on the state of the first feedback output in a plurality of cycles.

5. The clock calibration module according to claim 4, wherein the first phase corrector comprises 2*N delay units, and the default phase corrector code is equivalent to N, wherein N is a positive integer.

6. The clock calibration module according to claim 4, wherein the first phase interpolator code in the second-first stage is equivalent to the first phase interpolator code in the third-first stage.

7. The clock calibration module according to claim 6, wherein when the clock calibration module operates in a normal mode, the first phase interpolator is simultaneously set by a clock data recovery circuit with a recovery setting code and the first phase interpolator calibration signal with the first phase interpolator code at the second-first stage; and the first phase corrector is set by the first phase corrector calibration signal with the first phase corrector code at the third-first stage.

8. The clock calibration module according to claim 4, wherein the calibration mode further comprises:

a first-rth stage, during which an rth phase interpolator code of the rth phase interpolator is set to a preset phase interpolator code, and an rth phase corrector code of the rth phase corrector is set to the default phase corrector code;

a second-rth stage, during which the rth phase interpolator code is set by the rth phase interpolator calibration signal to be equivalent to a summation of the preset phase interpolator code and an rth temporal phase interpolator code, wherein the rth temporal phase interpolator code is corresponding to a phase of $-(r-1)*360°/(R*2)$;

a third-rth stage, during which the rth phase interpolator code is equivalent to a summation of the preset phase interpolator code, the rth temporal phase interpolator code, and an rth compensation phase interpolator code, wherein the phase interpolator setting component determines the rth compensation phase interpolator code according to the state of the rth feedback output in a cycle;

a fourth-rth stage, during which the rth phase corrector code is equivalent to a summation of the default phase corrector code and an rth compensation phase corrector code, wherein the phase corrector setting component determines the rth compensation phase corrector code according to the state of the rth feedback output in a plurality of cycles; and a fifth-rth stage, during which the rth phase interpolator code is equivalent to a summation of the preset phase interpolator code and the rth compensation phase interpolator code.

9. The clock calibration module according to claim 8, wherein the preset phase interpolator code is equivalent to the first phase interpolator code at the second-first stage.

10. The clock calibration module according to claim 8, wherein
the rth phase corrector code in the fifth-rth stage is equivalent to the rth phase corrector code at the fourth-rth stage.

11. The clock calibration module according to claim 10, wherein when the clock calibration module operates in a normal mode,
the rth phase interpolator calibration signal sets the rth phase interpolator with the rth phase interpolator code at the fifth-rth stage; and
the rth phase corrector calibration signal sets the rth phase corrector with the rth phase corrector code at the fourth-rth stage.

12. The clock calibration module according to claim 2, wherein when the clock calibration module operates in a calibration mode, the equalized data signal has a predefined data pattern, and a cycle length of the equalized data signal is equivalent to a cycle length of the source clock.

13. The clock calibration module according to claim 12, wherein the predefined data pattern includes a sequence of alternate 1s and 0s.

14. The clock calibration module according to claim 12, wherein when the clock calibration module operates in a normal mode, content of the equalized data signal is originated from a transmitter, and the cycle length of the source clock is equivalent to R times of the cycle length of the equalized data signal.

15. The clock calibration module according to claim 2, wherein the first phase interpolator and the rth phase interpolator are electrically connected to a clock data recovery circuit, and the clock data recovery circuit transmits a recovery setting code to the first phase interpolator and the rth phase interpolator when the clock calibration module operates in a normal mode.

16. The clock calibration module according to claim 15, wherein the clock data recovery circuit is electrically connected to the first sampler and the rth sampler, and the clock data recovery circuit generates the recovery setting code based on the first sampled output and the rth sampled output.

17. The clock calibration module according to claim 2, wherein a phase of the rth sampler-input clock is greater than a phase of the first sampler-input clock.

18. The clock calibration module according to claim 2, wherein a cycle length of the first reference input clock is equivalent to a cycle length of the rth reference input clock, and a phase of the first reference input clock is different from a phase of the rth reference input clock.

19. A high-speed receiver, comprising:
a sampling module comprising 2*R samplers, wherein a sampler among the 2*R samplers samples an equalized data signal with a sampler-input clock and accordingly generates a sampled output; and
a clock calibration module, electrically connected to the sampling module, comprising:
a clock generation module, comprising R clock generation circuits, wherein each of the R clock generation circuits is electrically connected to two of the 2*R samplers, wherein
a clock generation circuit among the R clock generation circuits comprises:
a phase interpolator, configured for interpolating a reference input clock and accordingly generating an interpolated clock, wherein a phase of the interpolated clock is adjusted by a phase interpolator calibration signal;
a duty cycle corrector, electrically connected to the phase interpolator, configured for generating a duty cycle corrected clock based on the interpolated clock; and
a phase corrector, electrically connected to the duty cycle corrector and the sampler, configured for generating the sampler-input clock based on the duty cycle corrected clock, wherein a phase of the sampler-input clock is adjusted by a phase corrector calibration signal; and
a phase control circuit, comprises:
a phase interpolator setting component, electrically connected to the phase interpolator, configured for generating the phase interpolator calibration signal in response to a state of a feedback output; and
a phase corrector setting component, electrically connected to the phase corrector, configured for generating the phase corrector calibration signal in response to the state of the feedback output,
wherein the feedback output is originated from the sampled output.

20. A calibration method applied to a high-speed receiver, comprising steps of:
sampling an equalized data signal with a sampler-input clock and accordingly generating a sampled output;
interpolating a reference input clock and accordingly generating an interpolated clock, wherein a phase of the interpolated clock is adjusted by a phase interpolator calibration signal being generated in response to a state of a feedback output;
generating a duty cycle corrected clock based on the interpolated clock; and
generating the sampler-input clock based on the duty cycle corrected clock, wherein a phase of the sampler-input clock is adjusted by a phase corrector calibration signal being generated in response to the state of the feedback output,
wherein the feedback output is originated from the sampled output.

* * * * *